US010056237B2

(12) United States Patent
Gorokhovsky et al.

(10) Patent No.: US 10,056,237 B2
(45) Date of Patent: *Aug. 21, 2018

(54) LOW PRESSURE ARC PLASMA IMMERSION COATING VAPOR DEPOSITION AND ION TREATMENT

(71) Applicant: Vapor Technologies, Inc., Longmont, CO (US)

(72) Inventors: Vladimir Gorokhovsky, San Antonio, TX (US); William Grant, Lafayette, CO (US); Edward Taylor, Erie, CO (US); David Humenik, Longmont, CO (US)

(73) Assignee: VAPOR TECHNOLOGIES, INC., Longmont, CO (US)

( * ) Notice: Subject to any disclaimer, the term of this patent is extended or adjusted under 35 U.S.C. 154(b) by 547 days.

This patent is subject to a terminal disclaimer.

(21) Appl. No.: 13/840,305

(22) Filed: Mar. 15, 2013

(65) Prior Publication Data

US 2014/0076715 A1    Mar. 20, 2014

Related U.S. Application Data

(63) Continuation-in-part of application No. 13/617,005, filed on Sep. 14, 2012, now Pat. No. 9,412,569.

(51) Int. Cl.
*H01J 37/34*  (2006.01)
*C23C 14/32*  (2006.01)
(Continued)

(52) U.S. Cl.
CPC .......... *H01J 37/3438* (2013.01); *C23C 14/32* (2013.01); *C23C 14/325* (2013.01);
(Continued)

(58) Field of Classification Search
CPC .......... H01J 37/32917; H01J 37/32935; H01J 37/3405; H01J 37/3417; H01J 37/32055;
(Continued)

(56) References Cited

U.S. PATENT DOCUMENTS 636,270 A    11/1899  Loos
1,929,091 A  10/1933  Colvin
(Continued)

FOREIGN PATENT DOCUMENTS

CN    1179617 A    4/1998
CN   201762438 U   3/2011
(Continued)

OTHER PUBLICATIONS

DE2321665A1, English Abstract—machine translation.
(Continued)

*Primary Examiner* — Michael A Band
(74) *Attorney, Agent, or Firm* — Brooks Kushman P.C.

(57) ABSTRACT

A coating system includes a vacuum chamber and a coating assembly. The coating assembly includes a vapor source, a substrate holder, a remote anode electrically coupled to the cathode target, and a cathode chamber assembly. The cathode chamber assembly includes a cathode target, an optional primary anode and a shield which isolates the cathode target from the vacuum chamber. The shield defines an opening for transmitting an electron emission current of a remote arc discharge from the cathode target to the remote anode that streams along the target face long dimension. A primary power supply is connected between the cathode target and the primary anode while a secondary power supply is connected between the cathode target and the remote anode. Characteristically, a linear remote anode dimension and a vapor source short dimension are parallel to a dimension in which an arc spot is steered along the cathode target.

20 Claims, 46 Drawing Sheets

(51) Int. Cl.
*C23C 14/35* (2006.01)
*H01J 37/32* (2006.01)

(52) U.S. Cl.
CPC ............ *C23C 14/35* (2013.01); *C23C 14/355* (2013.01); *H01J 37/32055* (2013.01); *H01J 37/3405* (2013.01); *H01J 37/3417* (2013.01); *H01J 37/32357* (2013.01); *H01J 37/34* (2013.01)

(58) Field of Classification Search
CPC .... H01J 37/3438; C23C 14/32; C23C 14/355; C23C 14/0641; C23C 14/22; C23C 14/325; C23C 14/35
See application file for complete search history.

(56) References Cited

U.S. PATENT DOCUMENTS

| | | | |
|---|---|---|---|
| 3,436,332 | A | 4/1969 | Oda et al. |
| 3,583,899 | A | 6/1971 | Aronson |
| 4,111,783 | A | 9/1978 | Bindell et al. |
| 4,155,285 | A | 5/1979 | Fournier |
| 4,155,825 | A | 5/1979 | Fournier |
| 4,254,159 | A | 3/1981 | Pulker et al. |
| 4,269,137 | A | 5/1981 | Johnson |
| 4,434,038 | A | 2/1984 | Morrison, Jr. |
| 4,448,799 | A | 5/1984 | Bergman et al. |
| 4,588,490 | A | 5/1986 | Cuomo et al. |
| 4,730,334 | A | 3/1988 | Collins et al. |
| 4,777,908 | A | 10/1988 | Temple et al. |
| 4,877,505 | A | 10/1989 | Bergmann |
| 4,885,068 | A | 12/1989 | Uramoto et al. |
| 4,951,604 | A | 8/1990 | Temple et al. |
| 5,250,779 | A | 10/1993 | Kaufmann et al. |
| 5,262,032 | A | 11/1993 | Hartig et al. |
| 5,294,322 | A | 3/1994 | Vetter et al. |
| 5,346,600 | A | 9/1994 | Nieh et al. |
| 5,503,725 | A | 4/1996 | Sablev et al. |
| 5,635,087 | A | 6/1997 | Schiller |
| 6,086,962 | A | 7/2000 | Mahoney et al. |
| 6,153,067 | A | 11/2000 | Maishev et al. |
| 6,238,537 | B1 | 5/2001 | Kahn |
| 6,296,742 | B1 | 10/2001 | Kouznetsov |
| 6,300,720 | B1 | 10/2001 | Birx |
| 6,365,009 | B1 | 4/2002 | Ishibashi |
| 6,579,421 | B1 | 6/2003 | Fu |
| 6,663,755 | B2 * | 12/2003 | Gorokhovsky ....... C23C 14/022 204/192.38 |
| 6,692,617 | B1 | 2/2004 | Fu et al. |
| 7,147,759 | B2 | 12/2006 | Chistyakov |
| 7,160,616 | B2 | 1/2007 | Massler et al. |
| 7,300,559 | B2 | 11/2007 | Gorokhovsky et al. |
| 7,327,089 | B2 | 2/2008 | Madocks |
| 7,498,587 | B2 | 3/2009 | Welty |
| 8,500,975 | B2 | 8/2013 | Le et al. |
| 9,412,569 | B2 * | 8/2016 | Gorokhovsky |
| 2002/0007796 | A1 | 1/2002 | Gorokhovsky |
| 2002/0157609 | A1 | 10/2002 | Gorokhovsky et al. |
| 2003/0089601 | A1 | 5/2003 | Ding et al. |
| 2004/0168637 | A1 | 9/2004 | Gorokhovsky |
| 2007/0087185 | A1 | 4/2007 | Wei et al. |
| 2007/0138003 | A1 | 6/2007 | Quinn |
| 2007/0284255 | A1 | 12/2007 | Gorokhovsky et al. |
| 2008/0035470 | A1 | 2/2008 | Tietema et al. |
| 2008/0110749 | A1 * | 5/2008 | Krassnitzer ........... C23C 14/325 204/192.38 |
| 2008/0292812 | A1 | 11/2008 | Ramm et al. |
| 2009/0214787 | A1 | 8/2009 | Wei et al. |
| 2010/0264016 | A1 | 10/2010 | Anders et al. |
| 2011/0100800 | A1 | 5/2011 | Gorokhovsky |
| 2011/0111190 | A1 | 5/2011 | Ronghua et al. |
| 2011/0226617 | A1 | 9/2011 | Hofmann et al. |
| 2012/0019070 | A1 | 1/2012 | Matsuoka et al. |
| 2012/0114871 | A1 | 5/2012 | Gorokhovsky |
| 2014/0076715 | A1 | 3/2014 | Gorokhovsky et al. |
| 2014/0076716 | A1 | 3/2014 | Gorokhovsky et al. |
| 2014/0076718 | A1 | 3/2014 | Gorokhovsky et al. |

FOREIGN PATENT DOCUMENTS

| | | |
|---|---|---|
| CN | 102628159 A | 8/2012 |
| DE | 23 21 665 A1 | 11/1973 |
| DE | 3413728 A1 | 10/1984 |
| DE | 34 26 145 A1 | 3/1985 |
| DE | 3426145 A1 | 3/1985 |
| EP | 0 306 612 A1 | 3/1989 |
| EP | 0511153 A1 | 10/1992 |
| EP | 0 677 595 A1 | 7/1994 |
| EP | 1852891 | 11/2007 |
| EP | 2 431 995 A1 | 3/2012 |
| EP | 2 778 254 A1 | 9/2014 |
| JP | S60121265 | 6/1985 |
| JP | 2008274334 | 11/1988 |
| JP | H 0273964 A | 3/1990 |
| JP | H 02104663 A | 4/1990 |
| JP | H0344463 A | 2/1991 |
| JP | 03126865 A * | 5/1991 |
| JP | H 080505437 A | 6/1996 |
| JP | 2002146528 A | 5/2002 |
| JP | S63282259 | 11/2008 |
| JP | WO2007058224 A1 | 5/2009 |
| JP | WO2008120430 A1 | 7/2010 |
| JP | 2013053369 | 3/2013 |
| WO | 2005/005684 A1 | 1/2005 |
| WO | 2007/124879 A2 | 11/2007 |
| WO | 2012/062369 A1 | 5/2012 |

OTHER PUBLICATIONS

EP 0 306 612 A1, U.S. Pat. No. 4,877,505.
EP Communication dated Jun. 26, 2014 forwarding EP Search Report completed Jun. 3, 2014 in EP Appn. No. 14160153, 6 pgs).
European Search Report dated May 21, 2014 in EP Appn. No. 13183572.0, 10 pgs.
Schneider, J.M., "Recent developments in plasma assisted physical vapour deposition," J. Phys. D: Appl. Phys., v. 33, Sep. 21, 2000, pp. R173-R186.
Cuomo, J.J., "Hollow-cathode-enhanced magnetron sputtering," J. of Vac. Sci. Technol. A: Vacuum Surfaces and Films, v. 4, No. 3, May 1, 1986, pp. 393-396.
European Extended Search Report dated Mar. 13, 2015 in EP Appn. No. 14190737.8, 13 pgs.
Non-final Office Action dated May 15, 2015 in U.S. Appl. No. 13/617,005, filed Sep. 14, 2012, 31 pgs.
Novikov et al. Surface and Coating Technology Journal, Aug. 1991, vol. 47, Issues 1-3, p. 770-791, "Superhard i-C coatings used in complex processes of surface strengthening of tools and machine parts."
Posadowski., Multicomponent and Multilayered Thin Films for Advanced Microtechnologies: Techniques, Fundamentals and Devices, NATO ASI Series, Ed. By Orlando Auciello, Jurgen Engemann, vol. 234, 1993, p. 109-113, "Discharge Density Increase for High Rate Magnetron Sputtering".
Gorokhovsky et al. Surface and Coating Technology 2013, vol. 215, p. 431-439, "Ion Treatment by low pressure arc plasma immersion surface engineering processes."
Spatenka et al. Plasma Sources Sci. Technol. 1997, vol. 6, p. 46-52, "A comparison of internal plasma parameters in a conventional planar magnetron and a magnetron with additional plasma confinement."
Wakeham et al. Thin Solid Films 2009, 4 Pages, "Low temperature remote plasma sputtering of indium tin oxide for flexible display applications."
Tisone et al. J. Vac. Sci. Technol. Mar./Apr. 1974, vol. 11, No. 2, p. 519-527, "Low-voltage triode sputtering with a confined plasma: Part I—geometric aspects of deposition."
Sagas et al. Vacuum 2011, vol. 85, p. 705-710, "Influence of electromagnetic confinement on the characteristics of a triode magnetron sputtering system."

(56) References Cited

OTHER PUBLICATIONS

Li et al. J. Phys. D Appl. Phys. 1999, vol. 32, p. 1039-1043, "A description of metal-vapour production in a hallow-cylindrical magnetron sputtering discharge."
Degout et al. Surface and Coatings Technology 1993, vol. 57, p. 105-110, "High current density triode magnetron sputtering."
Andersson et al. Applied Physics Letters 2008, vol. 92, p. 221503-1-221503-3, "Gasless sputtering Opportunities for ultraclean metallization, coatings in space, and propulsion."
Non-final Office Action dated May 2, 2016 in U.S. Appl. No. 13/617,005, filed Oct. 28, 2013, 17 pgs.
Bhat, D.G. et al., "Development of a Coating for Wear and Cracking Prevention in Die-Casting Dies by the Filtered Cathodic Arc Process," Transactions of the North American Die Casting Assn., 20th Int'l Die Casting Congress and Exposition, Cleveland, OH, Nov. 30, 1999, pp. 391-399.
Final Office Action dated Dec. 14, 2016 in U.S. Appl. No. 14/064,617, filed Oct. 28, 2013, 21 pgs.
Non-final Office Action dated Apr. 10, 2017 in U.S. Appl. No. 14/706,510, filed Mar. 7, 2015, 61 pgs.
Final Office Action dated Dec. 28, 2017 for U.S. Appl. No. 14/706,510, filed May 17, 2015, 35 pgs.
Chinese Office Action dated Nov. 28, 2017 for CN Appn. No. 201410592209.1 filed Oct. 28, 2014, 8 pgs.
Japanese Office Action dated Nov. 2, 2017 for JP Appn. No. 2013-190723 filed Sep. 13, 2013, 2 pgs.

* cited by examiner

US 10,056,237 B2

LOW PRESSURE ARC PLASMA IMMERSION COATING VAPOR DEPOSITION AND ION TREATMENT

CROSS REFERENCE TO RELATED APPLICATIONS

This application is a continuation-in-part of U.S. application Ser. No. 13/617,005 filed Sep. 14, 2012, now U.S. Pat. No. 9,412,469 issued Jul. 20, 2016, the disclosure of which is incorporated in its entirety by reference herein.

FIELD OF THE INVENTION

The present invention relates to plasma assisted deposition systems and related methods.

BACKGROUND OF THE INVENTION

Physical vapor deposition (PVD) and low pressure Chemical vapor deposition (CVD) sources are used for deposition of coatings and surface treatment. Conventional metal vapor sources such as electron beam physical vapor deposition (EBPVD) and magnetron sputtering (MS) metal vapor sources can provide high deposition rates. However, the low energy of the metal vapor atoms and the low ionization rate of these processes result in coatings with low density, poor adhesion, poor structure and morphology. It is well established that assistance of the coating deposition process with bombardment by energetic particles dramatically improves coatings by densifying the depositing materials, reducing the grain size and improving coating adhesion. In these processes, the surface layer is affected by a high rate of bombardment by energetic ions which modifies the mobility of depositing metal vapor atoms and, in many cases, creates metastable structures with unique functional properties. Moreover, ion bombardment of the coating surface influences gas adsorption behavior by increasing the sticking coefficient of gases such as nitrogen and changing the nature of adsorption sites from lower energy physic-sorption sites to higher energy chemi-sorption sites. This approach is especially productive in the deposition of nano-structured composite coatings with ultra-fine or glass-like amorphous structures.

There are two different approaches to provide ion bombardment assistance during PVD or CVD processes. Ion beam assisted deposition (IBAD) is a method which holds great promise for forming dense ceramic coatings on polymers and other temperature sensitive materials. The IBAD process is typically carried out under vacuum ($\sim 1\times 10^{-5}$ Torr) in which a ceramic is thermally evaporated onto a substrate and simultaneously bombarded with energetic ions. The ion beam causes the deposited atoms to mix with the substrate, creating a graded layer, which can improve coating adhesion and reduce film stress. The impinging ions also produce a "shot-peening effect" which compacts and densifies the layer thereby reducing or eliminating columnar growth.

For example, during the IBAD processing of diamond-like carbon (DLC) films, carbon is evaporated by an electron beam source or sputtered by a magnetron source. Ion bombardment is provided by an independent broad-aperture ion beam source such as an argon ion beam. Such argon ion beams do not change the chemistry of the growing films and only influences its structure, morphology, binding energy and atom-to-atom bonding by lattice network modification. Addition of an appropriate gaseous precursor to the ion beam results in doping of the growing DLC films thereby providing a chemical vapor assistance during the IBAD process. An example of such silicon doping of DLC films are deposited from an $Ar+SiH_4$ ion beam. Fluoride can be added to the films via an Ar and fluorohydrocarbon ion beam, nitrogen can be added by using an Ar and $N_2$ ion beam, and boron can be added by using $Ar+BH_4$ ion beam. IBAD is a flexible technological process which allows control of coating properties in a broadened area by variation of the processing parameters: the ion beam composition, ion energy, ion current and the ion-to-atom arrival ratio.

Although the IBAD process works reasonably well, it has limitations due to its line-in-sight nature which is detrimental to achieving uniform coating distribution over complex shape components when the conformity of the coating deposition process is important. In addition, the IBAD process has limited scale up capability. The plasma immersion ion deposition (PIID) process overcomes some of these limitations by providing a low pressure plasma environment which effectively envelops the substrates to be coated within the uniform plasma cloud. This results in a highly uniform rate of ion bombardment over both 3-D complex shape substrates and large loads. The PVD or CVD process is used to generate vapor species for treatment of the substrate surface. In contrast to IBAD, the PIID is a non-line-of-sight process capable of treating complex surfaces without manipulation. PIID utilizes plasma generated from a gas discharge that fills in the entire processing chamber thereby allowing complex compositions and architectures to be coated. Examples of plasma immersion ion treatment include ionitriding, carbonitriding, ion implantation and other gaseous ion treatment processes that may be performed by immersing a substrate to be coated in a nitrogen containing plasma under negative bias. In addition, the electron current extracted from the plasma when substrates are positively biased can be used for pre-heating and heat treatment processes. Clearly, the non-line-of-sight processing feature presents numerous advantages over the line-of-sight processing, particularly for the efficient processing of a large quantity of 3-D objects. The ionized gaseous environment used during the PIID processes can be generated by applying different types of plasma discharges, such as glow discharge, RF discharge, micro-wave (MW) discharge and low pressure arc discharge. Low pressure arc discharge is particularly advantageous in that it provides a dense, uniform highly ionized plasma over large processing volumes at low cost. In the arc discharge plasma assisted coating deposition or ion treatment processes, substrates are positioned between the arc cathode and the remote arc anode within the arc discharge plasma area. Thermionic filament cathodes, hollow cathodes, vacuum arc evaporating cold cathodes, and combinations thereof can be used as electron emitters for generating a gaseous low pressure arc plasma discharge environment. Alternatively, the conductive evaporative material itself can be used as a cathode or an anode of an ionizing arc discharge. This latter feature is provided in the vacuum cathodic arc deposition processes or in various arc plasma enhanced electron beam and thermal evaporation processes.

Deposition of a reacted coating like CrN may be accomplished by various physical vapor deposition techniques such as cathodic arc deposition, filtered arc deposition, electron beam evaporation and sputter deposition techniques. Electron beam physical vapor deposition (EBPVD) technology, both conventional and ionized, has been used in many applications, but is generally not considered a viable manufacturing technology in many fields because of batch-processing issues, difficulties of scaling up to achieve uniform coating distribution across large substrates and because of the difficulty of multi-elemental coating composition control due to thermodynamically driven distillation of the elements with different vapor pressures. In contrast, magnetron sputtering (MS) based PVD is used for a wide variety of applications due to the high uniformity of magnetron coatings at acceptable deposition rates, precise control of multi-elemental coating composition and the ability of the MS process to be easily integrated in fully automated industrial batch coating systems. Cathodic and anodic arc enhanced electron beam physical vapor deposition (EBPVD) processes dubbed hot evaporated cathode (HEC) and hot evaporated anode (HEA) respectively have demonstrated increased ionization rate, but suffer from arc spots instabilities and non-uniform distribution of the ionization rate across the EBPVD metal vapor flow. In these processes, the arc discharge is coupled with evaporation process making it difficult to provide independent control of ionization and evaporation rates in HEA and HEC processes. Therefore, it is extremely difficult to integrate PA-EBPVD processes in fully automated industrial batch coating systems.

Sputter techniques are well known in the art as being capable of cost effectively depositing thick reacted coatings although films beyond about one micron tend to develop haziness due to crystallization. The crystallization phenomenon or columnar film growth is associated with the inherent low energy of depositing atoms in sputter deposition techniques thereby creating an opportunity for energetically favored crystal structures. These crystal structures may have undesired anisotropic properties specific for wear and cosmetic applications. Various approaches have been developed over the last decade to enhance the ionization rate in a magnetron sputtering process. The main goal of these approaches is to increase the electron density along the pass of the magnetron sputtering atoms flow thereby increasing ionization of metal atoms by increasing the frequency of electron-atom collisions. The high power impulse magnetron sputtering (HIPIMS) process uses high power pulses applied to the magnetron target concurrently with DC power to increase electron emission and consequently increase the ionization rate of metal sputtering flow. This process demonstrates improved coating properties in the deposition of nitride wear resistant coatings for cutting tools. In the HIPIMS process, improved ionization is achieved only during short pulse times, while during pauses, the ionization rate is low as in conventional DC-MS processes. Since the pulse parameters are coupled with magnetron sputtering process parameters in the HIPIMS process, the sputtering rate, which is found to be almost three times lower than that of the conventional DC-MS process, can be adversely affected. Moreover, the high voltage pulses in the HIPIMS process may induce arcing on magnetron targets resulting in contamination of the growing films.

In order to generate a highly ionized discharge in a vicinity of magnetron targets, an inductively coupled plasma (ICP) source can be added in the region between the cathode and the substrate. A non-resonant induction coil is then placed parallel to the cathode in essentially a conventional DC-MS apparatus, immersed or adjacent to the plasma. The inductive coil is generally driven at 13.56 MHz using a 50Ω rf power supply through a capacitive matching network. The rf power is often coupled to the plasma across a dielectric window or wall. Inductively coupled discharges are commonly operated in the pressure range of 1-50 mTorr and applied power 200-1000 W resulting in an electron density in the range of $10^{16}$-$10^{18}$ $m^{-3}$ which is generally found to increase linearly with increasing applied power. In a magnetron sputtering discharge, metal atoms are sputtered from the cathode target using dc or rf power. The metal atoms transit the dense plasma, created by the rf coil, where they are ionized. A water cooled inductive coil placed between the magnetron target and substrates to be coated adversely affects the metal sputtering flow. The MS setup is therefore much more complicated, expensive, and difficult to integrate into existing batch coating and in-line coating system. These disadvantages are also true for the microwave assisted magnetron sputtering (MW-MS) process. In the MW-MS process, the vacuum processing chamber layout must be re-designed to allow the metal sputtering flow crossing an ionization zone. However, the RF, MW and ICP approaches to ionizing the PVD process experience difficulties with plasma distribution uniformity over a large processing area, which is an obstacle for integration into large area coating deposition systems.

Another prior art technique for producing energetic ions is plasma enhanced magnetron sputtering (PEMS) which has a thermionic hot filament cathode (HF-MS) or hollow cathode (HC-MS) as a source of ionized electrons to increase the ionization rate in the DC-MS process. In the HF-MS process, a distant thermionic filament cathode is used as a source of ionizing electrons making this process similar to the HC-MS process. However, this process typically exhibits plasma non-uniformity and is difficult to integrate in industrial large area coating systems. Moreover, both hot filaments and hollow arc cathodes are sensitive and degrade quickly in the reactive plasma atmosphere. The disadvantages of these plasma generating processes are overcome by utilizing a cold evaporative vacuum arc cathode as a source of electrons for ionization and activation of a vapor deposition processing environment.

The cosmetic appearance of the conventional cathodic arc deposited films includes particulates of un-reacted target material called macros that renders the deposited film with defects undesired in applications requiring specific wear, corrosion and cosmetic properties. However, arc deposited films do not have a crystalline character unlike sputtered films because the arc evaporation process produces highly ionized plasma with a high energy of depositing atoms believed to effectively randomize crystal structures in the developing film.

Accordingly, there is a need for additional techniques of producing energetic particles in coating processes to produce improved film properties.

SUMMARY OF THE INVENTION

The present invention solves one or more problems of the prior art by providing in at least one embodiment a system for coating a substrate. The coating system includes a vacuum chamber and a coating assembly positioned within the vacuum chamber. The coating assembly includes a vapor source that provides material to be coated onto a substrate, a substrate holder to hold substrates to be coated such that the substrates are positioned in front of the vapor source, a cathode chamber assembly, and a remote anode. The cathode chamber assembly includes a cathode target, an optional primary anode and a shield which isolates the cathode from the vacuum chamber. The shield defines openings for transmitting an electron emission current from the cathode into the vacuum chamber. The vapor source is positioned between the cathode chamber assembly and the remote anode while the remote anode is electrically coupled to the cathode. The coating system also includes a primary power supply connected between the cathode target and the primary anode and a secondary power supply connected between the cathode target and the remote anode. Characteristically, the remote anode has a linear remote anode dimension, the vapor source has a linear vapor source dimension, the cathode target has a linear cathode target dimension, and the substrate holder has a linear holder dimension such that the linear remote anode dimension, the linear vapor source dimension, the linear cathode target dimension, and the linear holder dimension are parallel to each other, with the linear remote anode dimension being equal to or greater than the linear cathode target dimension and the linear vapor source dimension such that a confined plasma streams from the cathode target to the remote anode.

In another embodiment, a method of coating a substrate in the coating system set forth above is provided. The method includes a step of generating a primary arc in the electron emitting cathode source between the cathode target and the primary anode. A confined remote arc in a coating area is generated between the cathode chamber assembly and the remote anode such that metal vapor flow from the vapor source is generated toward at least one substrate to be coated. In still another embodiment, a coating system having a directed arc spot is provided. The coating system includes a vacuum chamber and a coating assembly positioned within the vacuum chamber. The coating assembly includes at least one sputtering source, a substrate holder to hold substrates to be coated such that the substrates are positioned in front of the sputtering source, and a plasma duct defining a first exit opening and a second exit opening. The coating assembly includes a cathode target for generating a metal plasma positioned in the plasma duct, a remote anode electrically coupled to the cathode target, a primary power supply for powering the cathode, and a secondary power supply connected between the cathode target and the remote anode. The sputtering source is positioned between the cathode target and the remote anode. A duct coil surrounds the plasma duct such that activation of the duct coil creating a transporting magnetic field within the plasma duct that is substantially parallel to an evaporating surface of the cathode target to direct the plasma away from the plasma duct extending to the sputtering source and/or substrates on the substrate holder during film deposition. A duct coil power supply activates the duct coil while a first trim electromagnet and a second trim electromagnet are positioned adjacent to opposite non-evaporating opposite sides of the cathode target where they generate a magnetic field above a surface of the cathode target.

In still another embodiment, a coating system having a remote anode is provided. The coating system includes a vacuum chamber and a coating assembly. The coating assembly includes a vapor source having a target face with a vapor source long dimension and a vapor face short dimension and a substrate holder to hold substrates to be coated such that the substrates are positioned in front of the vapor source. The substrate holder has a linear holder dimension. The coating assembly further includes a remote anode electrically coupled to the cathode target. The remote anode has a linear remote anode dimension. The coating assembly further includes a cathode chamber assembly having a cathode target, an optional primary anode and a shield which isolates the cathode target from the vacuum chamber. The cathode target having a linear cathode target long dimension and a linear cathode target short dimension. The shield defines at least one opening for transmitting an electron emission current of a remote arc discharge from the cathode target to the remote anode that streams along the target face long dimension. A primary power supply is connected between the cathode target and the primary anode while a secondary power supply is connected between the cathode target and the remote anode. Characteristically, the linear remote anode dimension and the vapor source short dimension are parallel to a dimension in which an arc spot is steered along the cathode target.

In still another embodiment, a method of coating a substrate in the coating systems herein is provided. The method includes steps of the generating a primary arc in the electron emitting cathode source between the cathode target and the primary anode; generating a confined remote arc in a coating area between the cathode chamber assembly and the remote anode; and generating metal vapor flow from the vapor source toward at least one substrate to be coated.

BRIEF DESCRIPTION OF THE DRAWINGS

Exemplary embodiments of the present invention will become more fully understood from the detailed description and the accompanying drawings, wherein.

DESCRIPTION OF THE INVENTION

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Throughout this application, where publications are referenced, the disclosures of these publications in their entireties are hereby incorporated by reference into this application to more fully describe the state of the art to which this invention pertains.

Figure 1A:
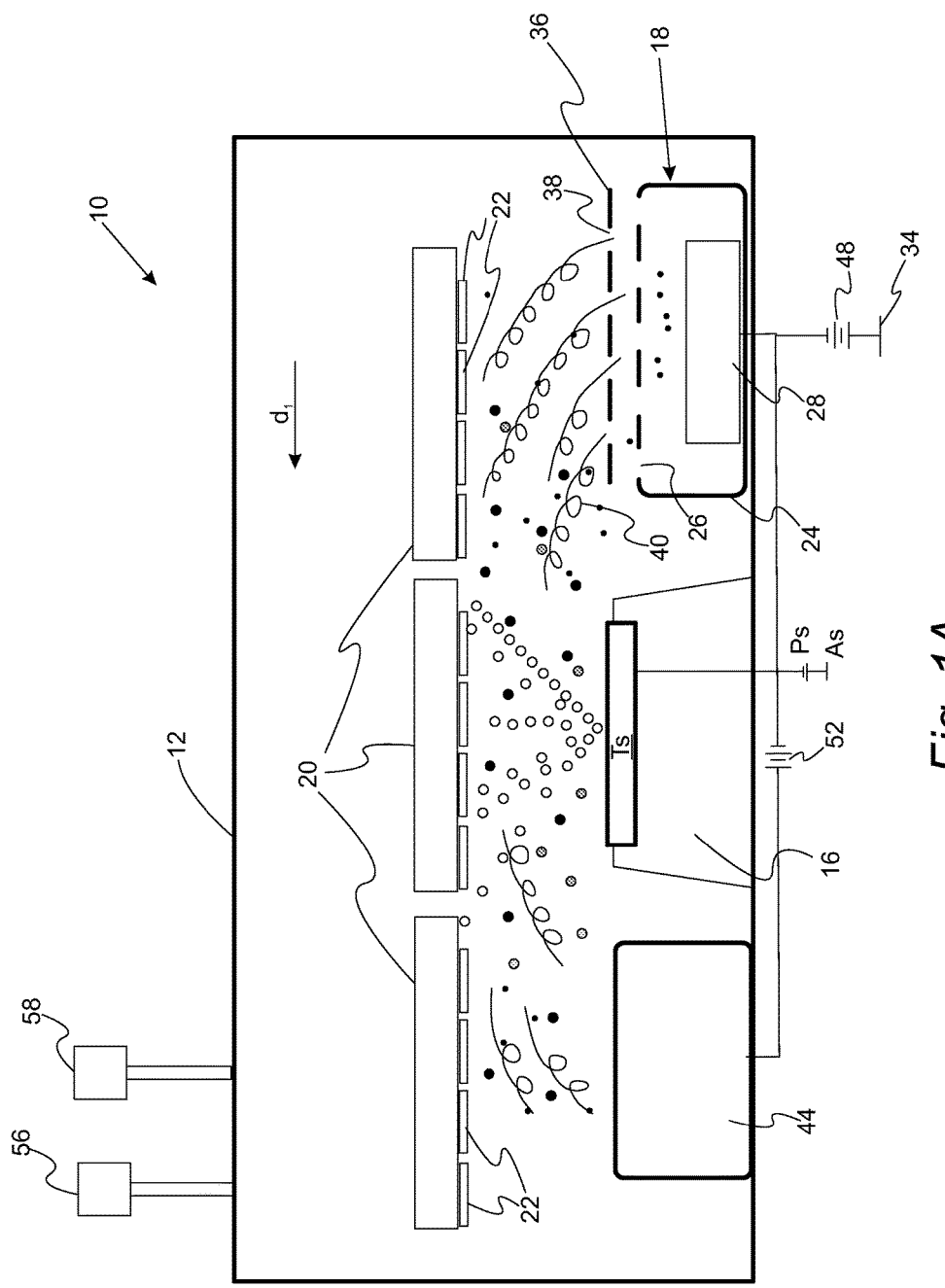
FIG. 1A is an idealized side view of a coating system using a remote arc discharge plasma.
Figure 1B:
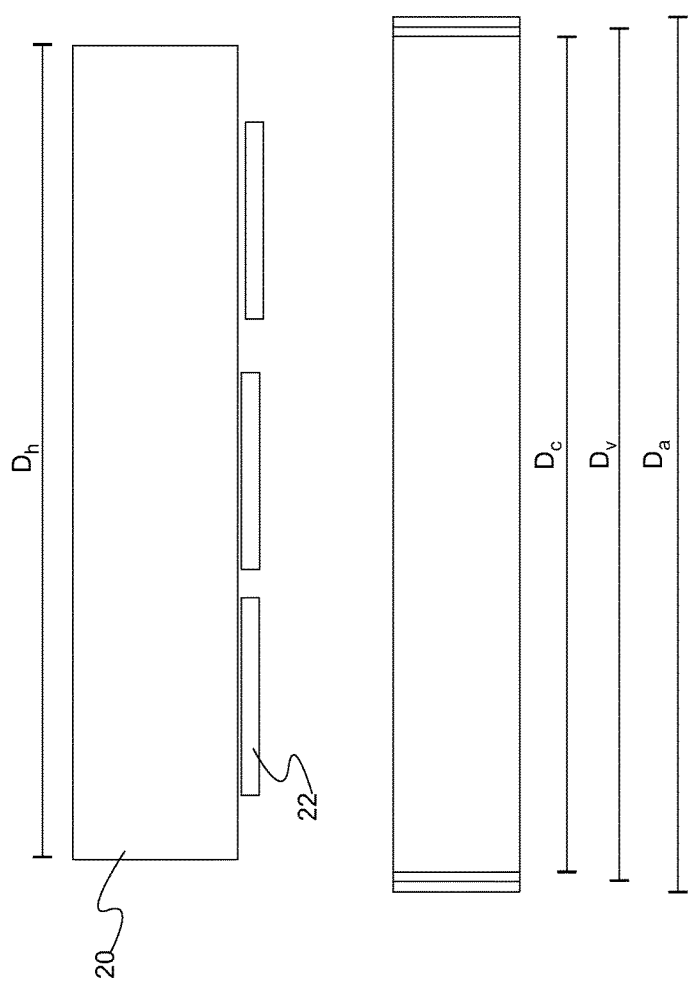
FIG. 1B is a front view of the coating system perpendicular to the view of FIG. 1A.

With reference to FIGS. 1A, 1B, 1C and 1D, a coating system that uses a remote arc discharge plasma is provided. FIG. 1A is an idealized side view of the coating system. FIG. 1B is a front view perpendicular to the view of FIG. 1A.

Figure 1C:
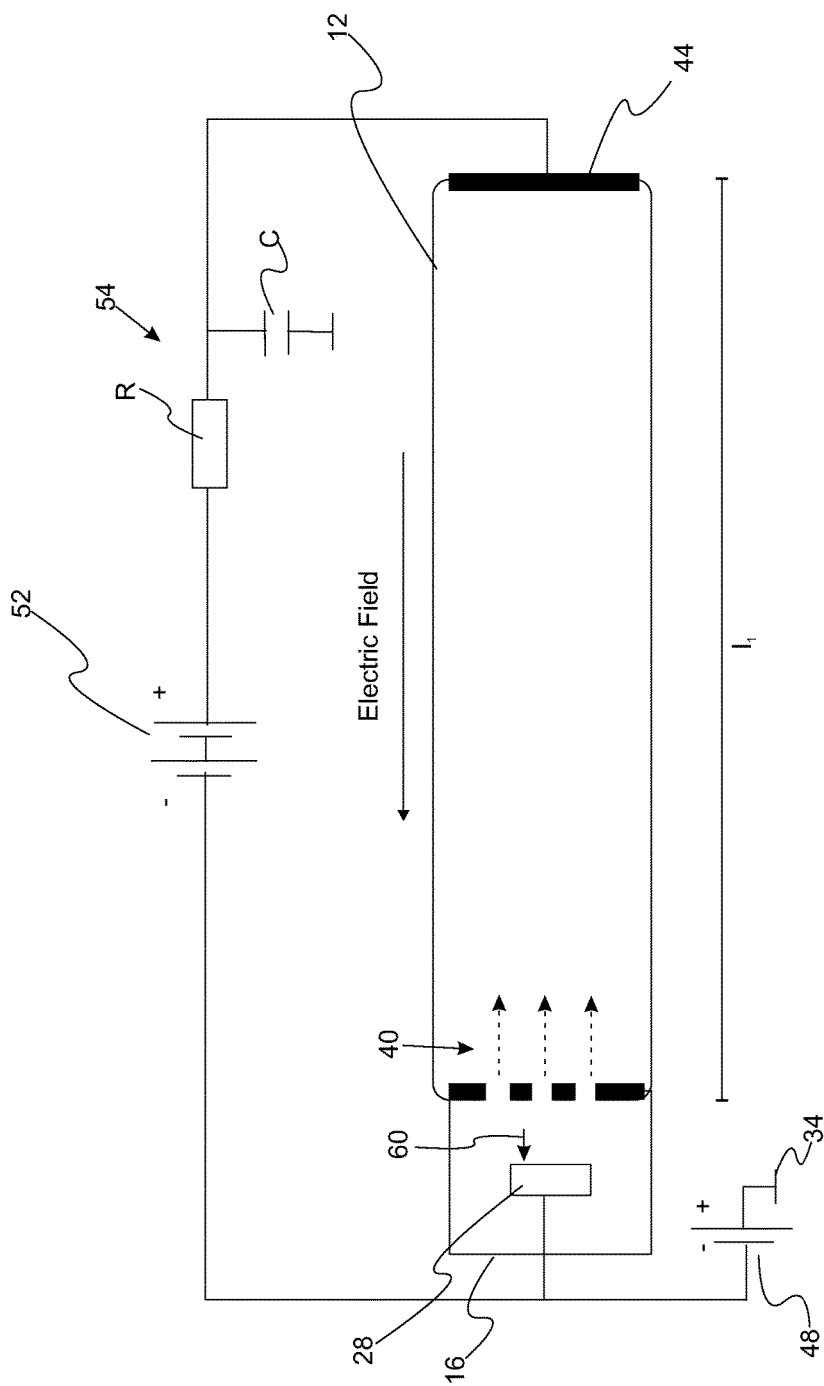
FIG. 1C is a schematic of the coating system of FIG. 1A.

FIG. 1C is a schematic of the coating system including electrical wiring. The system of this embodiment is particularly useful for arc plasma enhancement of large area magnetron sputtering coating deposition processes. Coating system 10 includes vacuum chamber 12 with a coating assembly positioned therein. The coating assembly includes vapor source 16, cathode chamber assembly 18 positioned in vacuum chamber 12, and substrate holder 20 to hold substrates 22 to be coated. FIGS. 1A and 1B depict a variation in which vapor source 16 is a magnetron sputtering source so that the coating process of system 10 is a remote arc assisted magnetron sputtering (RAAMS) process. Such magnetron sputtering sources include a target Ts, a power supply Ps, and an anode As. It should be appreciated that other types of vapor sources may be utilized for vapor source 16. Examples of such vapor sources include, but are not limited to, thermal evaporators, electron beam evaporators, cathodic arc evaporators, and the like. Substrates 22 are positioned in front of the vapor source 16 during coating and move along direction $d_1$ during deposition of the coating. In a refinement, substrates may be continuously introduced from a load-lock chamber at the right of vacuum chamber 12 and received by an output chamber at the left of vacuum chamber 12 in FIG. 1A. Cathode chamber assembly 18 includes a cathode enclosure 24 with openings 26 defined therein, electron emitting cathode 28, an optional separate primary anode 34 and shield 36. Shield 36 isolates electron emitting cathode 28 from vacuum chamber 12. In a refinement, optional separate anode 34, cathode enclosure 24, shield 36, or a ground connection operate as the primary cathode-coupled anode.

Cathode chamber assembly 18 operates as an electron emitting cathode source in the context of the present embodiment. In a refinement, a primary arc is generated in the electron emitting cathode source between cathode 28 and the primary anode. The cathode enclosure 24 can serve both as an independent primary anode connected to the positive pole of the primary arc power supply 48 and as a grounded anode, when it is connected to the ground 34. Shield 36 defines openings 38 for transmitting electron emission current 40 from cathode 28 into vacuum chamber 12. The shield can be floating or it can be connected to the positive pole of either primary arc power supply 48 or an additional power supply (not shown). In another refinement, cathode 28 is a cathodic arc cathode and the grounded primary anode 34 is a cathodic arc anode. Any number of different cathodes may be used for electron emitting cathode 28. Examples of such cathodes include, but are not limited to, cold vacuum arc cathodes, hollow cathodes, thermionic filament cathodes, and the like, and combinations thereof. Typically, the cathode target is made of metal having a gettering capability including titanium and zirconium alloys. In a refinement, the shield of the cathode chamber is water cooled and negatively biased in relation to the cathode target wherein the bias potential of the shield ranges from −50 volts to −1000 volts. In still another refinement, cathode chamber assembly 18 includes a cathode array having a plurality of cathode targets installed therein with the height of cathode target array being substantially the same height of the remote anode and the height of a deposition area. Separation from the top of the cathode chamber assembly or vapor source 16 to substrates 22 (i.e., top of the substrates) is such that the plasma streaming from cathode 28 to remote anode 44 is confined. Typically, separation distance from the shield 36 of the cathode chamber assembly or from the evaporation surface of the vapor source 16 or from the remote anode 44 to substrates 22 is from about 2 inches to about 20 inches, which result in a formation of a narrow corridor for confinement of the remote arc plasma between the cathode 28 in a cathode chamber 18 and the remote anode 44. When the width of this corridor is less than 2 inches it creates high impedance in plasma leading to plasma instabilities and eventually extinguishing of the remote arc discharge. When the width of this corridor is greater than 20 inches the plasma density in the remote arc discharge is not increasing enough to ionize the metal sputtering flow. In a particularly useful refinement, a large area cathode target having a shape of plate or bar is installed in the cathode chamber assembly 18. Typically, such a large area cathode target has a height that is substantially equal to the height of the anode and the height of a deposition area. In a refinement, the cathode target can be made of the metal having a gettering capability such as for example titanium alloy or zirconium alloy. In this case the shielded cathode electron emitting source can also serve as a vacuum gettering pump which can improve pumping efficiency of the coating system. To further improve the gettering pumping efficiency the shield 36 facing the evaporating surface of the cathode target 28 in the cathode chamber 18 can be water cooled and optionally connected to high voltage bias power supply. When the water cooled shield 36 is biased to high negative potential ranging from −50V to −1000V in relation to the cathode target 28, it will be subjected to intense ion bombardment by metal ions generating by the cathodic arc evaporating process. Condensation of metal vapor under conditions of intense ion bombardment is favorable for pumping noble gases such as He, Ar, Ne, Xe, Kr as well as hydrogen.

System 10 also includes remote anode 44 electrically coupled to cathode 28, primary power supply 48 connected between cathode 28 and the primary cathode-coupled anode. Remote anode 44 is positioned in vacuum chamber 12 such that vapor source 16 is positioned between cathode chamber assembly 18 and the remote anode. In a refinement, a plurality of vapor sources is positioned between cathode chamber assembly 18 and remote anode 44 as set forth below in more detail. System 10 also includes secondary power supply 52 which electrically couples cathode 28 to remote anode 44. Low pass filter 54 is also depicted in FIG. 1A which includes resistor R and capacitor C. Typically, vapor source 16 is positioned between cathode chamber assembly 18 and remote anode 44. System 10 further includes pumping system 56 for maintaining a reduced pressure and gas system 58 for introducing one or more gases (e.g., argon, nitrogen, helium, etc.) into deposition chamber 12. In a refinement, secondary power supply 52, which powers the distant arc discharge in coating chamber 12 is installed between cathode chamber assembly 18 and remote anode 44 and provides at least 20% higher open circuit voltage than primary power supply 48.

Figure 1D:
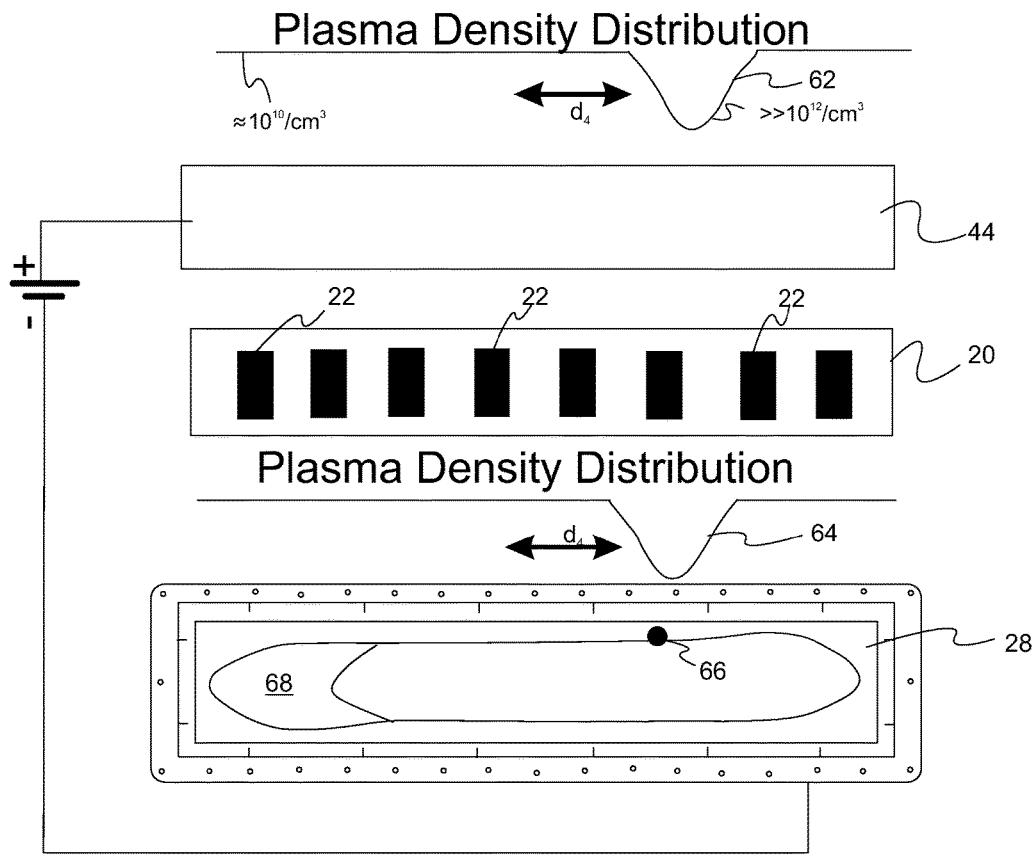
FIG. 1D is a schematic illustration showing confinement of the plasma jet streaming between the cathode and remote anode.
Figure 1E:
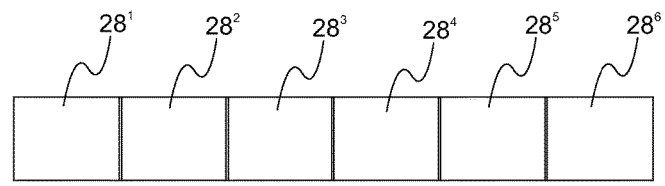
FIG. 1E is a schematic of a multi-element cathode used to raster a plasma jet.
Figure 2:
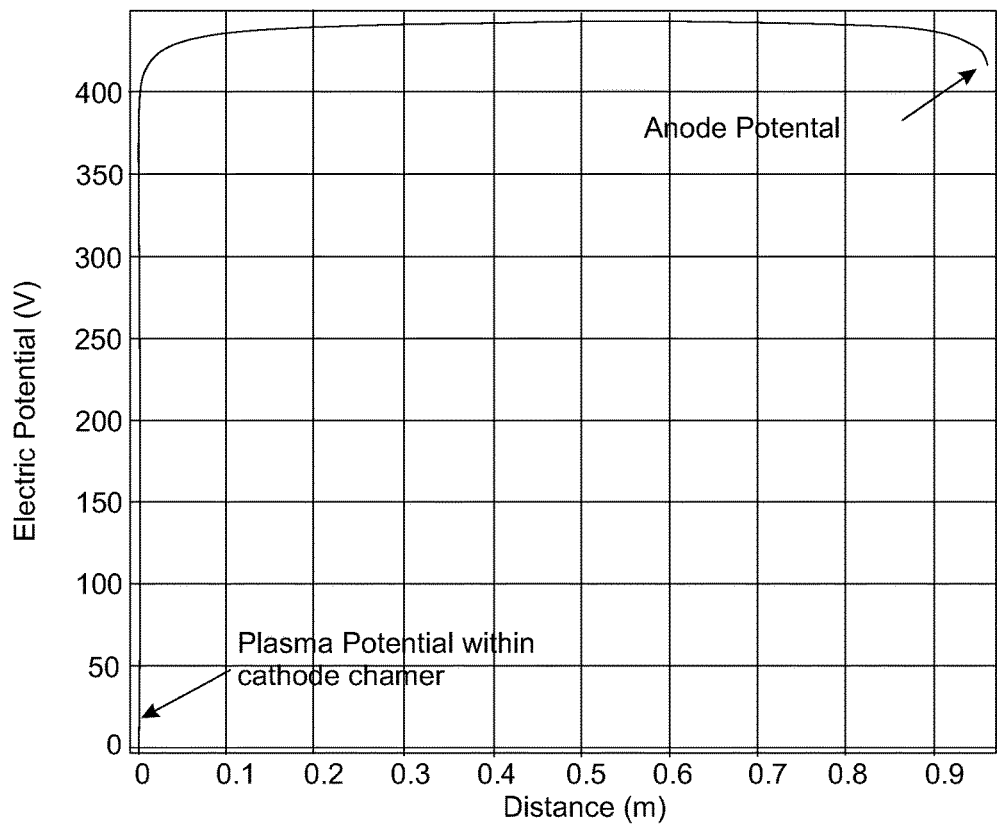
FIG. 2 provides a typical distribution of the plasma potential between the screen and the remote anode obtained by finite element modeling.

Still referring to FIGS. 1A, 1B, 1C, and 1D, a primary arc is initiated by arc igniter 60 in a cathode chamber 24 isolated from the discharge chamber by shield 36 with openings 38 for transmission of the electron current 40. Typically, the plasma potential near the screen is low, close to the plasma potential in cathode chamber assembly 18, while in the remote arc discharge plasma, the electric potential is high, close to the electrical potential of remote anode 44. FIG. 2 provides a typical distribution of the plasma potential between the screen and the remote anode obtained by finite element modeling. Surprisingly, the present coating system is found to produce a confined plasma arc that streams from cathode chamber assembly 18 to remote anode 44. FIG. 1D provides a schematic illustration showing the movement of the plasma density between remote anode 44 and cathode 28. A confined plasma streams (i.e., a plasma jet) between the remote anode and the cathode through the coating region. The ends of the confined plasma move along direction $d_4$ as set forth in FIG. 1D. An arc spot 66 forms on cathode 28 along with erosion zone 68 The plasma field 62 at remote anode 44 and the plasma field 64 at cathode 28 are confined dimensionally in a space from about 1 to 5 inches along direction $d_4$. In one refinement, magnetic fields are used to accomplish the rastering movement along $d_4$. In other refinement, this rastering movement is accomplished by mechanically moving cathode 28 along direction $d_4$. In still other refinements, an emission filament bombarding cathode with electrons is moved along $d_4$. In still other refinements as shown in FIG. 1E, the cathode includes a plurality of cathode elements $28^{1-6}$ which are sequentially activated in order to form a plasma jet moving along $d_4$. The confinement of the plasma arc results in a high density and hot plasma jet connecting cathodic arc spots at the primary cathode with an associated area at the remote anode running through a relatively narrow corridor created between the chamber walls (with primary cathodes, anodes and magnetrons attached) and substrate holder. This results in a high current density in the moving plasma jet connecting the cathode and remote anode. In a refinement, the current density in RAAMS plasma within this narrow corridor is from 0.1 mA/cm² up to 100 A/cm². Typically, the electron density $n_e$ in the background remote arc plasma ranges from about $n_e \sim 10^8$ cm$^{-3}$ to about $n_e \sim 10^{10}$ cm$^{-3}$ while within the confined arc plasma jet area the electron density ranges from about $n_e \sim 10^{10}$ cm$^{-3}$ to about $n_e \sim 10^{13}$ cm$^{-3}$. The confinement creating the plasma jet is a result of the physical dimensional relations between the components as set forth below as well as the application of magnetic fields. In particular, the discharge operates at very high plasma potential which corresponds to a high energy of ion bombardment (i.e., the ion bombardment energy is the difference between the plasma potential (vs. ground) and the substrate bias potential (vs. ground)). Even at floating and grounded substrates, ions with 50-70 eV are obtained because the plasma potential is above 50 V. In a refinement, the plasma potential is from 5V to 500V.

With reference to FIGS. 1A and 1B, an aspect of the relative sizing of various components of coating system 10 is provided. Remote anode 44 has a linear remote anode dimension $D_a$. Vapor source 16 has a linear vapor source dimension $D_v$. Cathode target Ts has a linear cathode target dimension $D_c$. Substrate holder 20 has a linear holder dimension $D_h$. In a refinement, the linear remote anode dimension $D_a$, the linear vapor source dimension $D_v$, the linear cathode target dimension $D_c$. and the linear holder dimension $D_h$ are parallel to each other. In another refinement, the linear remote anode dimension $D_a$ is greater than or equal to the linear vapor source dimension $D_v$ which is greater than or equal to the linear cathode target dimension $D_c$ which is greater than or equal to the linear holder dimension $D_h$.

In a variation of the present embodiment, several remote anodes are associated with (i.e., electrically coupled to) at least one arc cathode positioned in the shielded cathodic chamber assembly 18. The remote anodes are positioned at strategic positions within the coating chamber.

In another variation, the perpendicular distances between each of the vapor sources (e.g., vapor source 16) and substrates 22 to be coated is substantially equal. Moreover, in a further refinement, the distance between cathode 28 and remote anode 44 is less than the distance at which breakdown occurs when an applied voltage of secondary power supply 52 exceeds 1.2 to 30 times the applied voltage of primary power supply 48.

In still another refinement of the present embodiment, plasma probes are installed between the cathode 28 and remote anode 44 to measure plasma density. Such measurements provide a feedback so that the second power supply 52 is adjusted to provide adjusting a remote anode current to remote anode 44 to obtain a uniform distribution of the plasma density between cathode chamber assembly 18 and remote anode 44.

Figure 3:
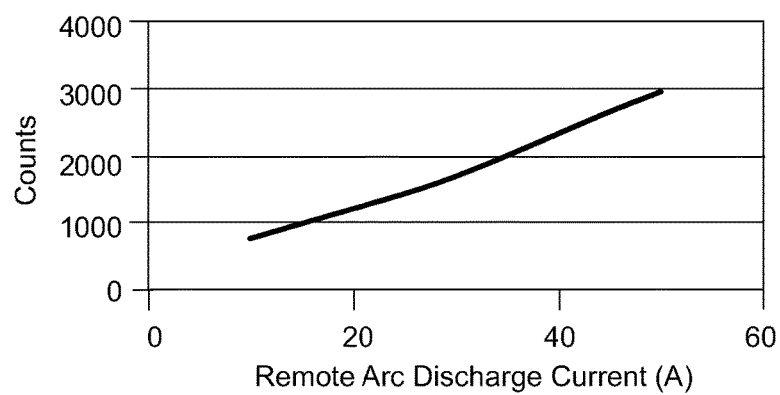
FIG. 3 provides the intensity of the radiation emitted by excited argon atoms (spectral line ArI 739.79 nm) from the remote arc discharge plasma versus the discharge current.

Remote arc plasma modeling of the present embodiment is characterized by the electric potential distribution between cathode chamber assembly 18 and remote anode 44 and by the plasma density in the remote arc discharge plasma. The plasma potential in the remote arc discharge plasma and the anode potential increase as the remote discharge current increases. The plasma density in the remote arc discharge plasma increases almost proportional to the discharge current. This result is verified by optical emission spectroscopy of the remote arc discharge plasma. FIG. 3 shows the intensity of the radiation emitted by excited argon atoms (spectral line ArI 739.79 nm) from the remote arc discharge plasma versus discharge current. It can be seen that the intensity of light emission from the argon atoms excited by direct electron impact is nearly proportional to the discharge current. This phenomenon is explained by the direct proportional relationship between electron concentration in the remote arc plasma and the remote arc discharge current. The ion concentration in the remote arc discharge is nearly equal to the electron concentration such that plasma quasi-neutrality is maintained.

Figure 4A:
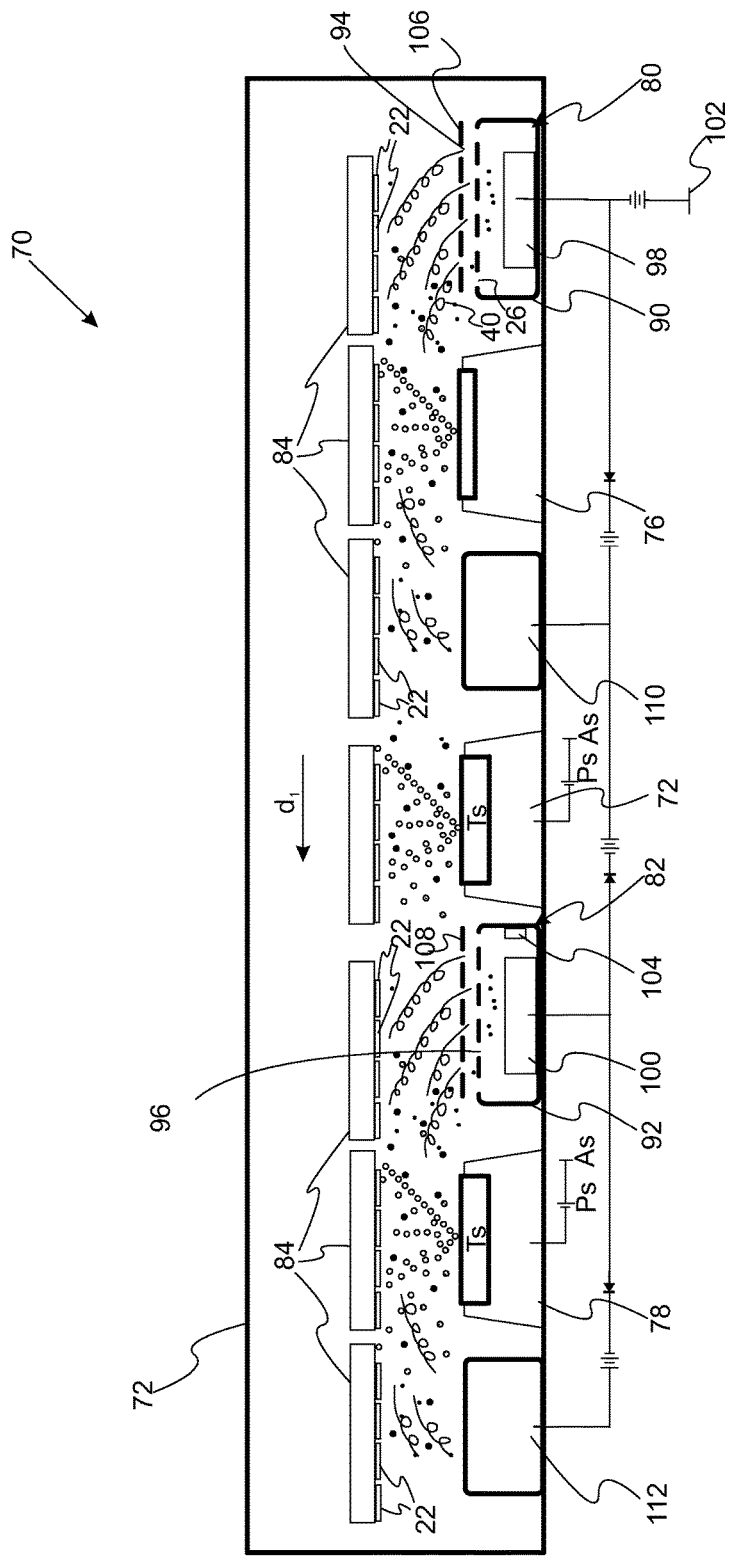
FIG. 4A provides a schematic of a coating system having additional remote anodes positioned between the magnetron sputtering source with additional shielded cathode chamber assemblies added to secure the uniformity and high ionization of a gaseous plasma environment.
Figure 4B:
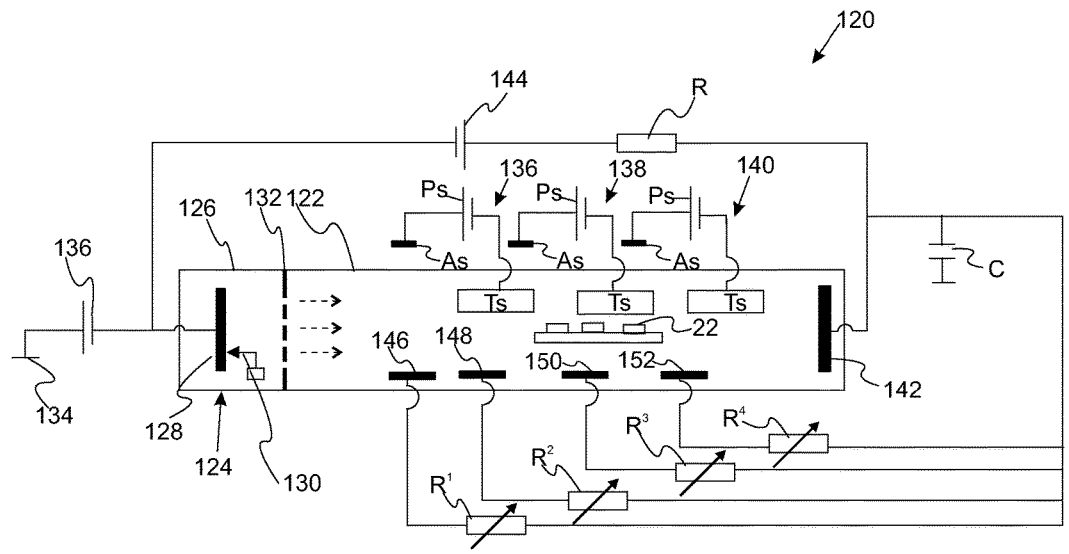
FIG. 4B provides a schematic illustration of a coating system which includes variable resistors installed between a master anode and each of a plurality of slave anodes.
Figure 4C:
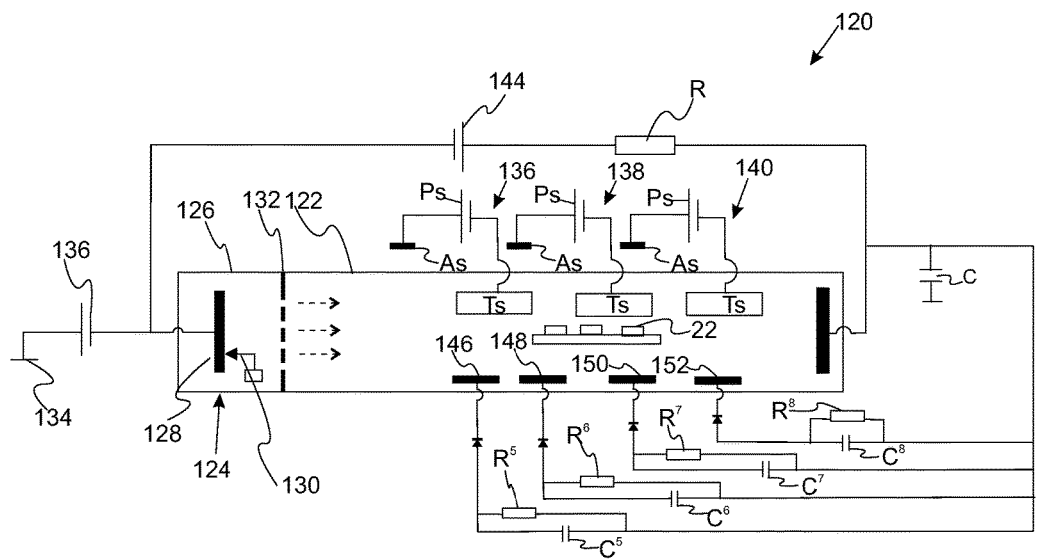
FIG. 4C provides a refinement in which a resistor in parallel with a capacitor is used to set the voltage potentials of the intermediate anode.

With reference to FIGS. 4A, 4B and 4C, variations of the present embodiment with a chain of magnetron sputtering sources installed inline between a shielded cathode chamber assembly on one side and a distant arc anode on the other side is provided. In this context, the term "inline" means that the components are linearly arranged such that the substrates may pass over the components while moving in a linear direction. FIG. 4A provides a schematic of a coating system having additional remote anodes positioned between the magnetron sputtering source with additional shielded cathode chamber assemblies added to secure the uniformity and high ionization of gaseous plasma environment. Deposition system 70 includes vacuum chamber 72 with associated vacuum and gas supply systems as set forth above. Deposition system 70 also includes vapor sources 76 and 78, cathode chamber assemblies 80 and 82, and substrate holder 84 to hold substrates 22 to be coated. FIG. 4A depicts a variation in which vapor sources 76, 78 are magnetron sputtering sources. The substrates are positioned in front of the vapor sources during coating. Typically, substrates 22 move along direction $d_1$ during deposition of the coating. Cathode chamber assemblies 80 and 82, respectively, include cathode enclosures 90 and 92 with openings 94 and 96 defined therein, cathodes 98 and 100, optional primary anodes 102 and 104, and shields 106, 108. Shields 106, 108 respectively isolate cathodes 98, 100 from vacuum chamber 72. Shields 106, 108 each define openings for transmitting electron emission currents into vacuum chamber 72. In a refinement, cathodes 98, 100 are cathodic arc cathodes and primary anodes 102, 104 are cathodic arc anodes. System 70 also includes remote anodes 110, 112, respectively, electrically coupled to cathodes 98, 100. In a refinement as depicted in FIG. 4A, the shielded cathode chamber assemblies, the vapor sources (e.g., magnetron targets) and the remote anodes are aligned along the straight line which is suitable for the in-line coating systems.

FIG. 4B provides a schematic illustration of a coating system which includes variable resistors installed between a master anode and each of a plurality of slave anodes. In this refinement, coating system 120 includes vacuum chamber 122 and cathode chamber assembly 124 which is of the general design set forth above. Cathode chamber assembly 124 includes cathode chamber 126, cathode 128, arc igniter 130, shield 132 defining a plurality of openings therein, and optional primary anode 134. System 120 also includes primary power supply 136 which connects cathode 128 and primary anode 134 and magnetron sputtering sources 136, 138, 140. Each magnetron sputtering source has a target Ts, a power supply Ps and an associated counter-electrode system 120 which also includes remote anode 142 with secondary power supply 144 providing a voltage potential between cathode 128 and remote anode 142. System 120 also includes slave anodes 146, 148, 150, 152 which are at intermediate voltage potentials established by variable resistors $R^1$, $R^2$, $R^3$, and $R^4$. In this refinement, the density of the plasma distribution can be controlled by changing the current through each of the slave anodes using variable resistors $R^1$, $R^2$, $R^3$, and $R^4$. The distances between the slave anodes and the distance between the slave anode closest to the master anode and the master anode cannot be greater than the minimal distance of the plasma discharge interruption in a processing gas composition and pressure.

FIG. 4C provides a refinement in which a resistor in parallel with a capacitor is used to set the voltage potentials of the intermediate anode. In this refinement, resistor $R^5$ in parallel with $C^5$ sets the voltage potential for anode 146, resistor $R^6$ in parallel with $C^6$ sets the voltage potential for anode 148, resistor $R^7$ in parallel with $C^7$ sets the voltage potential for anode 150, and resistor $R^8$ in parallel with $C^8$ sets the voltage potential for anode 152. In this refinement, the capacitors are used to extend the RAAMS process along the large distance by pulse igniting of the remote arc discharges between the cathode in a cathode chamber and each of the slave anodes positioned between the cathode in a cathode chamber and the master anode. It is appreciated that slave anodes can be also provided with additional independent power supplies; each of the slave anode power supply can be installed between the cathode 128 and the corresponding slave anode. The open circuit voltage of each secondary power supply connected either to the master anode or to the slave anode exceeds at least 1.2 times the open circuit voltage of the primary arc power supply 136.

Figure 5:
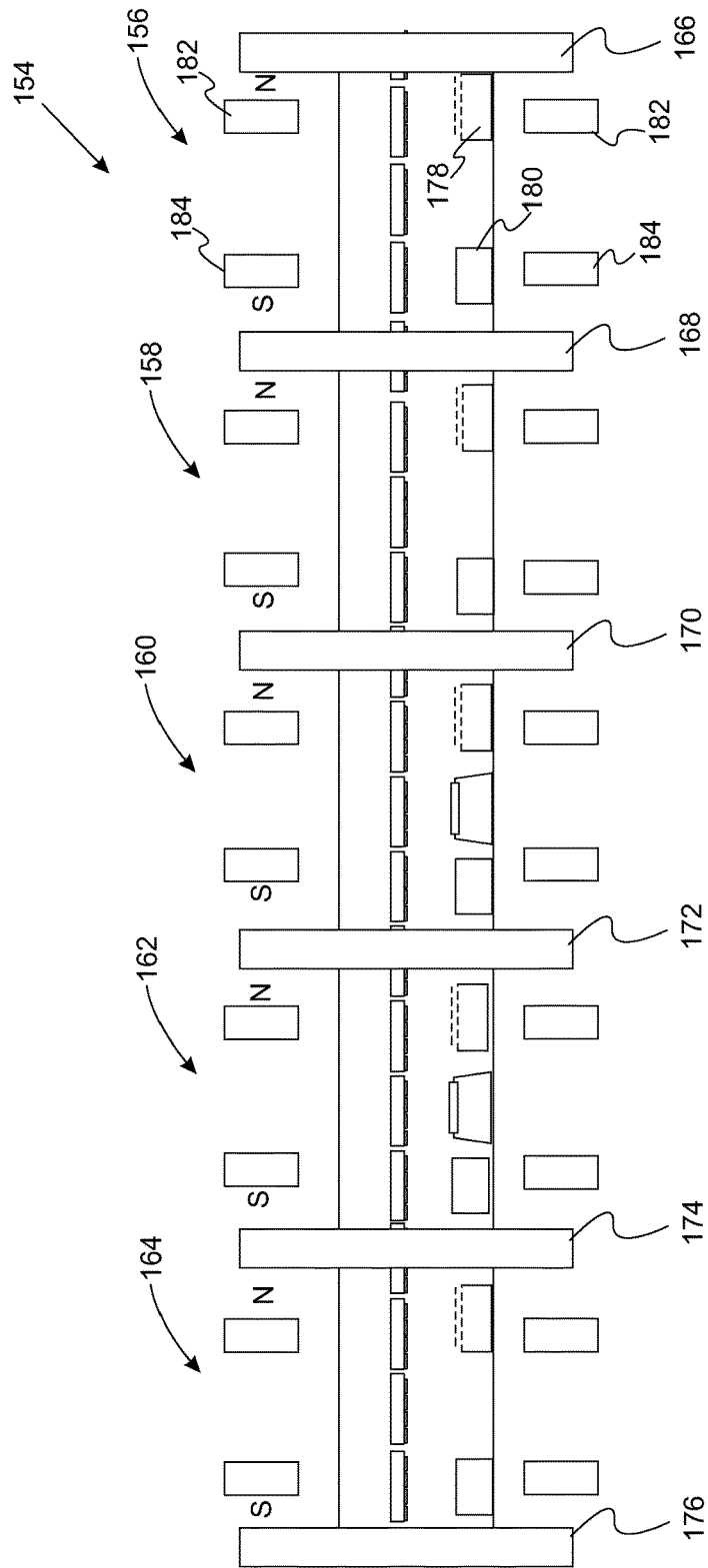
FIG. 5 provides a schematic illustration of an inline modular configuration of a RAAMS system.
Figure 6:
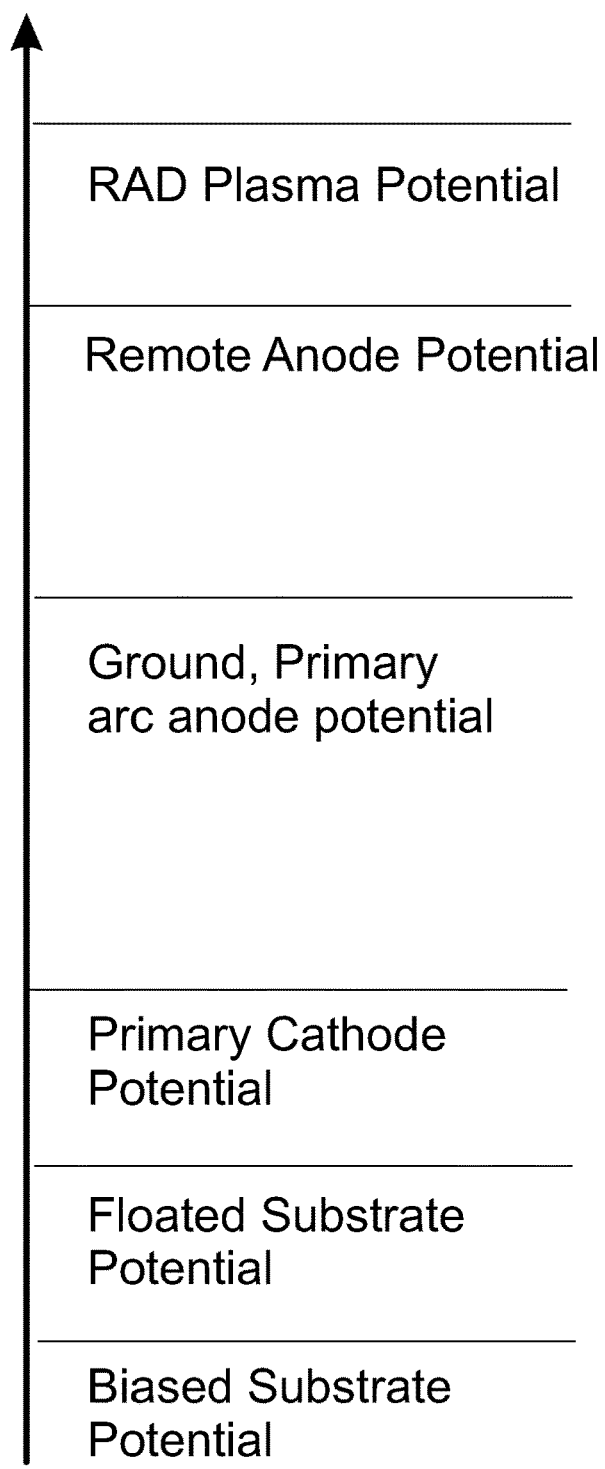
FIG. 6 provides a diagram of potential distribution in RAD plasma processing.

In still another variation of the invention, an inline modular configuration of the RAAMS setup is provided in FIG. 5. Such an inline system may include any number of deposition stations and/or surface treatment stations (e.g., plasma cleaning, ion implantation carburizing, nitriding, etc.). In the variation depicted in FIG. 5, coating system 154 includes modules 156-164 which are aligned inline. Modules 156-164 are separated from the neighboring module by load-lock gate valve 166-176. Modular RAAMS surface engineering system 154 includes module 156 which is a chamber-module having a shielded cathodic arc chamber 178 and a remote anode 180 positioned along one wall of the chamber as set forth above. An optional set of magnetic coils 182, 184 which create a longitudinal magnetic field ranging from 1 to 100 Gs along the coating chamber is also shown in this Figure. This module 156 performs the following operations: substrate loading; ion etching or ion cleaning of the substrates by high energy (typically E>200 eV) ion bombardment in an argon with a remote anode arc discharge (RAAD) plasma generated between the cathode in a shielded cathode chamber and a remote anode; and conditioning of the substrates to be coated by soft ion bombardment (typically E<200 eV) in an argon RAAD plasma generated between the cathode in a shielded cathode chamber and a remote anode. Second module 158 ionitrides the substrate surfaces to be coated in nitrogen or argon-nitrogen mix RAAD plasma generated between the cathode in a shielded cathode chamber and remote anode. The rate of plasma immersion ionitriding of HSS, M2 and 440C steel in the RAAD plasma immersion ionitriding process reaches 0.5 to 1 μm/min at pressures from 0.1 mtorr to 200 mtorr and a remote anode current ranging from 10 to 300 amps, but typically within the pressure range 0.2-100 mtorr and remote anode range from 10 to 200 amps. The RAAD plasma immersion ionitriding is a low temperature treatment where substrate temperature typically does not exceed 350° C. In this process, the substrates may be floating, grounded or biased at very low negative bias voltages (e.g. below −100V). Ionitriding at such low bias voltages is due to the high positive RAAD plasma potential causing the plasma ions to receive excessive energy from the high plasma potential which exceeds the grounded substrate potential. Alternatively, a low energy ion implantation of such elements as nitrogen, phosphorus, silicon, carbon from the gaseous RAAD plasma can be also performed at relatively low substrate bias voltages typically ranging from −200 to −1500 volts. The diagram of potential distribution in RAAD plasma processing is illustrated in FIG. 6. In a typical RAAD plasma process, the primary cathode has potential ranging from −20 to −50 volts relative to the ground primary anode. In a refinement, the floating substrate potential ranges from −10 to −50 volts relative to the primary cathode. The biased substrate potential in ionitriding, carburizing and other ion diffusion saturation processes is typically from −10 to −200 V relative to the primary cathode, while in the RAAD plasma immersion low energy ion implantation process, the substrate bias is typically from −200 to −1500 volts.

It is appreciated that the modular chamber layout of FIG. 5 can also be used to perform remote anode arc plasma assisted CVD (RAACVD) processes in gaseous RAAD plasma chambers (for instance, modules 156, 158 and 164 in FIG. 5). For example, this low pressure plasma immersion CVD process setup can be used for deposition of polycrystalline diamond coatings in the plasma-creating gas atmosphere consisting of 0.1-1% methane and balance hydrogen or hydrogen-argon mix. RAAD plasma acts as a powerful activator of the reactive atmosphere with high density of atomic hydrogen and HC radicals which are contributing to formation of polycrystalline diamond coating. In this process the substrate to be coated can be either grounded, floating or biased to the negative potential not below −100 volts vs. the primary cathode. Independent radiation heater array can be used to maintain substrate temperature in the range from 200° C. to 1000° C. as necessary for the deposition of polycrystalline diamond coating in the plasma enhanced low pressure CVD processes.

Figure 7A:
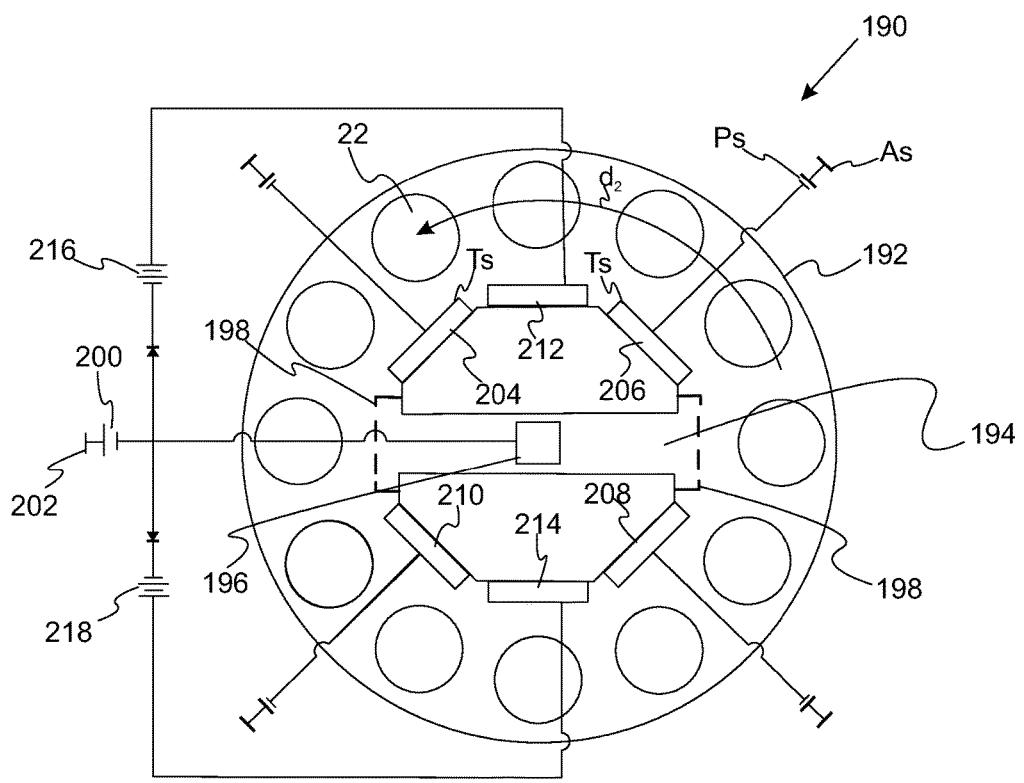
FIGS. 7A and 7B provide a schematic illustration of a batch coating system with a centrally located shielded cathode chamber.
Figure 7B:
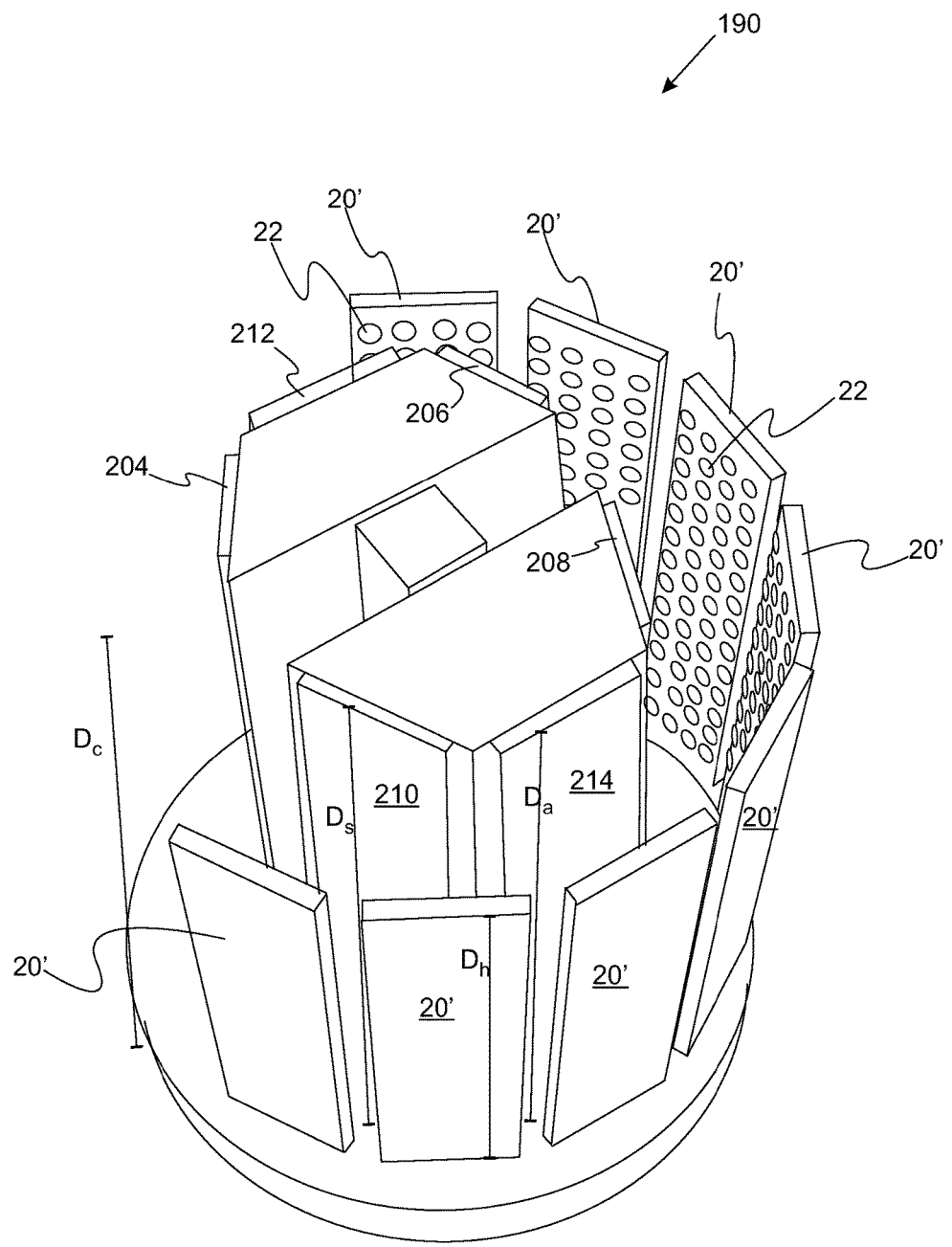

In another embodiment, a coating system having plasma sources aligned along curvilinear walls is provided. FIG. 7A provides a schematic top view of a batch coating system with a centrally located shielded cathode chamber. FIG. 7B provides a schematic perspective view of the batch coating system of FIG. 7A. Coating system 190 includes vacuum chamber 192, cathode chamber 194 which includes cathode 196, and shield 198. Vacuum chamber 192 has a substantially circular cross section. System 190 also includes primary power supply 170 which sets the voltage potential between cathode 196 and primary anode 202. System 190 also includes magnetron sputtering sources 204-210 each of which includes target Ts, power supply Ps, and anode As. In a refinement, magnetron sputtering sources 204-210 are arranged along a circle having the same center as the cross section of vacuum chamber 192. System 190 also includes remote anodes 212 and 214 which are set at a voltage potential relative to cathode 194 by power supplies 216 and 218. In this embodiment, substrates 22 move axially along a circular direction $d_2$ as they are coated. In each of the variations of FIGS. 7A and 7B, the plasma streams between cathode 196 and the remote anodes. This streaming is confined by the separation between the remote anode (or sputtering sources) and the substrates (i.e., top of the substrates) which is typically 2 to 20 inches. The confinement persist through the coating zone Moreover, the plasma is rastered along the cathode in a direction perpendicular to the movement of the substrates as set forth above with respect to FIG. 1D.

As set forth above, remote anodes 212 and 214 have a linear remote anode dimension $D_a$. Magnetron sputtering sources 204-210 have linear source dimension $D_s$. Cathode target 196 has a linear cathode target dimension $D_c$. Substrate holder 20 has a linear holder dimension $D_h$. In a refinement, the linear remote anode dimension $D_a$, the linear cathode target dimension $D_c$. and the linear holder dimension $D_h$ are parallel to each other. In another refinement, the linear remote anode dimension $D_a$ is greater than or equal to the linear cathode target dimension $D_c$ which is greater than or equal to the linear holder dimension $D_h$.

It is appreciated that an external magnetic field can be applied in a coating chamber for the embodiments set forth above to further enhance the plasma density during arc plasma enhanced magnetron sputtering coating deposition processes. The preferable magnetic field will have magnetic field lines aligned generally parallel to the cathodic arc chamber and/or remote anode. This will contribute to the increase of the arc discharge voltage and, consequently, to the electron energy and arc plasma propagation length along the coating chamber. For example, the external magnetic field can be applied along the coating chambers in the inline coating system shown in FIG. 5.

A uniform plasma density distribution in the coating chambers set forth above can be achieved by appropriately distributing both remote anodes and the electron emitting surface of the shielded vacuum arc cathode targets to evenly cover the coating deposition area. For example, if coating deposition area is 1 m high then both electron emitting surfaces of the shielded cathode target and electron current collecting remote anode surfaces have to be distributed to evenly cover this 1 m high coating deposition area. To achieve these requirements, several small cathode targets can be installed in a shielded cathode chamber, each of the cathode targets is connected to the negative pole of the independent power supply. The cathode targets are distributed generally evenly so the electron flows emitted by each of the cathode targets overlap outside the shielded cathode chamber providing a generally even distribution of electron density over the coating deposition area. The positive poles of the remote arc power supplies can be connected to one large anode plate having the height generally the same as a height of the coating deposition area and facing the substrate holder with substrates to be coated as shown in FIGS. 1 and 4-6. The set of anode plates, each connected to the positive pole of the remote arc power supplies, can be used to provide even distribution of electron density over the coating deposition area. Similarly, instead of using a set of small cathode targets in a shielded cathode chamber, a single large cathode target having a linear dimension similar to the linear dimension of the coating deposition area can be used as a cathode of remote arc discharge. In this case, electron emission spots (i.e., cathodic arc spots) are rastered over the cathode target to provide a generally even distribution of electron emission current over the coating deposition area. The rastering of the cathodic arc spots over a large cathode target area can be achieved, for example, by magnetic steering of the cathodic arc spots over the arc evaporating area of the cathode target or by mechanical movement.

Figure 8A:
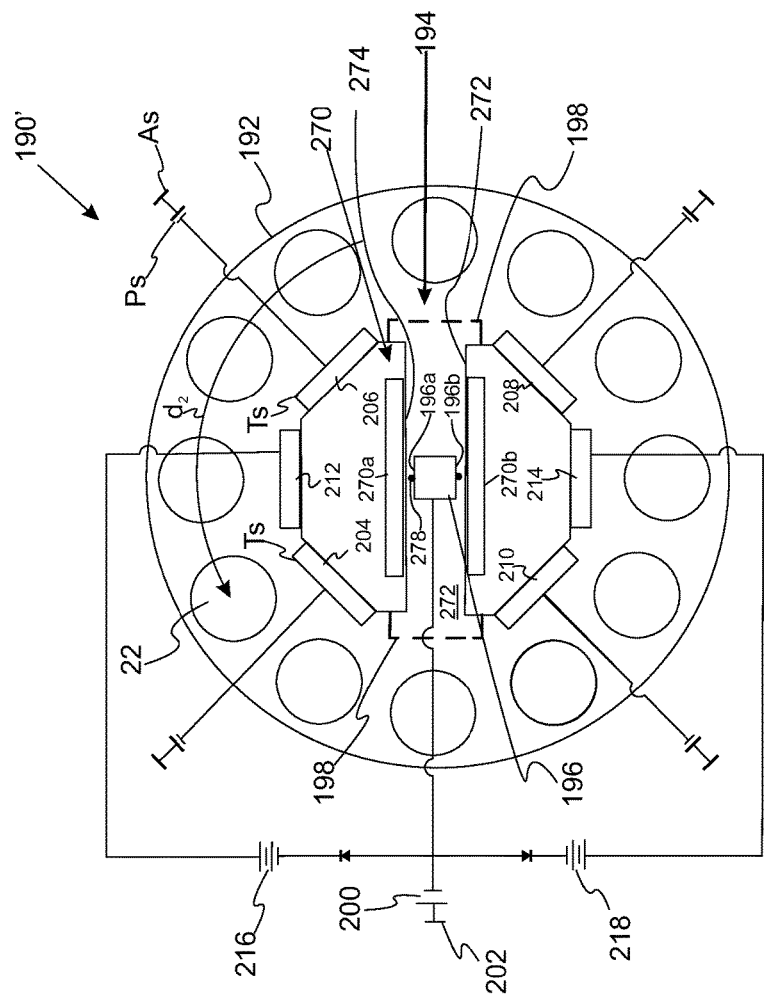
FIG. 8A is a schematic illustration of a variation of the system of FIGS. 7A and 7B.

With reference to FIGS. 8A-8H, schematic illustrations depicting a refinement of coating system of FIGS. 7A and 7B which uses a magnetically steered cathodic arc spot is provided. The present variation incorporates features from U.S. Pat. No. 6,350,356, the entire disclosure of which is hereby incorporated by reference. Referring to FIG. 8A, system 190' includes duct magnetic coil 270 surrounding plasma duct 272 which is formed within cathode chamber 194 between the two opposite sides of the housing 274. Coil 270 includes winding 270a facing side 196a of the cathode target 196 and an opposite winding 270b facing side 196b of the cathode target 196. Cathode target 196 is generally bar shaped with a long dimension $d_4$. Duct coil 270 generates a magnetic field along the duct 272 with magnetic force lines generally parallel to the sides 196a and 196b of the cathode target 196. When cathodic arc spot 278 is ignited on the evaporating surfaces 196a or 196b, arc spot 278 moves along a long side of the bar-cathode 196. At the end of the bar, arc spot 278 switches sides and continues its movement in the opposite direction at the opposite side of the bar. Isolation ceramic plates (not shown) attached to the sides of the cathode bar perpendicular to the magnetic force lines prevent the arc spot escaping from the evaporating surface of the cathode 196. Shields 198 are optionally installed at the ends of the plasma duct 272 facing the coating area in the coating chamber 192. In a refinement, shields 198 are movable to permit opening and closing the plasma duct 272 depending on the stage of the coating process. When shields 198 are closed the RAAMS process can be conducted with enhance ionization of the magnetron sputtering environment by the RAAD plasma. When the ends of the duct 272 are opened, the cathodic arc plasma flows along the magnetic force lines generated by duct coil 270 toward substrates 22 to be coated which results in deposition of cathodic arc coatings from the cathodic arc metal vapor plasma which is magnetically filtered from undesirable neutral metal atoms and macroparticles. The filtered cathodic arc coating deposition may be conducted as a single process phase or in conjunction with magnetron sputtering by the magnetron sputtering sources 204-210. The ionization and activation of the plasma environment by the remote arc discharge established between the cathode 196 in the cathode chamber 194 and the remote anodes 210, 214 improves the density, smoothness and other physic-chemical and functional properties of the coatings.

Figure 8B:
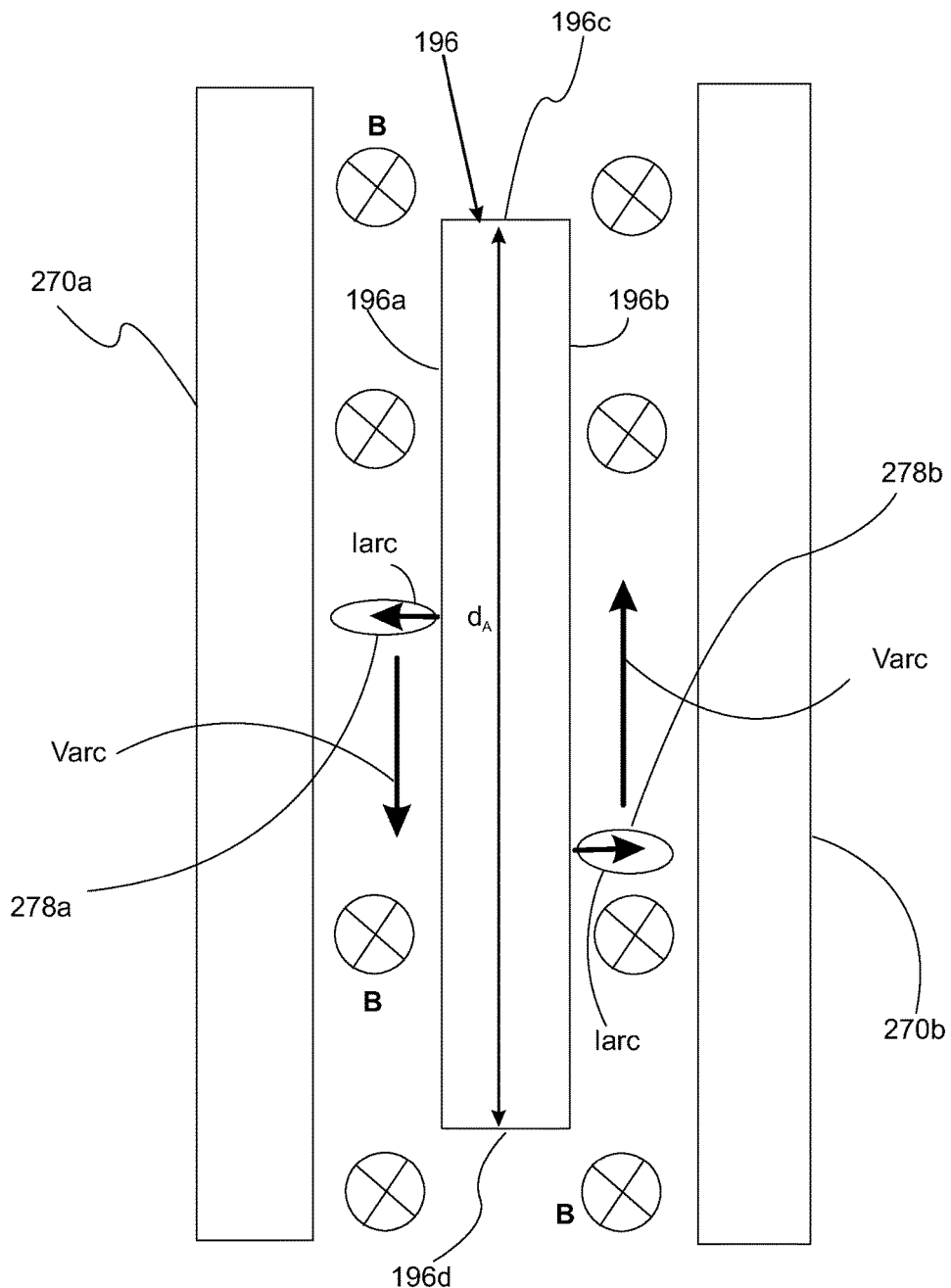
FIG. 8B is a schematic illustration of a variation of the system of FIGS. 7A and 7B.
Figure 8C:
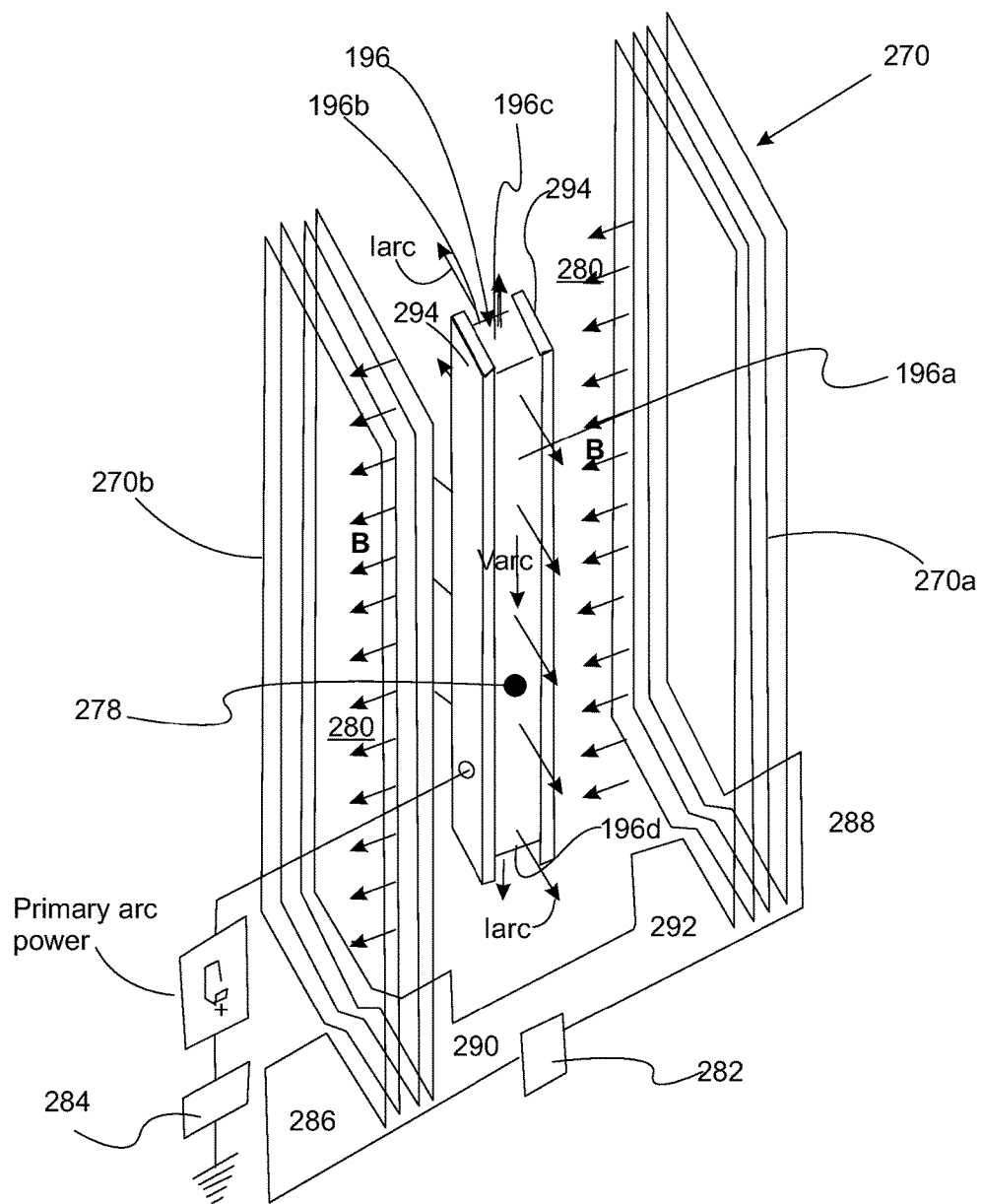
FIG. 8C is a schematic illustration of a variation of the system of FIGS. 7A and 7B.

Referring to FIGS. 8B and 8C, schematic illustrations depicting the mechanism of magnetic steering of the cathodic arc spots around an elongated rectangular bar cathode are provided. Rectangular bar-shaped cathode 196 is positioned between two portions of duct coil windings 270. Left winding 270a and right winding 270b face the evaporating sides of the cathode 196. Cathode side 196a faces duct coil winding side 270a while cathode side 196b faces duct coil winding side 270b. The magnetic field B generated by the duct coil windings 270 is parallel to the sides of the cathode 196 facing the duct coil winding and at the same time is perpendicular to the axis $d_A$ of the elongated cathode 196 (i.e. the long sides of the cathode target 196). When cathodic arc spot 278 is ignited on a side of the cathode 196 facing the duct coil winding arc, current $I_{arc}$ is generated perpendicular to the surface of the cathode target 196 and, therefore, perpendicular to the magnetic force lines B generated by duct coil 270. In this case, the cathode arc spot moves along the long side of the cathode with the average velocity $V_{arc}$, which is proportional to the Ampere force defined by a product of arc current $I_{arc}$ and magnetic field B, following the well-known Ampere law:

$$V_{arc} = (-/+) c * I_{arc} * B, \quad (1)$$

where c is a coefficient which is defined by the cathode material. The direction of the arc spot movement (the sign in the parenthesis in the above formulae) is also determined by the cathode target material since the magnetic field generated by the duct coil 270 is parallel to four sides of the cathode target (i.e., long in the same direction around the evaporative sides of cathode target 196). For example, when the cathode arc spot 278a is created on cathode side 196a facing the duct coil winding 270a, the arc spot moves down the cathode target 196 along the long side 196a. At the end of the cathode bar, the arc spots turn to the short side 196d followed by turning to the long side 196b and then continuing up along long side 196b, etc.

FIG. 8C depicts the arc spots moving along the evaporative sides 196a, 196b, 196c and 196d of the cathode target 196, which are parallel to the magnetic force lines 280 generated by the duct coil 270. The duct coil is energized by the duct coil power supply 282 while arc power supply 284 is connected to the cathode target 196. The duct coil includes coils 270a and 270b connected by an electric circuit including current conductors 286, 288, 290 and 290. The sides of the cathode target 196 perpendicular to the magnetic force lines are covered by the isolation plates 294 which prevent arc spots from escaping the evaporative surface of cathode target 196. Cathodic arc plasma is trapped by the magnetic force 280 generated by the duct coils 270a and 270b which prevent plasma diffusion across magnetic force lines 280, while plasma can freely move along the magnetic force lines 280.

Figure 8D:
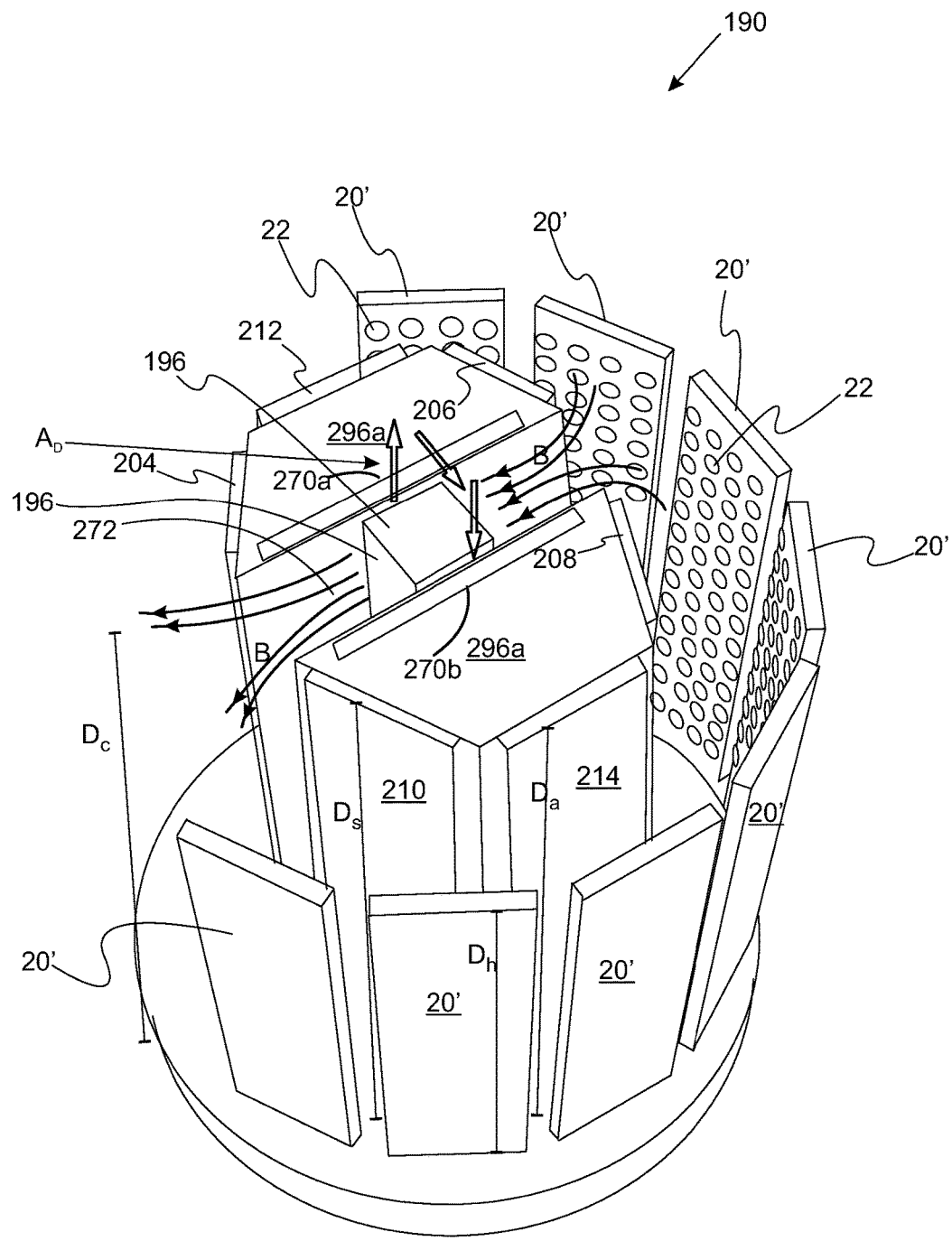
FIG. 8D is a schematic illustration of a variation of the system of FIGS. 7A and 7B.

FIG. 8D provides additional details regarding the steering of cathodic spots by the duct coil. The magnetic field generated by the duct coil 270 steers the cathodic arc spots along the sides of the cathode target bar 196 parallel to the magnetic field force lines as set forth above. The direction of the movement of the cathodic arc spots is shown by the arrows $A_D$. The ends of the plasma duct 272 are opened which allows the cathodic metal vapor plasma to flow along magnetic force lines toward substrates 22 installed on substrate holder 20 in the coating chamber. The neutrals and macroparticles are trapped within the cathode chamber on the inner walls of the duct 272 yielding near 100% ionized metal vapor plasma to enter in the coating area outside of the plasma duct 272. This design of the cathode chamber is essentially that of a filtered cathodic arc metal vapor plasma source capable of getting rid of macroparticles and neutrals in the outcoming metal vapor plasma and yielding nearly 100% atomically clean ionized metal vapor for deposition of advanced coatings. The RAAD plasma established between the cathode 196 and the remote anodes 212, 214 enhances ionization and activation of the plasma environment in the RAAMS coating deposition process, resulting in improved coating properties. In this design, the hybrid coating deposition processes can be conducted as a single cathodic arc or magnetron coating deposition or as a hybrid process combining cathodic arc metal vapor plasma with magnetron metal sputtering flow immersed in a highly ionized remote arc plasma environment.

Still referring to FIG. 8D, the issue of arc plasma enhancement of large area magnetron sputtering coating deposition process and hybrid processes is addressed by positioning at least one remote arc anode off line-in-sight with the cathode target bar 196. In this variation, at least one substrate 22 held by substrate holder 20' and magnetron sputtering sources 204-210 are positioned in a coating chamber region outside of the plasma duct 272. The present RAAMS process effectively immerses the metal sputtering flow generated by conventional magnetron sources in the dense and highly ionized remote anode arc discharge (RAAD) gaseous plasma. The remote arc power supply (not shown) which powers the RAAD plasma is installed between the arc cathode target 196 and the at least one remote anode 212. The remote anodes 212, 214 provide at least 20% higher open circuit voltage than the power supply which powers the primary arc discharge in a cathode chamber which is ignited between the arc cathode 196 and the proximate anode. The proximate anode can be an inner wall of the plasma duct enclosures 296a, 296b or, optionally, an independent anode electrode within plasma duct 272. In another refinement, several additional remote anodes, each of them associated with at least one arc cathode positioned within plasma duct 272, may be utilized. The remote anodes are positioned at strategic positions within the coating chamber between the end-openings of the plasma duct 272 off line-in-sight from cathode 196. The minimal distance between the end-openings of the plasma duct 272 and the remote anodes 212, 214 must be less than the plasma discharge breakdown distance when the voltage applied between the cathode and remote anode exceeds 1.2 to 10 times the voltage drop between the cathode and the primary (proximate) anode, which can be either electrically grounded or isolated.

Figure 8E:
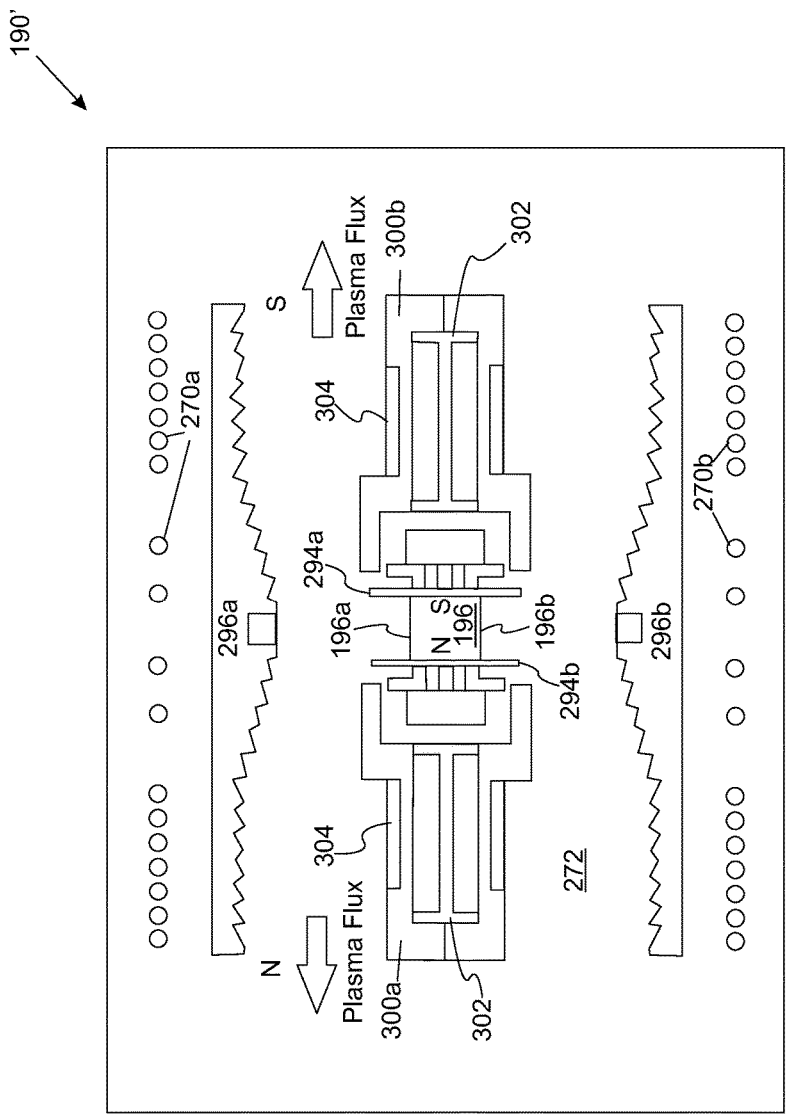
FIG. 8E is a schematic illustration of a variation of the system of FIGS. 7A and 7B.

FIG. 8E depicts a variation of the coating system of FIG. 8A-8D which utilizes a macroparticle filter are provided. The design of this variation incorporates the advanced macroparticles filter of U.S. Pat. No. 7,498,587 and EU Pat. Application No. EP 1 852 891 A2, the entire disclosures of which are hereby incorporated by reference. System 190' includes trimming coils 300a and 300b positioned adjacent to the opposite sides of the cathode target 196 and facing opposite sides of the plasma duct 272. The inner walls of the opposite ducts 296a and 296b are provided with grooves or, optionally with baffles for trapping macroparticles. Duct coil 272 surrounds duct 272 with winding portion 270a being parallel to the long side of the cathode target 196a while facing duct side 296a. Similarly, winding portion 270b is parallel to the long side of the cathode target 196b and faces duct side 296b. Trimming coils 300a, 300b include magnetic cores 302 which are surrounded by electromagnetic coils 304. The cathodic arc spots move along the evaporation sides 196a and 196b of the cathode target 196 under influence of the Ampere force according to the expression (1) set forth above. The sides of the cathode target 196 perpendicular to the plane of symmetry of the duct 272 are covered by ceramic isolation plates 294a and 294b to prevent arc spots from escaping the evaporating surface of the cathode target 196. The direction of the magnetic field generated by the trimming coils 300a, b coincides with the direction of the magnetic field generated by the duct coil 270. However, in the vicinity of the evaporating surfaces of the cathode target 196a or 196b, the magnetic force lines generated by trimming coils 300a, b are arch-shaped thereby allowing confinement of the cathodic arc spots within the evaporation area of the cathode target as require by the well-known acute angle rule (see for example, R. L. Boxman, D. M. Sanders, and P. J. Martin, *Handbook of Vacuum Arc Science and Technology*. Park Ridge, N.J.: Noyes Publications, 1995 pgs. 423-444).

Figure 8F:
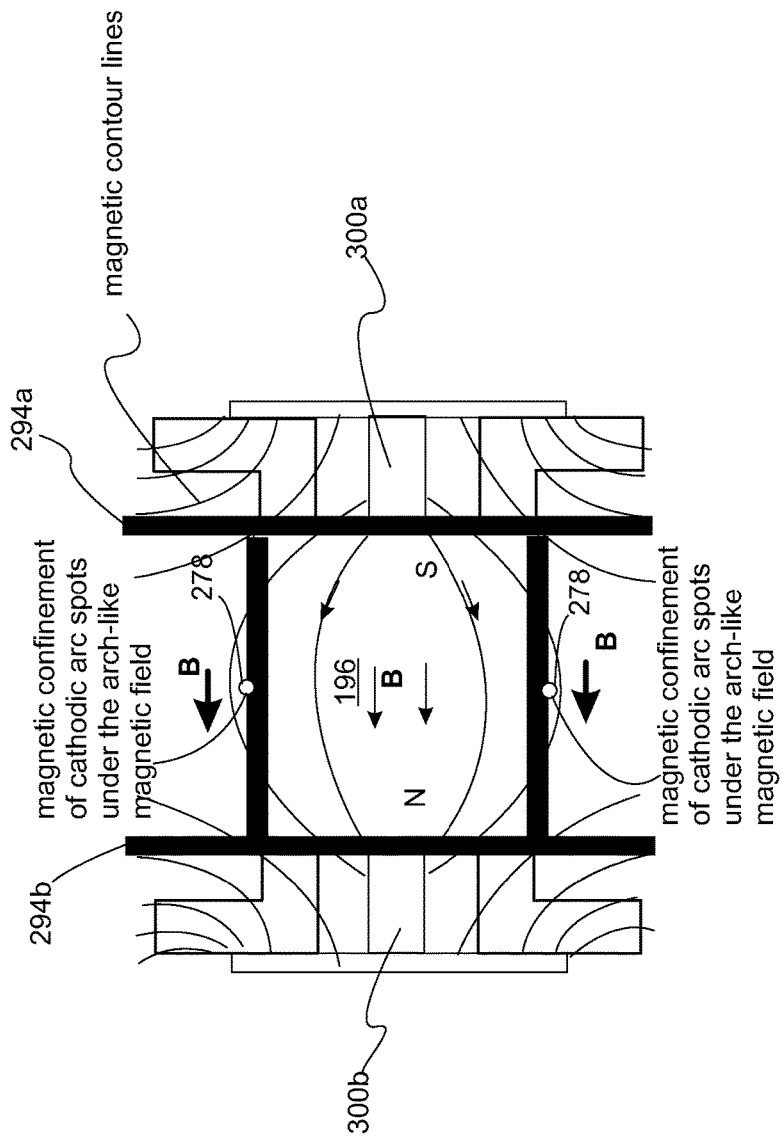
FIG. 8F is a schematic illustration of a variation of the system of FIGS. 7A and 7B.
Figure 8G:
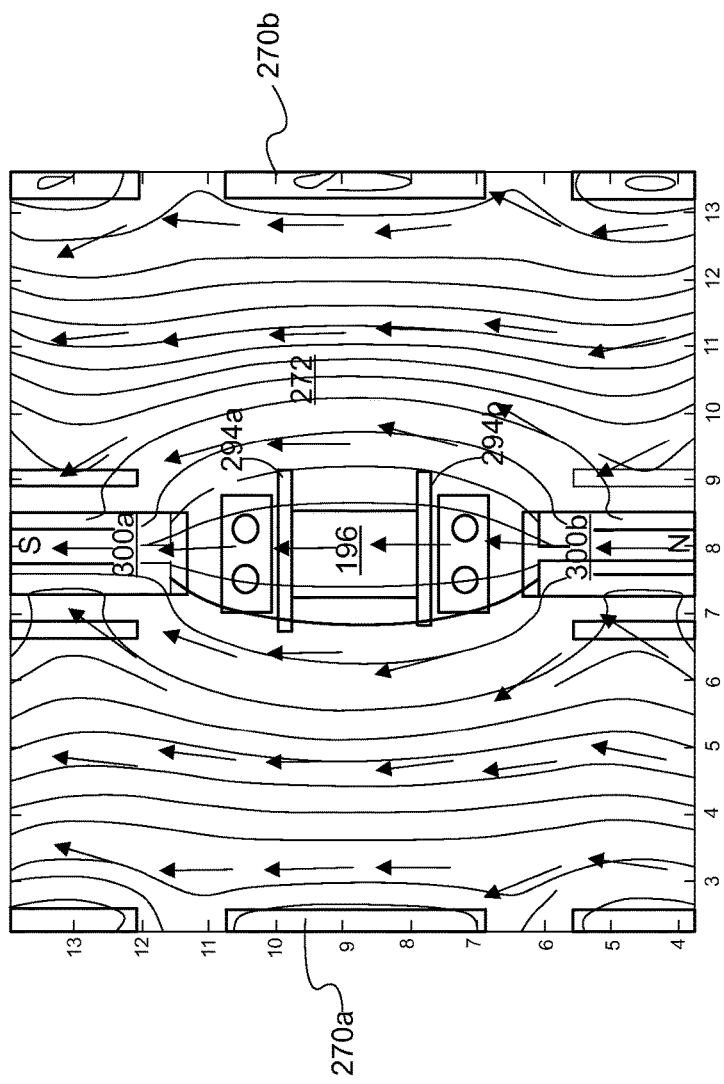
FIG. 8G is a schematic illustration providing magnetic contours for the systems of FIGS. 8A-8C.
Figure 8H:
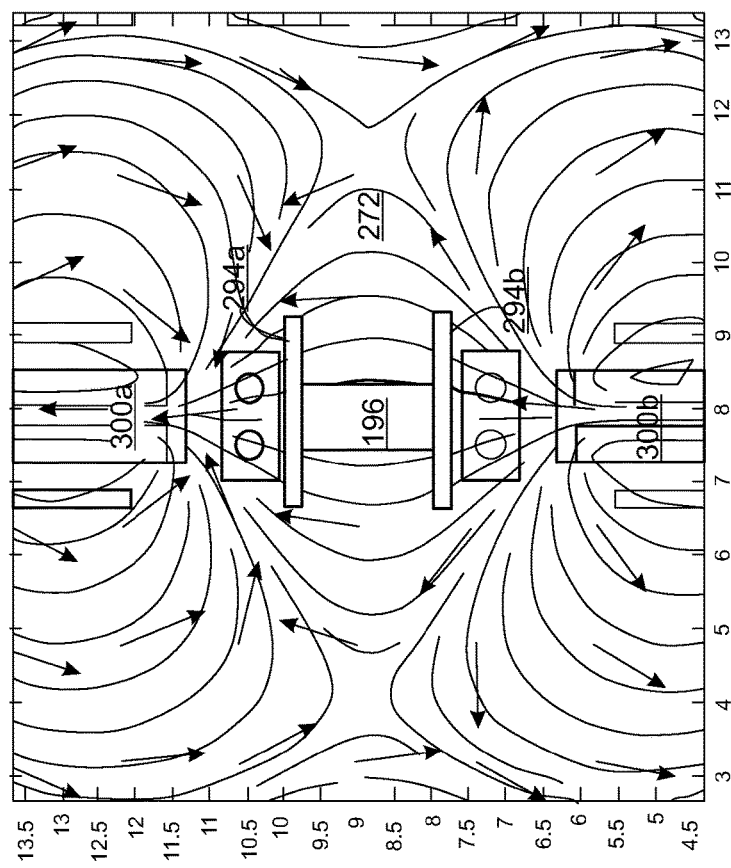
FIG. 8H is a schematic illustration providing magnetic contours for the systems of FIGS. 8A-8C.

FIGS. 8F, 8G and 8H provide schematics illustrating the mechanism of arc confinement by the magnetic field generated by the trimming coils 300a, b. Cathodic arc spots 278 are located under a top point of the arch-shaped magnetic force lines as required by the acute-angle rule of arc spot confinement. The magnetic field with the arch-shaped configuration above the evaporating surface of the cathode target 196 is generated between the South pole of the trimming coil 300a and the North pole of the trimming coil 300b on both sides of the cathode target 196 facing the duct 272. The configuration of the magnetic field within plasma duct 272 is evaluated using numerical calculation. The magnetic field with plasma duct 272, when both duct coil 270 and trimming coils 300 are turned ON, generates a magnetic field in the same direction is shown in FIG. 8G. This figure demonstrates that the magnetic force lines are directed in the same direction while still having an arch-shaped configuration in the vicinity of the evaporation surface of the cathode target 196. In this mode, the cathodic arc plasma magnetically filtered from the neutral metal atoms and macroparticles flows along the magnetic force lines away from the plasma duct 272 toward substrates to be coated (not shown) in the coating area of the coating chamber outside of the plasma duct 272. In this filtered cathodic arc deposition mode, the nearly 100% ionized metal vapor plasma with little, if any, neutral metal atoms or macroparticles is deposited onto substrates thereby creating defect-free coatings with superior properties. The magnetron sputtering coatings can also be deposited during this mode of operation by the magnetrons positioned on the outer walls of the plasma duct 272. Additional ionization and activation of the coating deposition plasma environment during this mode of operation is provided by the remote arc discharge established between cathode 196 and remote anodes 212, 214 positioned next to the magnetrons on the outer wall of the plasma duct 272 or, alternatively, on the inner wall of the coating chamber opposite to the magnetron sources (not shown). Referring to FIG. 8H, the magnetic field force lines are shown to switch directions within the plasma duct when duct coil 270 is turned "OFF". However, when both trimming coils 300a, b are turned "ON" an arch-shaped magnetic field is generated above the evaporative surface of cathode target 196. Depending on the operating mode, the deflecting magnetic field generated by deflecting duct coil 270 can be turned "ON" or "OFF". When the magnetic field of the deflecting duct coil 270 is turned "ON", the metal vapor plasma generated by the cathode target 196 is transported bi-directionally throughout the plasma duct 272 towards substrates 20. When the deflecting duct coil 270 is turned "OFF", the metal vapor plasma generated by the cathode target 196 does not transport towards substrates 20, although the cathode arc spots continue their movement around the target bar 196 driven by the steering magnetic field generated by trim coils 300a, b. In this variation, the duct coil works as a magnetic shutter eliminating the need in a mechanical shutter or shield as shown in FIG. 7A. When the magnetic shutter is "ON," the metal vapor is transported through the plasma duct toward substrates 20 in the processing chamber. When the magnetic shutter is "OFF", the magnetic shutter is closed and metal vapor does not reach substrates 20. FIG. 7H shows the distribution of the magnetic field in plasma duct 272 is zero when the current of the duct coil is set to zero and the trim coils current set to 0.1 amperes and duct coil current is zero. It can be seen that when the magnetic field of duct coil 270 is zero, there is no magnetic field to transport metal vapor plasma away from the plasma duct 272, although trim coils 300a, 300b still generate a magnetic field with an arch-shaped geometry that is sufficient both for confinement of the arc spots 278 within evaporating area of the target 196 (magnetic arch configuration at the evaporating target surface) and for steering the arc spot movement around the cathode bar 196. In this latter operation mode, when cathodic arc metal vapor plasma is trapped within the plasma duct, the electrons still flow away from the plasma duct toward remote anodes positioned outside of the plasma duct 272 in the coating chamber. The resulting remote arc discharge is established between cathode 196 in the plasma duct 272 and the remote anodes (not shown) which can be positioned in the outer wall of the plasma duct 272 or in the wall of the coating chamber in a position opposite to the magnetron sources (not shown). The RAAD plasma enhances ionization and activation of the coating deposition processing environment in the coating chamber, resulting in deposition of advanced coatings with superior properties.

When the magnetic shutter is closed, cathode target 196 still generates a large electron current which can be extracted toward remote anodes to establish a remote arc assisted discharge plasma in the processing chamber. The RAAD plasma is characterized by high density, ranging from $10^{10}$-$10^{13}$ cm$^{-3}$, high electron temperature ranging from 3 to 20 eV, and high plasma potential which generally resembles the potential of the remote anode. An experimental study confirms that the magnetic shutter can seal the plasma duct 272 thereby preventing metal vapor plasma from reaching the substrates 20 when the magnetic shutter is closed. Cathode target bar 196 used in these experiments was made of stainless steel. The silicon wafers which are used as substrates 20 are installed on substrate holding shafts of the round table substrate holder which is rotated at 5 RPM during 2 hours of the coating deposition process. The current of trim coils 300 is set at 0.2 A while the duct coil 270 current is set to zero. The argon pressure is 1.5 mtorr while the current of the primary arc is 140 amperes. After a two hour exposure, the substrates are unloaded and the coating thickness is measured by means of optical interferometry using Veeco NT3300 Optical Profiler. The results are presented in Table 1 below.

TABLE 1

| Measurement | Thickness (nm) Si chip | Thickness (nm) Si wafer |
| --- | --- | --- |
| 1 | 11 | 15 |
| 2 | 12 | 8.5 |
| Average | 11.5 | 11.75 |
| Combined Average | 11.625 | |

From the results presented in Table 1, it follows that the deposition rate on a rotating substrate holder does not exceed 6 nm/hr when the magnetic shutter is closed. The average coating thickness produced in a coating deposition process, either by filtered cathodic arc deposition or magnetron sputtering sources, typically exceeds 1 µm/hr. In this case, leakage of the metal vapor does not increase doping elements in a coating over the usual level of impurity of the cathode targets used in industrial coating deposition processes.

The following processes can be conducted in a remote arc assisted surface engineering (RAASE) chamber:

1. ion cleaning/etching in dense RAAD plasma (magnetic shutter is closed);

2. low temperature ion nitriding or oxi-nitriding, plasma carburizing. The temperature of substrates during this process can be as low as 150° C. The ionitriding rate of M2 steel in RAAD nitrogen plasma is typically ranging from 0.1 to 0.5 µm/min. (magnetic shutter is closed);

2. low energy ion implantation (the substrate bias below 2 kV) (magnetic shutter is closed);

3. deposition of filtered arc coatings (magnetic shutter is open;

4. deposition of magnetron sputtering coating by remote arc assisted magnetron sputtering (RAAMS) process (magnetic shutter is closed); and 5. deposition of magnetron sputtering coatings modulated by filtered arc coatings (magnetic shutter OFF/ON as per duty cycle to achieve a required coating modulation period).

With reference to FIG. 9A-E, schematics of a filtered arc assisted magnetron sputtering ("FAAMS") hybrid filtered arc-magnetron bi-directional system having additional magnetron sources are provided. In this variation, additional magnetron sputtering sources 310-316 are positioned adjacent to the arc cathode chamber 194 magnetically coupled with filtered arc source 196 and having the magnetron targets forming an open angle in the range from 10 degrees to 80 degrees. This opening angle Ao assists in focusing the magnetron sputtering flow toward the substrates. In this filtered arc assisted magnetron sputtering hybrid coating deposition process, the filtered arc metal plasma flows along the magnetic field lines of the transporting magnetic field created by the duct coil 270. Moreover, the magnetic field lines diverge at the exit of the plasma duct 272. This results in metal ions from the filtered arc cathode passing by the magnetron sputtering target area close to the target surface and crossing a magnetron discharge area with large close-loop magnetic field topology. A substantial portion of these metal ions are trapped in the magnetron magnetic field and contribute to the sputtering of the magnetron target, which can occur even without sputtering gas (argon or other noble gas) and within a broadened pressure range from $10^{-6}$ to $10^{-2}$ torr. Another portion of the metal ions generated by filtered arc cathodes continue towards substrates 22 where they mix with the focusing magnetron sputtering flow, providing an ionized metal fraction of the magnetron sputtering coating deposition process. It is well-known that increasing the ionization rate of the metal vapor improves coating adhesion, density, and other mechanical properties, and smoothness.

Figure 9A:
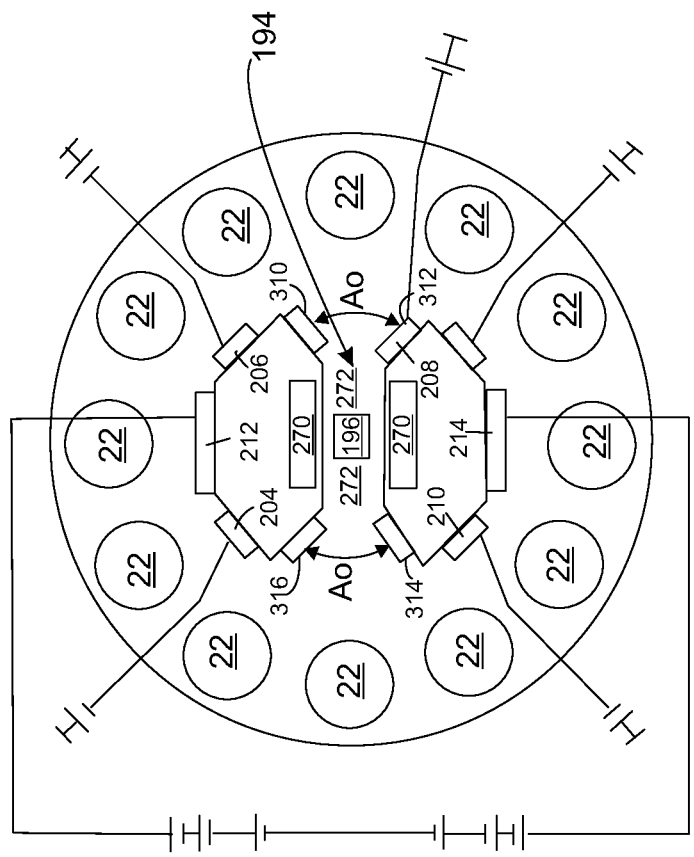
FIG. 9A is a schematic illustration of a coating system having additional magnetrons.
Figure 9B:
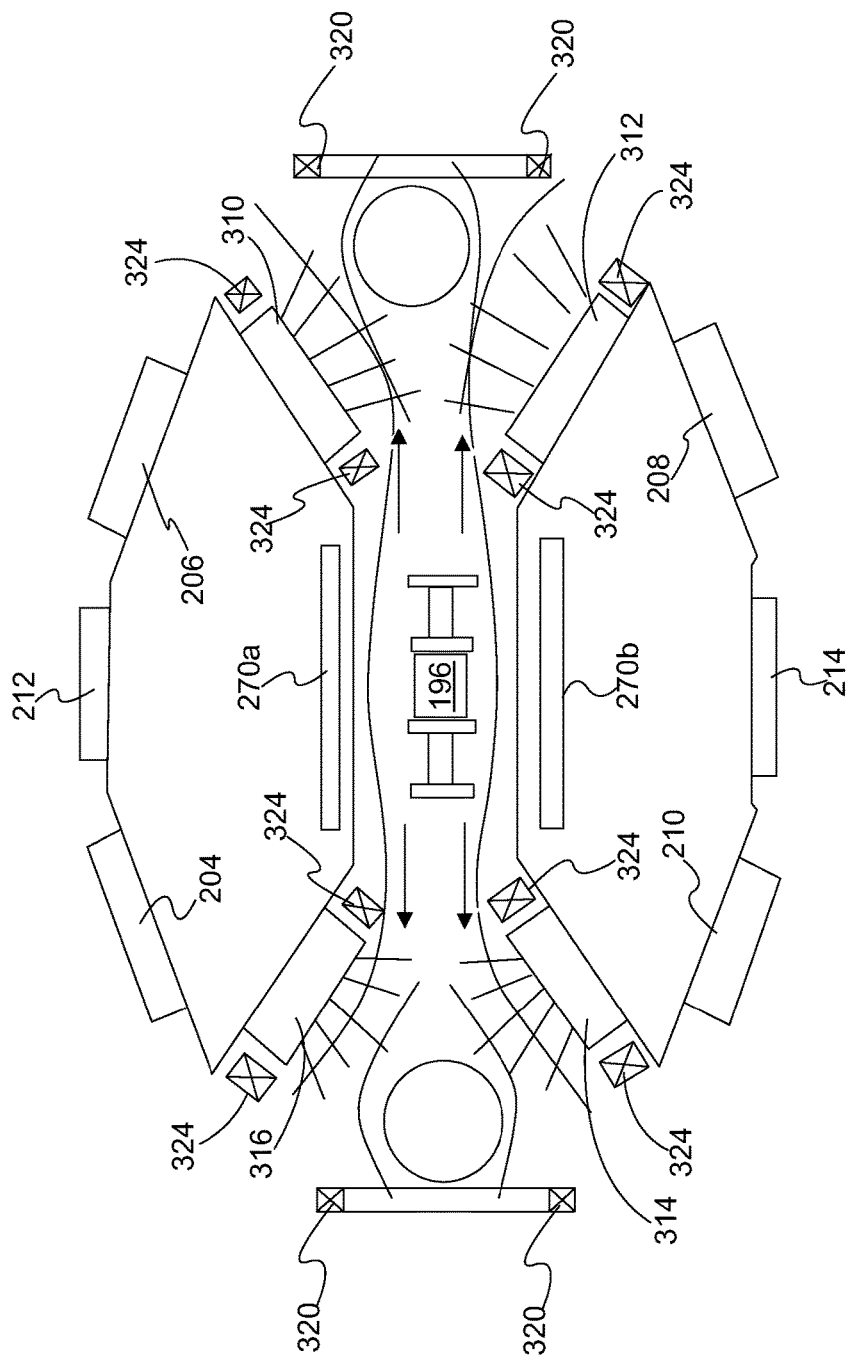
FIG. 9B is a schematic illustration of a coating system having additional magnetrons.
Figure 9C:
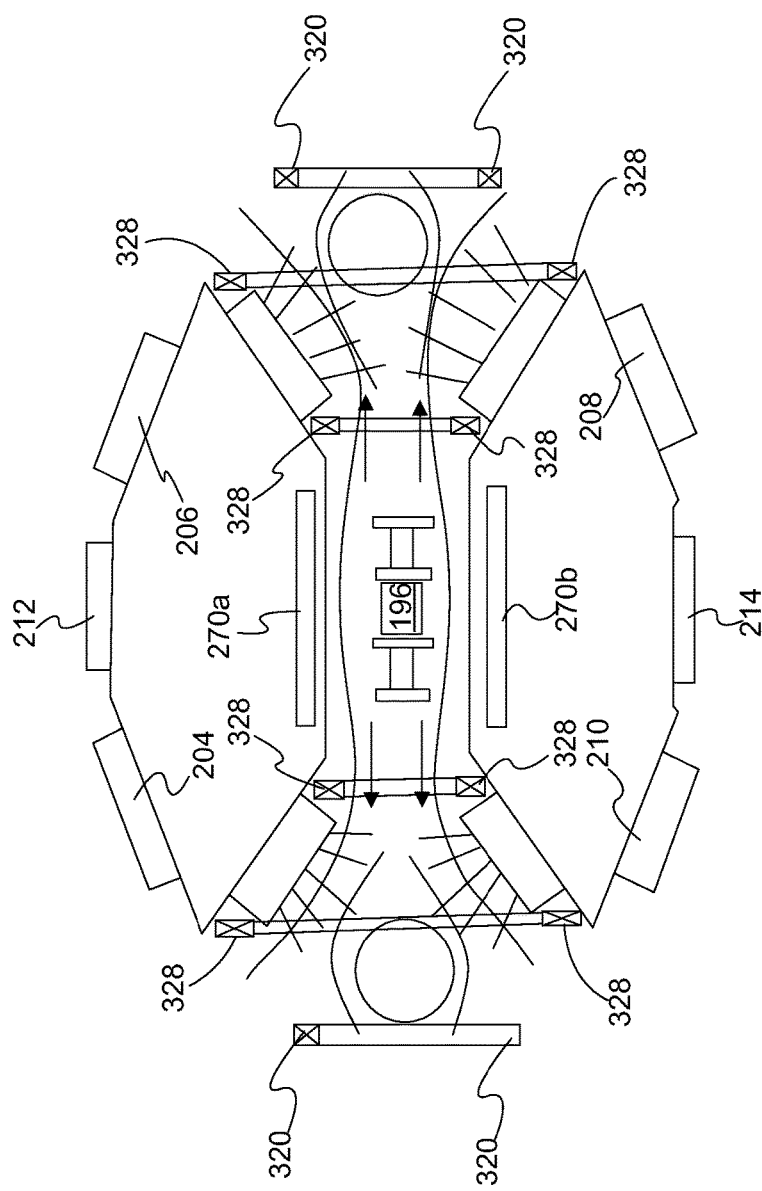
FIG. 9C is a schematic illustration of a coating system having additional magnetrons.
Figure 9D:
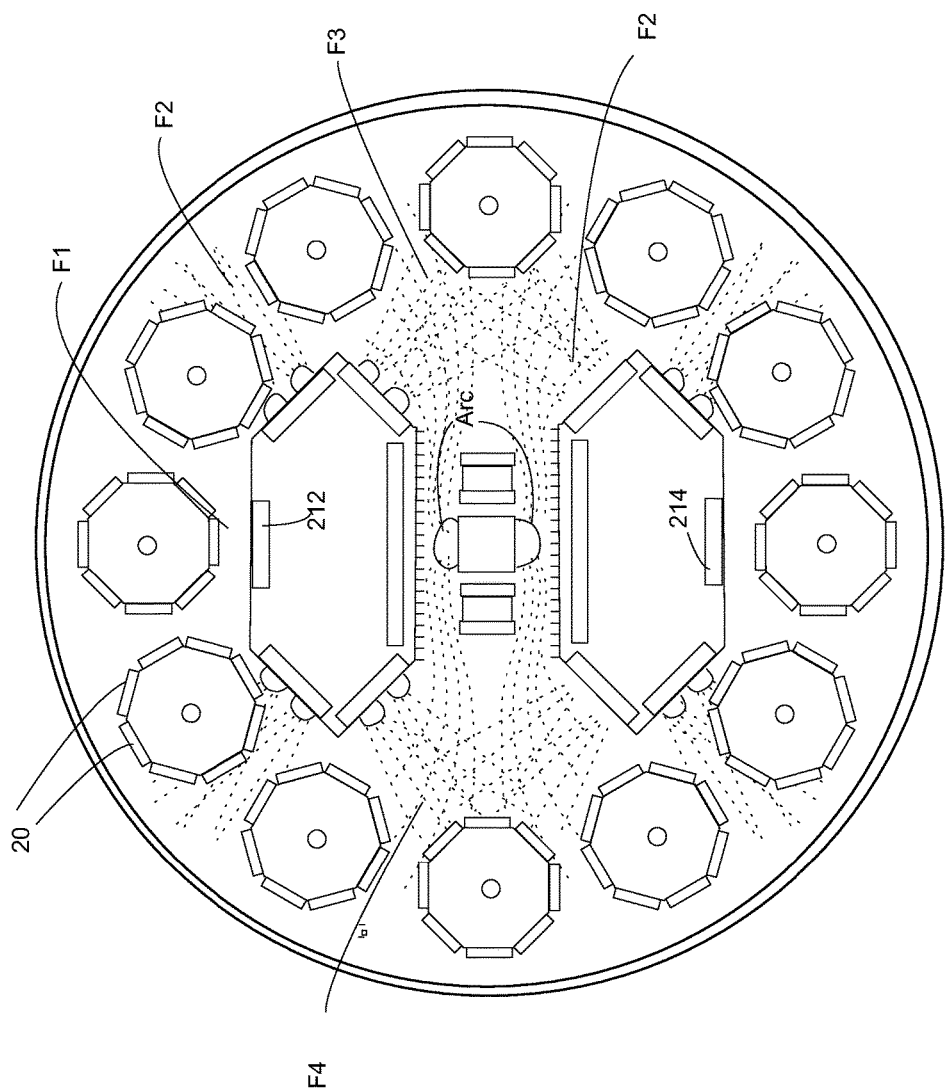
FIG. 9D is a schematic illustration of a coating system having additional magnetrons.
Figure 9E:
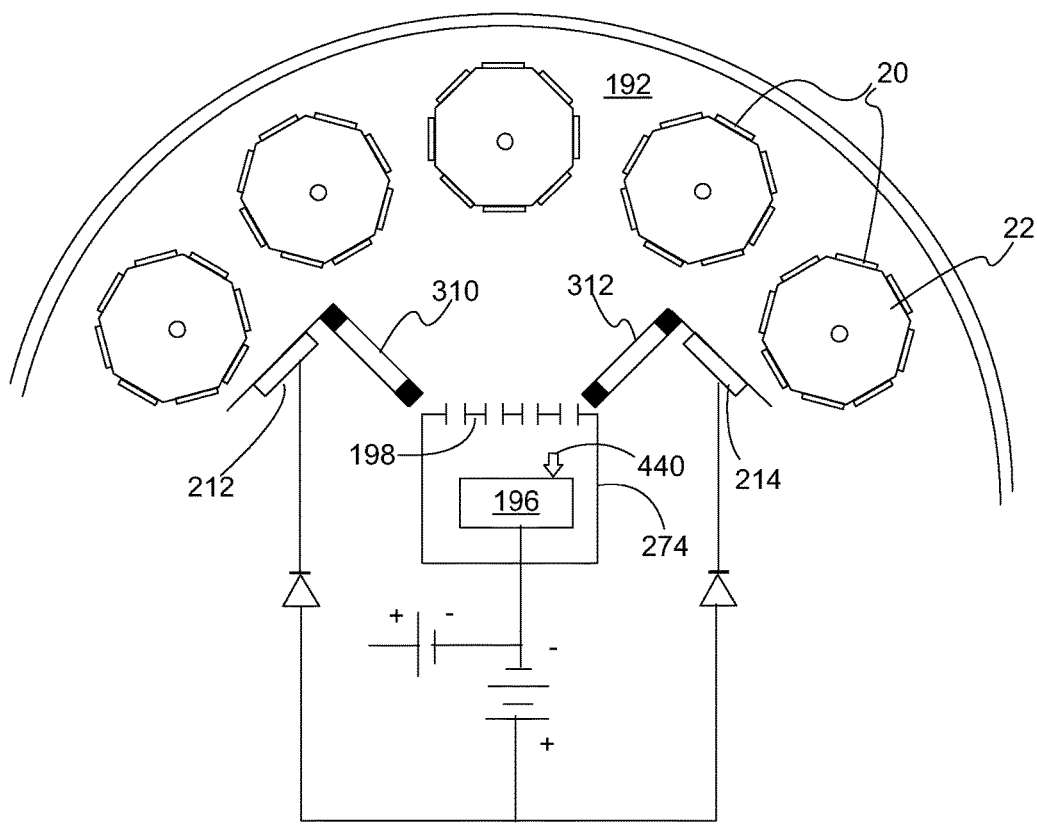
FIG. 9E is a schematic illustration of a coating system having additional magnetrons.

FIG. 9B provides additional features of the FAAMS hybrid filtered arc-magnetron bi-directional source. Optional additional focusing magnetic coils 320 are positioned opposite to the exit opening of the plasma duct which provides additional improvement of the plasma density and controls mixing of the magnetron sputtering flow with filtered arc metal plasma flow focusing toward substrates to be coated in a coating chamber (not shown). In addition, optional focusing magnetic coils 324 are positioned about magnetron targets 310-316 at the exit portion of the plasma duct 272. Focusing coils 324 improve the concentration of the plasma density near the magnetron targets. The direction of the magnetic force lines generated by these coils at the side adjacent to the duct coil have the same direction as the transporting magnetic field generated by the duct coil. FIG. 9C provides a schematic illustration of a refinement of the system of FIG. 9B. In this refinement, pairs of magnetic focusing coils 328 are positioned at the exit portion of the plasma duct surrounding the plasma duct on both sides of the magnetron sources. FIG. 9D provides a top cross section of the coating systems of FIGS. 9A-C, in which the remote arc plasma (F1), the magnetron sputtering flows (F2), and the filtered arc plasma stream (F3) are depicted. The direction of the magnetic field generated by these focusing coil coincide with the direction of the transporting magnetic field generated by the duct coil. FIG. 9E provides yet another variation of a coating system. FIG. 9E depicts a section coating chamber 192 outline with the rotating substrate holding turntable 22 with substrates to be coated 20. The cathode chamber 194 is positioned opposite to the substrates to be coated 20 in the coating chamber 192. The primary arc discharge in a cathode chamber 194 is ignited by the striker 440 on cathode target 196 which are enclosed within the housing 274. The housing 274 has a shield 198 with openings which are not transparent for heavy particles such as ions, atoms and macroparticles emitted from the surface of cathode target 196, but allow electrons to flow freely toward the remote anodes in the coating chamber 192. The magnetron targets 310, 312 are positioned adjacent to the cathode chamber shield 198 so that the sputtering flow emitted from the magnetron targets is coupled with highly ionized plasma in front of the shield 198 and focusing toward substrates 20 in the coating chamber 192. In this arrangement the cathodic portion of the remote arc plasma generating in front of the cathode shield 198 is coupled with magnetron sputtering flow resulting in substantial increase of ionization and activation of the metal-gaseous plasma generating by the magnetron targets 310, 312 which contributes to further improvement of coating adhesion, density, smoothness, reduction of the defects and improvement of their functional properties for different applications.

The FAAMS surface engineering system can operate in the following modes:

1. RAAD plasma immersion ion cleaning, ion nitriding, low energy ion implantation. In this mode the cathodic arc source is operating, both trim coils are ON, but the plasma transporting duct coil is OFF. Turning OFF the duct coil effectively prevents the metal plasma generated by the cathode positioned in a center of the plasma duct for reaching out of the plasma duct toward substrates to be coated in a coating chamber, but the gaseous dense and highly ionized RAAD plasma is filling the entire processing chamber including the interior of the plasma duct and the area in a chamber where substrates to be coated are positioned on the substrate holder. This dense gaseous plasma provides a highly ionized environment for plasma immersion ion cleaning, ion nitriding (as well as ion carburizing, oxi-carburizing, boronizing and other ion saturation processes) and low energy ion implantation. It can also be used for remote arc assisted CVD (RAACVD) processes, including deposition of a diamond-like carbon (DLC) coating when the hydrocarbon contained gaseous atmosphere is created in a coating chamber. In this mode, the remote arc plasma assisted CVD process can be conducted. Moreover, it is possible to deposit polycrystalline diamond coatings when substrates are heated to a deposition temperature ranging from 500 to 1000° C. (depending on type of substrate). In such a process, the gas pressure is typically ranging from 1 to 200 mTorr, the gas atmosphere typically includes 0.1-2% of methane in hydrogen at a hydrogen flowrate ranging from 50 to 200 sccm depending on pumping system capability with the balance being argon. The duct coil works as a magnetic shutter, effectively closing the way out of the metal plasma generated by the cathode in a plasma duct, while opening the way for the RAAD generated gaseous plasma.

2. When the duct coil is OFF (magnetic shutter is closed) and RAAD plasma is created within the coating chamber between the cathode in plasma duct and remote anode(s) in a coating deposition area outside of the plasma duct, the highly ionized plasma environment can be used for plasma assistant magnetron sputtering (RAAMS) processes. In this case, the magnetron sources positioned outside of the plasma duct in a coating area are turned ON and magnetron sputtering process is conducted in a highly ionized RAAD plasma environment. In this process, the productivity of the magnetron sputtering increases more than 30% and the coating is densified by the ion bombardment of the substrate surface by gaseous plasma-born ions.

3. When the plasma duct coil is ON, the magnetic shutter is open and metal plasma generated by the cathode in a plasma duct is flowing into the coating deposition area along the magnetic force lines of the transporting magnetic field generated by the duct coil. The filtered arc metal plasma can be used for deposition of the variety of coatings, including superhard hydrogen free tetrahedral amorphous carbon (ta-C) coating when graphite bar is used as a cathode target in a plasma duct. When magnetron sources positioned in the exit portion of the plasma duct and having their targets facing the substrates are turned ON, the hybrid filtered arc assisted magnetron sputtering (FAAMS) process starts. In this case, the filtered arc metal plasma which is 100% ionized is passing the magnetron sources mixing with the magnetron sputtering atomic metal flow which generally has a low ionization rate of <5%. The mixed filtered arc metal plasma and magnetron sputtering atomic metal flow is directed toward substrates in a coating area in front of the exit of the plasma duct, which provide hybrid filtered arc assisted magnetron sputtering coating deposition with high and controllable concentrations of the depositing metal atoms flow.

Figure 10:
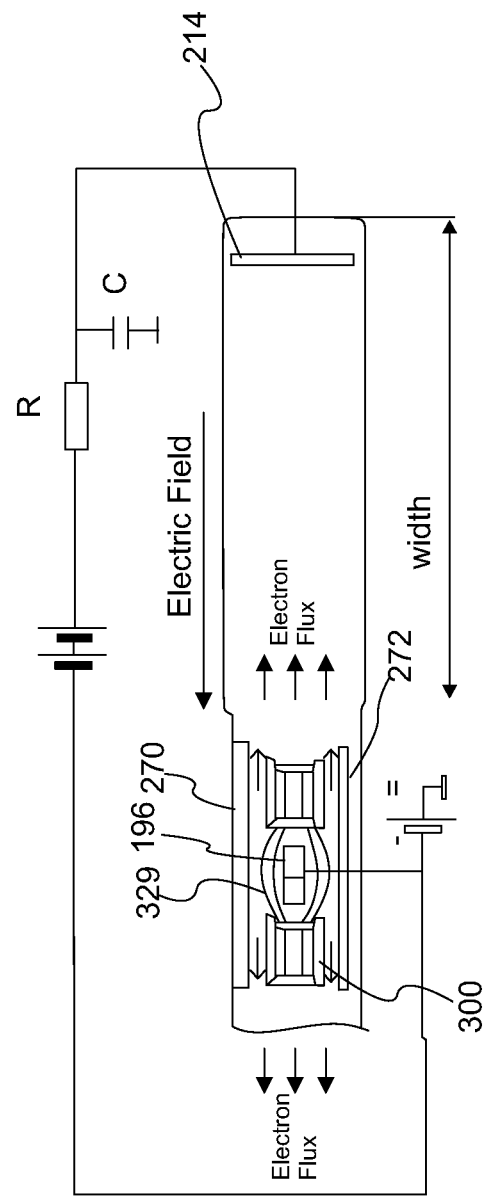
FIG. 10 provides a schematic description of the physical processes which are involved in the bi-directional remote arc discharge.

FIG. 10 provides a schematic description of the physical processes which are involved in the bi-directional remote arc discharge of the present invention. The primary arc is initiated by an arc igniter on a surface of cathode target 196 isolated from the discharge chamber by the pair of trimming coils 300. This source can work in two modes: first, in a coating deposition mode when the arc vapor plasma is transported along the magnetic force lines of the longitudinal magnetic field created by the duct coil 270 force; and second, in electron emission mode, when the duct coil is turned off and arc plasma is confined and magnetically isolated from the processing chamber by the magnetic field created by a pair of trimming coils 300. The plasma potential within the plasma duct 272 is low, close to the potential of the proximate anode, which is in most cases grounded, while in the remote arc discharge plasma the electric potential is high, close to the potential of the remote anode 214. The typical distribution of the plasma potential between the plasma duct 272 and the remote anode 214, obtained by finite element modeling is shown in FIG. 2.

Figure 11:
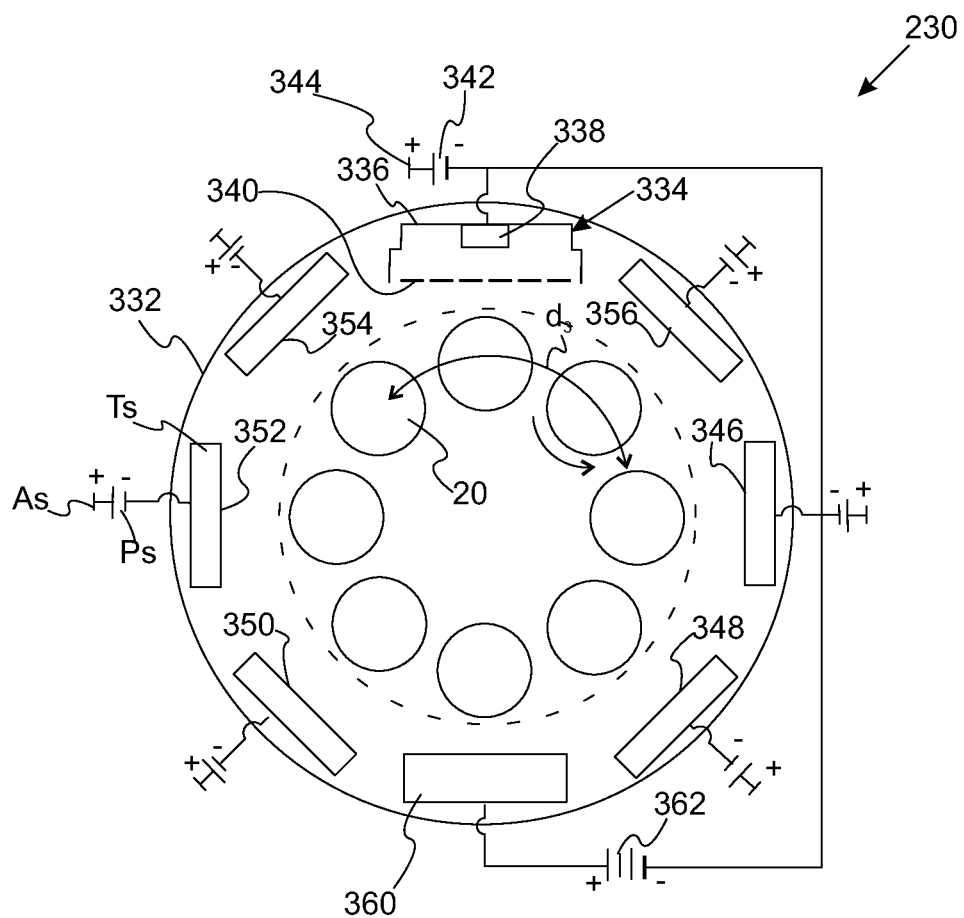
FIG. 11 provides a schematic of a batch coating system with a peripherally located shielded cathode chamber assembly.

With reference to FIG. 11, a schematic of a batch coating system with a peripherally located shielded cathode chamber assembly is provided. Coating system 330 includes vacuum chamber 332, cathode chamber assembly 334, which includes cathode chamber 336, cathode 338 and shield 340. System 330 also includes primary power supply 342 which sets the voltage potential between cathode 338 and primary anode 344. System 330 also includes magnetron sputtering sources 356-366 each of which includes target Ts, power supply Ps, and anode As. System 330 also includes remote anode 360 which is set at a voltage potential relative to cathode 338 by power supply 362. In this embodiment, substrates 22 move axially along direction $d_3$ as they are coated.

Figure 12:
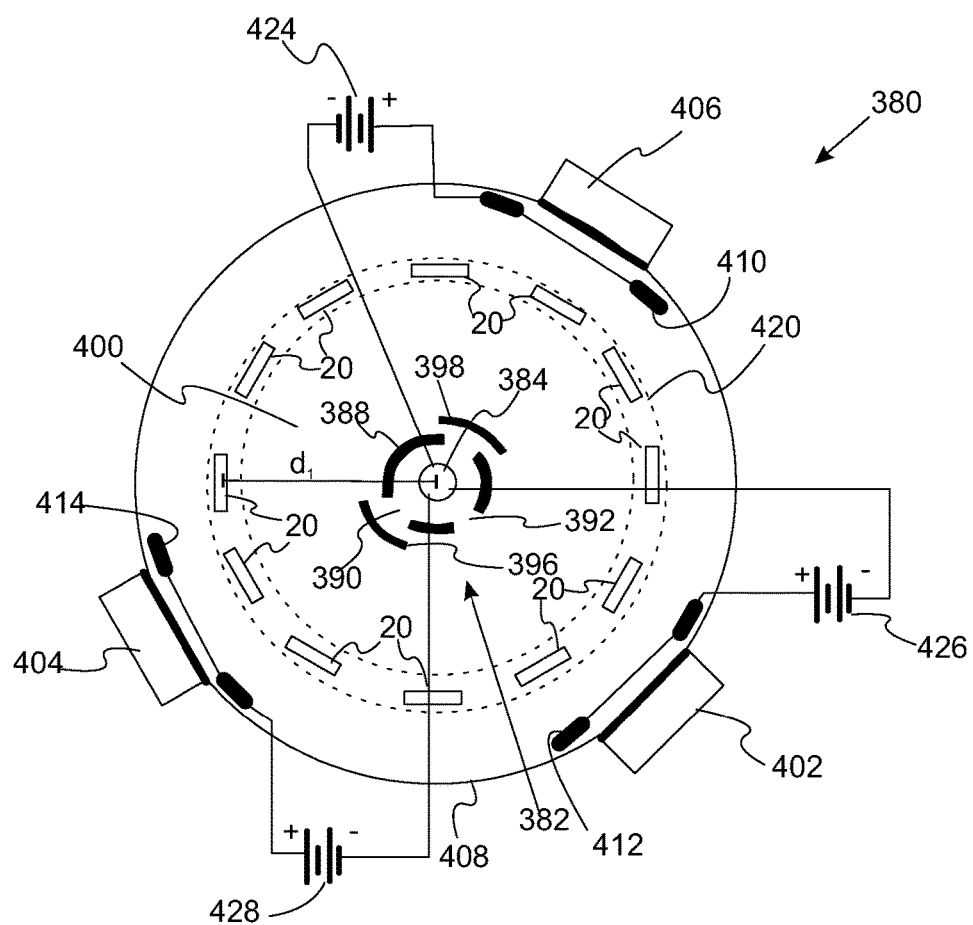
FIG. 12 is a schematic illustration of a further variation having a shielded cathodic arc electron emission source located in the center of the coating chamber.

FIG. 12 illustrates a further variation providing a shielded cathodic arc electron emission source located in the center of the coating chamber. In particular, the present variation provides a circular batch coating system 380 with cathode chamber assembly 382 located in its central area. The cathode 384 is positioned within the cathode chamber assembly 382 generally along the axes of the coating system 380. Cathode chamber assembly 382, respectively, include cathode enclosures 388 with openings 390 and 392 defined therein, cathode 384, optional primary anodes (not shown), and shields 396, 398. The enclosure 388 and shields 396, 398 respectively isolate cathode 384 from vacuum chamber 400 and can also serve as a primary anode for the arc discharge ignited in a cathode chamber 382. The primary arc power supply is also provided between the cathode 384 and the anode-enclosure 388 (not shown). The enclosure 388 and shields 396, 398 each define openings for transmitting electron emission currents into vacuum chamber 400, while at the same time serving as a barrier stopping the heavy particles such as metal vapor atoms, ions and macroparticles, emitted from the cathode 384 to reach substrates 20 to be coated in the coating chamber 400. The magnetron sputtering sources 402, 404, and 406 are attached to the wall 408 of the chamber 400. The remote anodes 410, 412 and 414 are positioned next to the corresponding magnetron sources, preferably surrounding these sputtering sources. The substrates 20 are positioned on rotary table platform 420 at the distance $d_1$ between the cathode chamber and magnetron sputtering targets. The distance from the magnetron target surface to the substrates 20 is typically ranging from 4 to 10 inches. The remote arc power supplies 424, 426, and 428 are installed between the remote anodes 410, 412 and 414 and the central cathode 384 in the cathode chamber 382. The cathode 384 can be a thermionic filament cathode, but preferably the cold evaporative vacuum arc cathode can be used, which is not sensitive to the reactive plasma processing environment which can contain chemically aggressive gases such as methane, oxygen and nitrogen for coating deposition of carbides, oxides and nitrides. Cathode 384 is either elongated thermionic filament or a cold cathode in a form of elongated metal bar or rod. Moreover, cathode 384 is positioned within the cathode chamber 382 along the axes of the coating chamber 400 with its electron emission zone length parallel and generally dimensionally equal to the height of the substrate 20 loading zone. Moreover, cathode 384 has a long dimension that is either less than or equal to the height of the remote anodes 310, 312 and 314. The heights of the magnetron targets are also either less than or equal to the height of the remote anodes.

In a refinement, the magnetrons 402, 404, 406 shown in FIG. 12, can be replaced with planar heaters. The substrates to be coated can be placed at the heater surface, facing the center of the chamber where the shielded cathode chamber 382 is positioned with the cathode 384. In this case the substrates can be heated to 900° C. while at the same time highly ionized remote anode arc plasma can be established in the chamber 380 by remote anode arc discharge between the cathode 384 in a cathode chamber 382 and the remote anodes 536, 538, 540 positioned at the wall of the chamber 380. In this process, when gas atmosphere in a chamber 380 is composed of a mixture of methane, hydrogen and argon at the pressure range from 1 mTorr to 200 mTorr and methane concentration in hydrogen ranging from 0.1 to 2 at. weight % the polycrystalline diamond coatings can be deposited on substrates positioned at the heated surface of the heaters, heated to the deposition temperature ranging from 700 to 1000° C.

Figure 13:
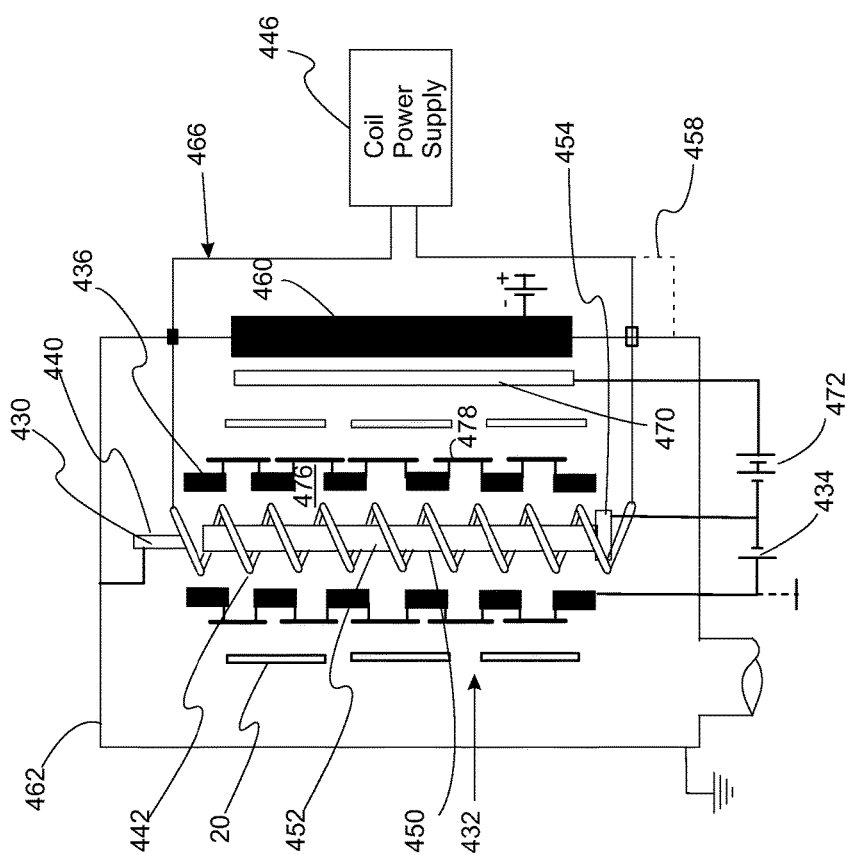
FIG. 13 provides a schematic illustrations of a system incorporating an electron emitting vacuum arc cold cathode source are provided.

With reference to FIG. 13, schematic illustrations of a system incorporating an electron emitting vacuum arc cold cathode source are provided. In particular, the present variation adopts the design of the electron emitting vacuum arc cold cathode source of the system of U.S. Pat. No. 5,269,898, the entire disclosure of which is hereby incorporated by reference. Rod-shaped cathode 430 is mounted within cathode chamber 432, which serves as a primary anode for the vacuum cathodic arc discharge powered by the primary arc power supply 434. Cathode 430 is connected to the negative output of an arc power supply 434, and the enclosure 436 of the cathode chamber 432 is connected to the positive output of arc power supply 434. The positive output of the primary arc can be optionally grounded as shown by the dashed line in FIG. 7D. An arc is struck repetitively by a striker 440, located at the end of cathode 430 that is opposite the connection to arc power supply 434. A helical electromagnet coil 442 is mounted coaxially with the cathode 430 and serves to generate a solenoidal magnetic field with flux lines substantially parallel to the cathode 430 axis, and having a magnitude proportional to the current furnished by a coil power supply 446. One or more substrates 20, upon which a coating is to be deposited, are disposed surrounding the cathode chamber 432 and optionally mounted on a substrate holding turntable platform (not shown) which will provide rotation of the substrates during deposition, if necessary, to achieve a uniform coating thickness distribution thereon. An arc spot 450 and a typical trajectory 452 thereof resulting from the influence of the applied magnetic field are also depicted. Arc spot travels all or part of the length of the cathode 430 toward the connection to arc power supply 434 before being re-struck. The insulator 454 prevents movement of the arc spot 450 off the desired evaporable surface of cathode 430. Electromagnet coil 442 may be electrically isolated from the arc circuit, or it may comprise a part of the anode by connection thereto as indicated by the dotted line 458. The electromagnetic coil 442 may alternatively serve as the sole primary anode for the primary arc discharge in the cathode chamber 432, in which case the electromagnetic coil 442 is isolated electrically from the chamber 430 and connected to the positive output of primary arc power supply 434, which is disconnected from the cathode chamber 432. One or more magnetron sputtering sources 460 are mounted along the walls 462 of the chamber 466 surrounded by the remote anodes 470. The remote anodes are connected to the positive output of the remote arc power supply 472, while its negative output is connected to the cathode 430 in the cathode chamber 432. The enclosure 436 of the cathode chamber 430 has openings 476 covered by shields 478 to prevent the heavy particles (ions, neutral atoms and macroparticles) emitted by the cathode 430 from reaching the deposition area outside of the cathode chamber 432, but the electrons are able to freely penetrate into the coating area throughout the openings 476 between the enclosure 436 and shields 478. The remote arc current is conducting between the cathode 430 within the cathode chamber 432 and remote anodes 470 surrounding the magnetron sputtering sources 460 at the wall of the coating chamber 466. The remote anode is connected to the positive output of the remote arc power supply 472, while the negative output of the remote arc power supply 472 is connected to the cathode 430 in the cathode chamber 432. The remote arc ionizes and activates the plasma environment during the magnetron sputtering coating deposition process, but can also serve as a source of ionization and creation of plasma environment in a coating area during preliminary ion cleaning of the substrates before the coating process starts, as well as for the plasma immersion ion implantation, ionitriding and plasma assisted low pressure CVD coating deposition processes.

Figure 14A:
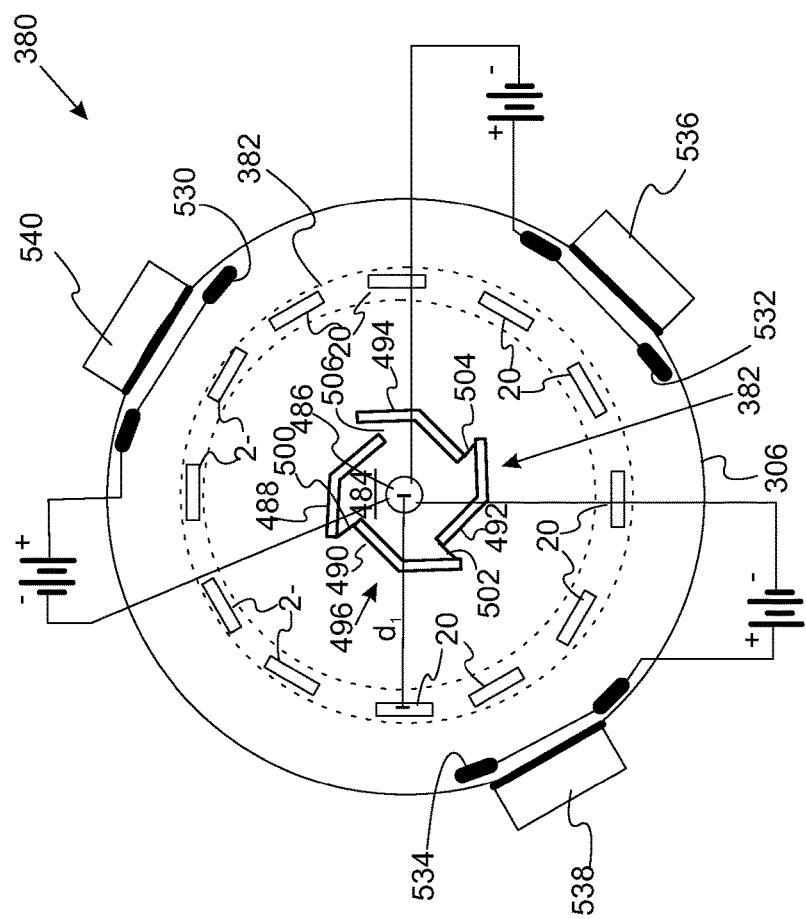
FIG. 14A provides a schematic illustration of a variation of a coating system incorporating a macroparticle filter.
Figure 14B:
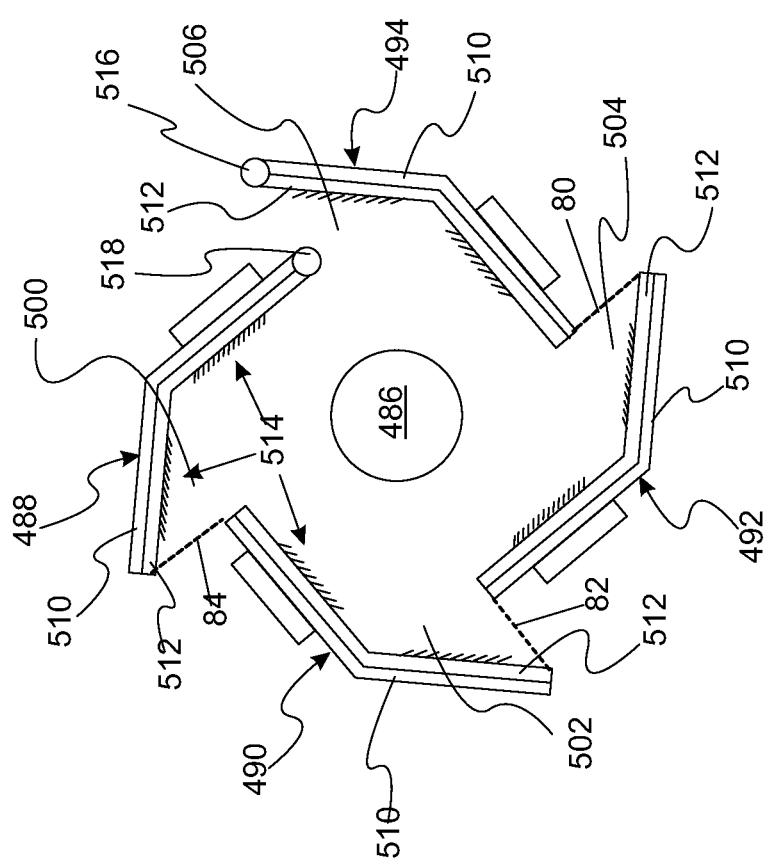
FIG. 14B provides a schematic illustration of a variation of a coating system incorporating a macroparticle filter.
Figure 14C:
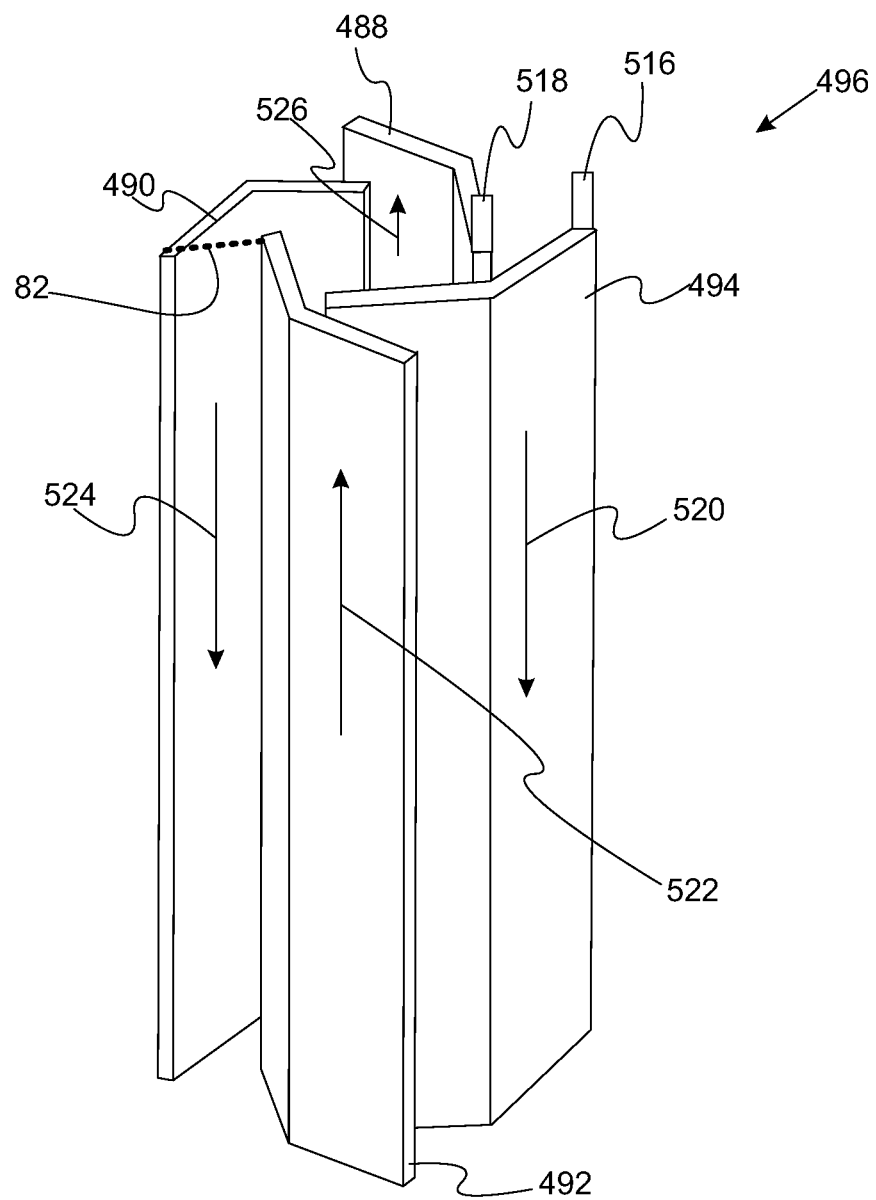
FIG. 14C provides a schematic illustration of a variation of a coating system incorporating a macroparticle filter.

With reference to FIGS. 14A-14C, a schematic illustrations of a variation of a coating system incorporating a macroparticle filter are provided. In this variation, the design of the cathode chamber of U.S. Pat. Application No. 2012/0199070 is adopted, the entire disclosure of this patent application is hereby incorporated by reference. System 480 includes cathode chamber 484 which is configured as a macroparticles filter. Cathode chamber 484 includes an even number of duct assemblies symmetrically positioned around elongated cathode 486. The variation set forth in FIGS. 14A and 14B includes four duct assemblies, i.e., duct assemblies 488, 490, 492, 494, which effectively form an enclosure 496 around the cathode 486. The duct assemblies 488, 490, 492, 494 define ducts 500, 502, 504, 506 through which positively charged ions are guided from cathode target 486 to substrates 20. Duct assemblies 488, 490, 492, 494 define a magnetic field for guiding a plasma. Duct assemblies each include support component 510 and baffle component 512 for blocking macroparticles. In a refinement, baffle component 512 includes protrusions 514 for enhancing the ability of filtering out macroparticles. Electrical posts 516, 518 are used to connect to the filter power supply so that the duct assemblies are electrically biased for repelling positively charged ions. When the duct assemblies 488, 490, 492, 494 are positively biased in relationship to the cathode 486 it is also serving as a primary anode for the primary arc discharge established within the cathode chamber 484. The duct assemblies 488, 490, 492, 494 can also be isolated and have a floating potential. In this case the arc steering electromagnetic coil (not shown) can serve as a primary anode to the cathode 486 for igniting the primary arc discharge in the cathode chamber 484 as was explained above in relation to the embodiment of the invention shown in FIG. 14B. With reference to FIG. 14C a schematic perspective view of a cathode chamber enclosure-filter assembly 496 is provided. Filter assembly-cathode chamber enclosure 496 is made of a set of duct assemblies 488, 490, 492, 494, which are parallel to the cathode 486, preferably having a shape of a rod but which can also be made as a bar with any polygonal cross-section. During the filtered cathodic arc coating deposition process the filter is electrically activated by passing a current along the duct assemblies 488, 490, 492, 494 to establish a magnetic field.

Still referring to FIGS. 14A-14C, a magnetic field is optionally created by passing a current through the duct assemblies so as to create a magnetic field. In particular, adjacent duct assemblies generate magnetic fields with opposite magnetic polarities. Arrows 520, 522, 524, 526 indicate an example of the directions that current may flow to create such magnetic fields. The arrows show that the directions of the currents in the neighboring duct assemblies are opposite to each another. The magnetic field generated in this manner has an orientation normal to an elongated cathode surface and strength conductive to plasma guidance produced by passing current through the duct assemblies. In this filtered arc deposition mode, the metal vapor plasma emitted from the cathode 486 passes through the ducts between the duct assemblies thereby allowing undesirable macroparticles and neutral metal vapor constituencies to be eliminated and to deliver 100% ionized metal vapor plasma to the substrates.

In the remote anode arc plasma discharge (RAAD) mode, the current does not conduct through the duct assemblies 488, 490, 492, 494 and the metal vapor plasma extracting magnetic field is not generating. In this duct-passive mode, the electrons emitted from the surface of the cathode 486 can pass freely through the ducts 500, 502, 504, 506 which conduct the RAAD current between the cathode 486 in the cathode chamber 484 and the remote anodes 530, 532 and 534 which surround the magnetron sources 536, 538 and 540 which are positioned along the chamber wall 506 of the coating system 380. At the same time, the duct assemblies 488, 490, 492, 494 serve as a barrier which stops the heavy particles such as metal vapor atoms, ions and macroparticles, emitted from the cathode 486 to reach substrates. The RAAD plasma ionizes and activates the plasma processing environment in a processing area of the system 380 where the substrates are positioned. This results in the ability to conduct ion plasma cleaning, ion implantation ionitriding and remote arc assisted magnetron sputtering (RAAMS) yielding advanced properties of plasma processing products.

Figure 15A:
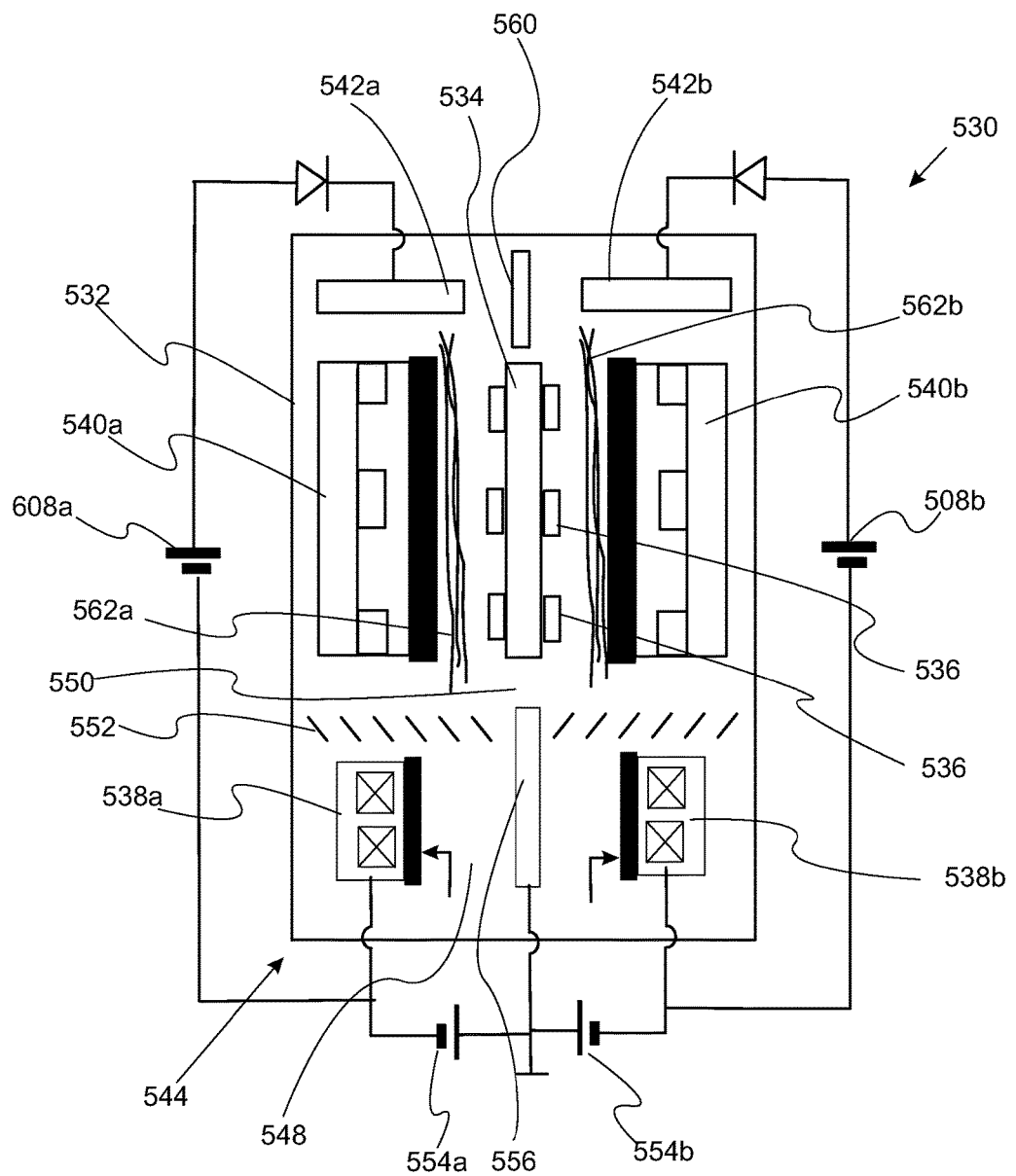
FIG. 15A is a schematic side view of the RAAMS system.
Figure 15B:
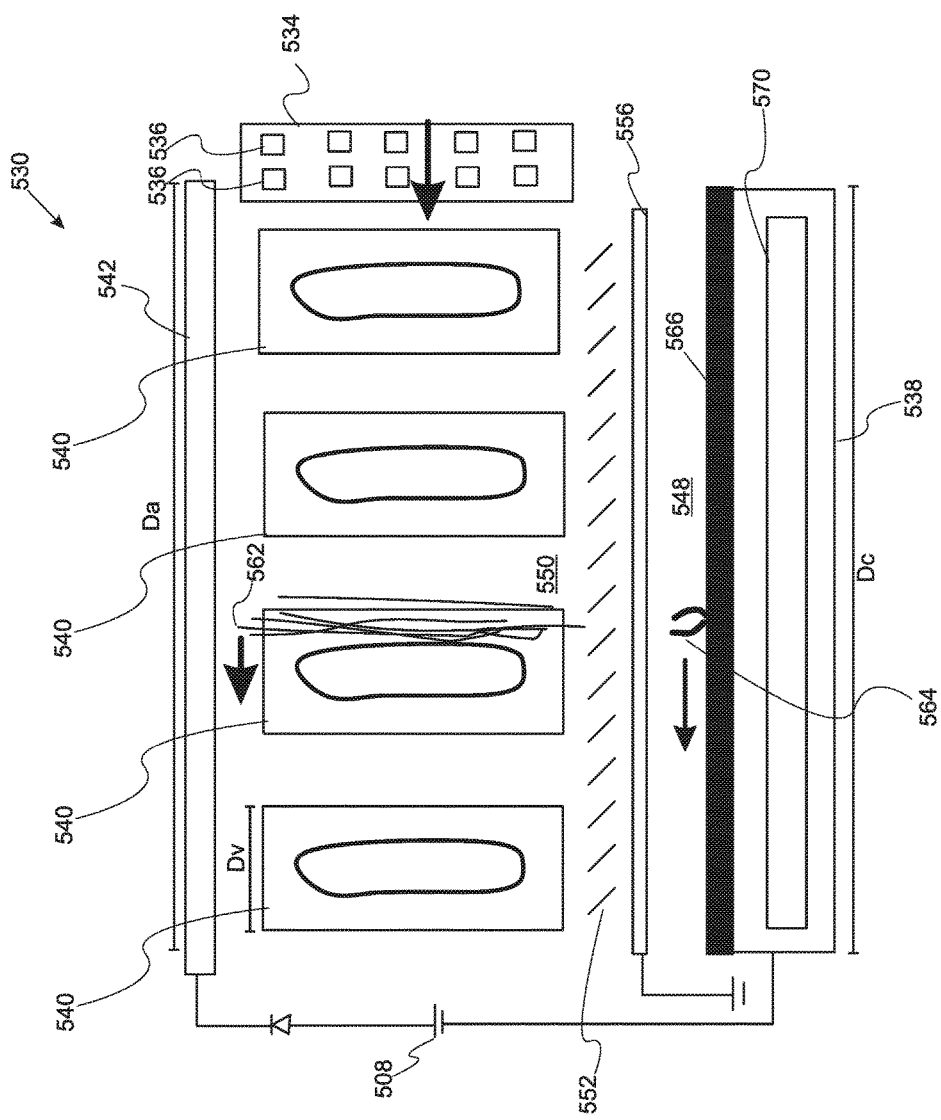
FIG. 15B is a schematic side view perpendicular to the view of FIG. 15A.

With reference to FIGS. 15A and 15B, a schematic illustration of a variation of the RAAMS system is provided. FIG. 15A is a schematic side view of the RAAMS system while FIG. 15B is a schematic side view perpendicular to the view of FIG. 15A. System 530 includes chamber 532, substrate holder 534 with substrates 536 to be coated, primary cathodes 538*a, b*, magnetrons 540*a, b* and remote anodes 542*a, b*. Cathodes 538*a, b* are located at side 544 (i.e., the bottom) of the chamber 532 in a cathode section 548 separated from the coating section 550 of the chamber 532 by chevron shield 552, which is impermeable for heavy particle but allows the electrons to go through toward the remote anodes 542*a, b* in coating section 550. Shield 552 can be electrically floating or it can be connected to the positive terminal of either primary arc power supply 554 or an additional power supply (not shown). The primary arc anode 556 is located at the middle of the cathode chamber 548 between two arc cathodes: the cathode 538*a* in a left compartment of the cathode chamber 548 and the cathode 538*b* in a right compartment of the cathode chamber 548. The substrate holder 534 with substrates 536 to be coated is located between magnetrons 540*a, b*. The substrates face magnetron 540*a* on left side and magnetron 540*b* on right side. The remote anodes 542*a, b* are located above magnetrons 540*a, b* and are separated from one another by an optional separation baffle 560. Separating anode 556, substrate holder 534 with substrates 536 to be coated and optional separation baffle 560 effectively divide chamber 532 into two sides (i.e., a left side and right side) thereby preventing hot jet 562*a* associated with cathode 538*a* located on left side of chamber 532 from flowing through the right side of chamber 532 toward remote anode 542*b* from flowing into the left side of the chamber 532 toward remote anode 542*a*. Remote anode 542*a* is coupled with arc cathode 538*a* on left side of substrate holder 534 and remote anode 542*b* is coupled with the cathode 538*b* on right side of the substrate holder 534. Anode 556, substrate holder 534 and optional separating baffle 560 effectively divide coating chamber 550 into two sections: a left section housing left cathode 538*a*, left magnetron 540*a* and left remote anode 542*a* and a right section housing the right cathode 538*b*, right magnetron 540*b* and right remote anode 542*b*. This division forms two narrow discharge gaps or discharge corridors: a left gap separating left magnetron 540*a* and substrate holder 534 on the left side of the coating section 550 and a right gap separating the right magnetron 540*b* and substrate holder 534 on right side of the coating section 550. The width of the separating discharge gaps ranges from 2 to 20 inches.

In a refinement, the cathode target can be made of a metal having a gettering capability such as titanium alloy or zirconium alloy. In this case the shielded cathode electron emitting source also serves as a vacuum gettering pump which improves pumping efficiency of coating system 530. To further improve the gettering pumping efficiency, shield 552 facing the evaporating surface of the cathode target 538*a* in the cathode chamber 550 can be water cooled and optionally connected to high voltage bias power supply. When water cooled shield 552 is biased to high negative potential ranging from −50V to −1000V relative to cathode targets 538*a* and 538*b*, shield 552 is subjected to intense ion bombardment by metal ions generating by the cathodic arc evaporating process. Condensation of metal vapor under conditions of intense ion bombardment is favorable for pumping noble gases such as He, Ar, Ne, Xe, Kr as well as hydrogen. Moreover, water cooled primary anode 556 facing cathode targets 538*a, b* also contributes to the pumping capacity by increasing the metal vapor condensation/gettering area.

Still referring to FIGS. 15A and 15B, it can be seen that several magnetron sources 540 are located above cathode chamber 548 in coating section 550. Substrate holder 534 with substrates 536 moves along chamber 532 passing magnetrons 562. Cathodic arc spot 564 moves along cathode target 566 of arc cathode 538 while being steered by magnetic steering coil 570 or other steering means. Experimental investigation of this system revealed that narrow plasma jet 562 has a high plasma density ranging from $10^{11}$ to $10^{13}$ cm$^{-3}$ and an electron temperature exceeding 2 eV (typically ranging from 3 to 20 eV). The majority of the remote anode arc discharge current flows along the narrow hot plasma jet 562 and has an arc current density ranging from 0.1 mA/cm$^2$ to 100 A/cm$^2$. The rest of the coating section is filled by the cold and rare plasma with electron temperature typically below 3 eV and plasma density ranging from $10^8$ to $10^{11}$ cm$^{-3}$. The width of hot plasma jet 562 is typically from 1 to 5 cm while moving with the same speed as cathodic arc spot 564 which follows the steering movement of the cathodic arc spot 564 on cathode target 566. It is believed that the most of the remote arc current conducts between cathode 538 in cathode chamber 548 and remote anode 542 throughout hot plasma jet 562. It can be also seen from FIG. 15A that two hot plasma jets 562*a* and 562*b* form within the narrow discharge gaps between left magnetron 540*a* and substrate holder 534 on left side of the coating section 550 and between right magnetron 540*b* and substrate holder 534 on the right side of the coating section 550. Left jet 562*a* bridges left cathode 538*a* in a left compartment of the cathode chamber 548 and left remote anode 542*a* on the left side of the coating section 550. Right jet 562*b* bridges right cathode 538*b* in a right compartment of the cathode chamber 548 with right remote anode 542*b* on right side of the coating section 550.

Figure 16:
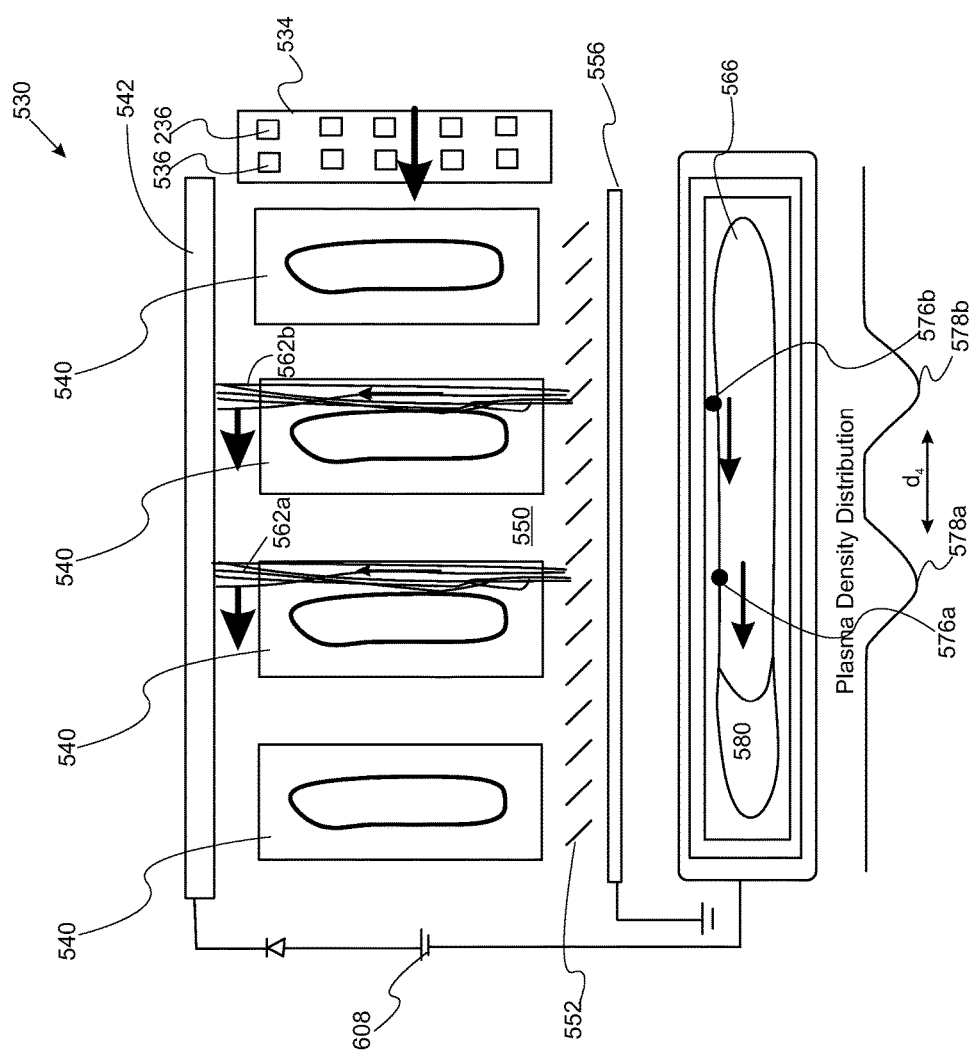
FIG. 16 is a schematic illustration of a variation of FIGS. 15A and 15B with a cathode in one of the compartments of the cathode chamber and with two cathodic arc spots.

With reference to FIG. 16, a schematic illustration of a variation of FIGS. 15A and 15B with a cathode in one of the compartments of the cathode chamber and with two cathodic arc spots is provided. In this variation, two plasma jets 562*a* and 562*b* formed between chevron baffle 552 and remote anode 542 above each of cathodic arc spots 576*a* and 576*b* bridge the current connections between cathode 538 and remote anode 542. The direction of the remote arc current along jets 562*a* and 562*b* associated with cathodic arc spots 576*a* and 576*b* are shown by the vertical arrows on these jets. The plasma distribution has maximums 578a and 578b near each of the cathodic arc spots 576a and 576b moving along the erosion corridor 580 on cathode target 566 either by a steering magnetic field created by a steering coil located beyond the target 582 (not shown) or by other means as described below. In this variation, the dimensions of the high ionization area is $A_i$~L(magnetron)×W(jet). In horizontally aligned systems set forth above, the ionization area is only $A_i$~W(magnetron)×W(jet). The increase of the magnetron sputtering flow ionization area by vertical alignment of arc jet 562 (parallel to the long side of the magnetron 540) vs. horizontal alignment of the arc jet 562 (parallel to the short side of the magnetron 540 as in the parent case) is approximately L(magnetron)/W(magnetron).

Still referring to FIG. 16, a confined plasma streams (i.e., a plasma jet) bridging the discharge gap between remote anode 542 and cathode target 566 through coating region 550, moves along direction $d_4$ while remaining parallel to the long side of the magnetrons 540. The ends of confined plasma jets 562 move along direction $d_4$ as set forth in FIG. 16. Arc spot 576 forms on cathode 580 along the erosion zone 578. The plasma field 584 at remote anode 542 and the plasma field 578 at cathode target 580 are confined dimensionally in a space from about 1 to 5 inches along direction $d_4$. In one refinement, magnetic steering fields are used to accomplish the rastering movement along $d_4$. In other refinements, this rastering movement is accomplished by mechanically moving cathode 580 along direction $d_4$. In still other refinements, a thermionic filament cathode with secondary emission electrons moves along $d_4$.

With reference to FIGS. 15A, 15B, and 16, an aspect of the relative sizing of various components of coating system 530 is provided. Remote anode 542 has a linear remote anode dimension Da parallel to the cathode target 538. The horizontal area of location of vapor sources 538 (i.e., the four magnetrons shown in FIG. 15B) is also relevant. The area along the direction parallel to the short side of the magnetrons 538 has a linear vapor source dimension Dv. Cathode target 566 has a linear cathode target dimension Dc parallel to the remote anode 542 and also parallel to the short side of the magnetrons 538. In a refinement, the linear remote anode dimension Da, the linear vapor source dimension Dv, and the linear cathode target dimension Dc are parallel to each other. In another refinement, the linear remote anode dimension Da is greater than or equal to the linear cathode target dimension Dc which is greater than or equal to the linear vapor source dimension Dv.

Figure 17:
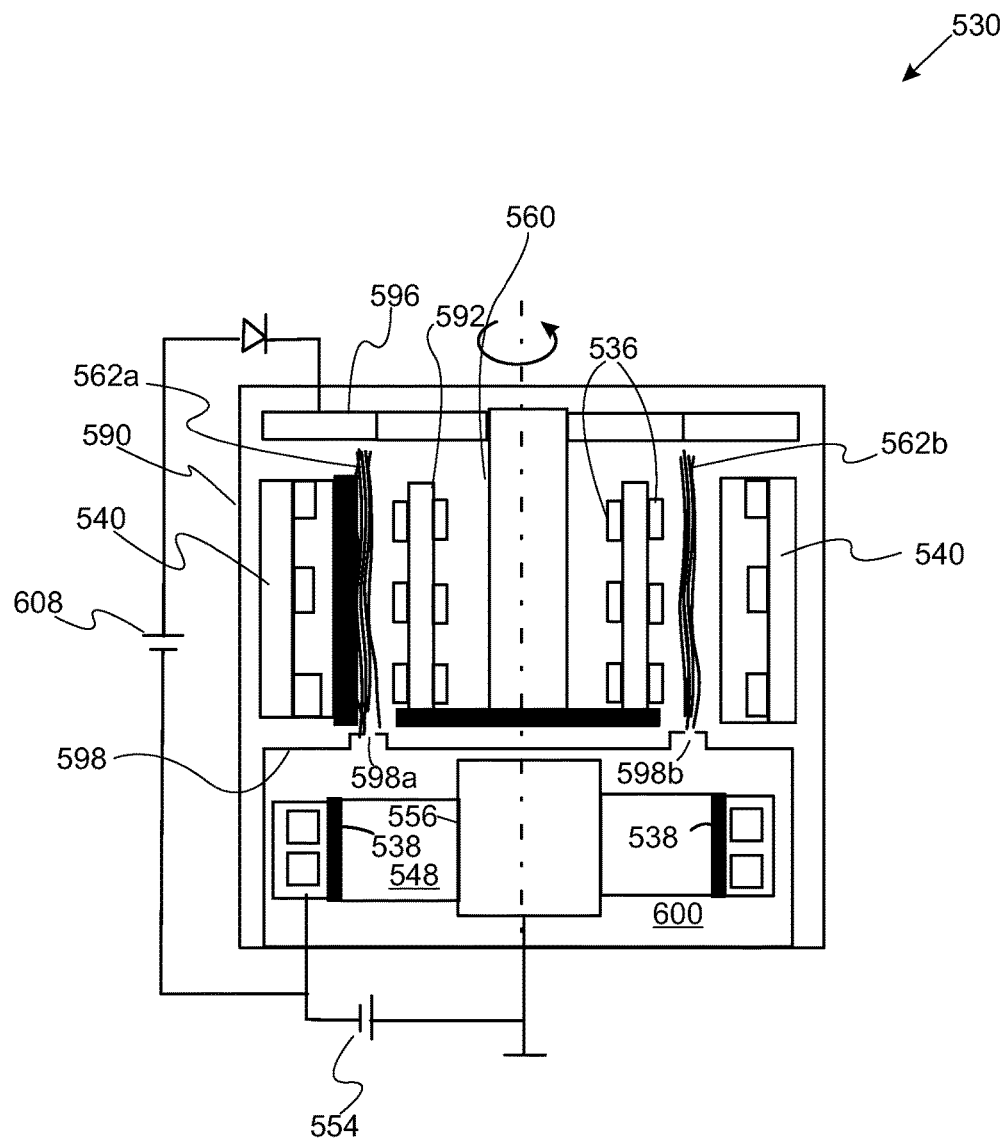
FIG. 17 is a schematic illustration of an alternative configuration of the remote plasma system utilizing a coaxial batch coating chamber layout with planar magnetron sources.

FIG. 17 provides an alternative configuration of the remote plasma system utilizing a coaxial batch coating chamber layout with planar magnetron sources 540a, b located at the chamber walls and substrates to be coated 536 attached to the rotating carousel substrate holder 592. Coating chamber 590 includes carousel substrate holder 592 with substrates 536 to be coated and a set of the planar magnetron sputtering sources 540a, b attached to the walls of the coating chamber 590 facing the substrates to be coated. Coating chamber 590 also includes cathode chamber 600 with primary cathode 538 and coaxial primary anode 556 located at the bottom of the chamber 590 and remote anode-ring 596 located at the top of the chamber 590.

Cathode chamber 600 includes shield-housing 598 with openings 598a, 598b facing toward the gap between the magnetrons 540 and the substrate holder 592. Optional separation baffle 560 in the form of a cylinder is also installed in the rotating substrate holder 592. Anode 556, substrate holder 592, and optional separation baffle 560 create a narrow coaxial gap within the chamber 590 between the magnetrons 540 and the substrate holder 592 to confine hot jets 562 and secure their position parallel to the axes of the chamber 590. Openings 598 may be located coaxial to the substrate holder 592. Cathode 540 has the shape of a ring coaxial with coating chamber 590 and with primary cylindrical anode 556. Alternatively, several primary cathodes 540 are installed coaxially to the primary anode 556 in a cathode chamber 548. The primary anode can also serve as a condensation surface to improve the pumping speed by gettering effect effectively absorbing the residual gases within a film forming on a surface of the anode 556 by condensation of the vapor plasma generated by the cathode 538. This configuration increases the remote arc plasma density thereby providing a more intense ion bombardment assistance rate during magnetron sputtering. In this configuration, a denser zone of the remote arc discharge plasma is created in the gap between the magnetron target and substrates to be coated.

Figure 18A:
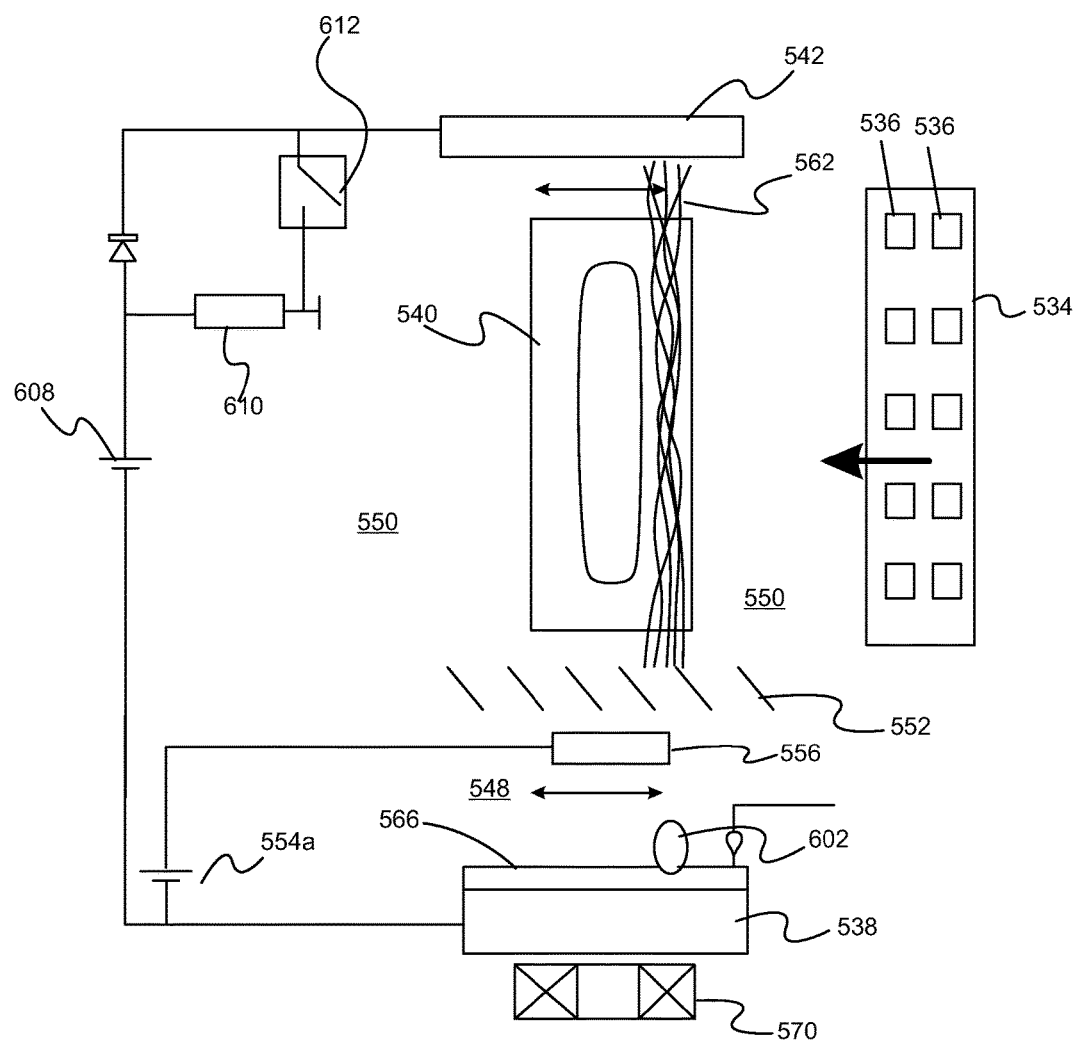
FIG. 18A provides a schematic illustration of a refinement with separate primary cathode chambers for each magnetron sputtering source.
Figure 18B:
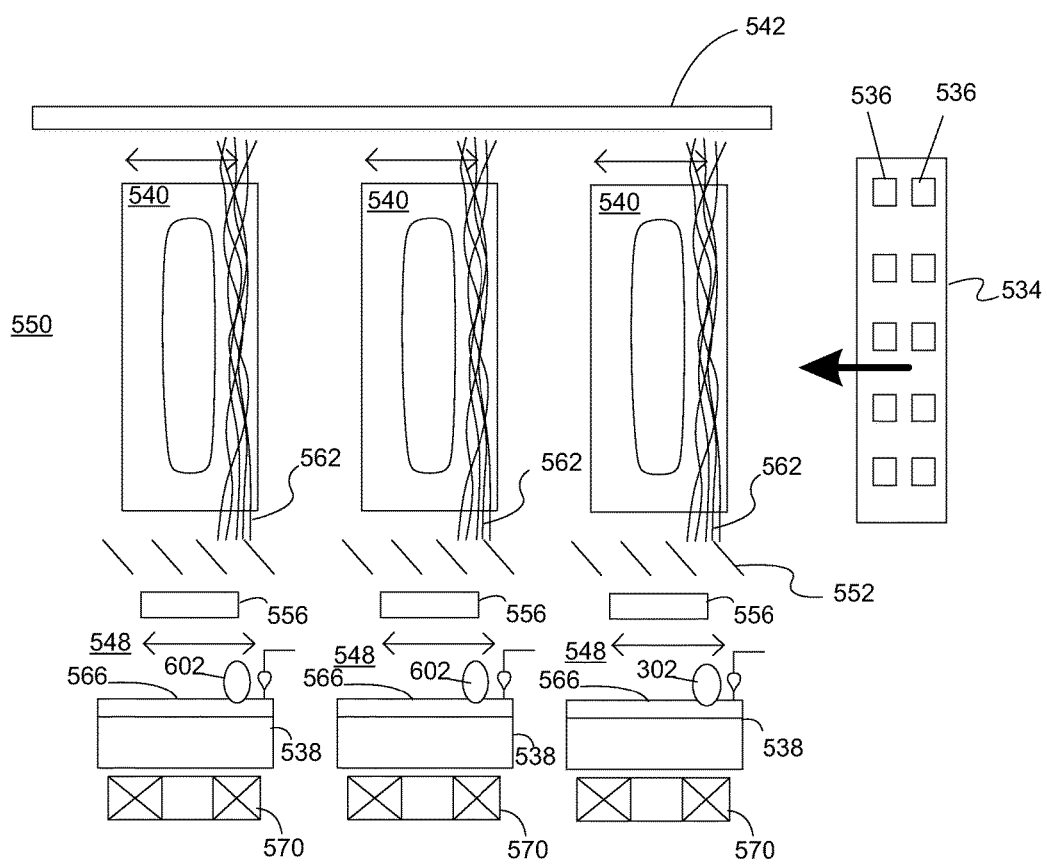
FIG. 18B provides a schematic illustration of a refinement with separate primary cathode chambers for each magnetron sputtering source.

With reference to FIGS. 18A and 18B, a refinement with separate primary cathode chambers 548 for each magnetron sputtering source 540 is provided. In the FIG. 18A, cathode chamber 548 is positioned under coating chamber 550. Magnetron 540 is positioned in coating chamber 550 immediately above the shield 552 separating cathode chamber 548 from the coating chamber 550. Cathodic arc source 538 as a powerful electron emitter is positioned below the magnetron 540. The size of the cathode target, which defines the dimension of arc spot steering zone, is ranging from ¼ to 2 times of the width of the magnetron target, but preferably within the range from 0.5 to 1.5 times the width of the magnetron target. Primary anode 556 is positioned above the cathode target 566 and has a dimension generally smaller or equal to cathodic arc target 566. Magnetic steering coil 570 is optionally positioned under the cathode 538 for steering arc spots at the surface of cathodic arc target 566. Remote anode 542 is positioned in a coating chamber 550 above the magnetron 540 providing that cathode 538, magnetron 540 and anode 542 are aligned generally along the same line. High density plasma jet 562 forms within coating chamber 550 between shield 552 and anode 542 along the surface of the magnetron 540 above the cathodic arc spot 602 which is moving over the surface of the cathode target 566 by the magnetic steering effect provided by the steering magnetic field of steering coil 570. Cathodic arc spots 602 and plasma jet 562 are aligned along a single vertical line parallel to the long side of the magnetron 540 bridging the discharge gap toward remote anode 542. In this arrangement, the steering of the cathodic arc spots 602 at the surface of the cathode target 566 provides a corresponding steering of the high density plasma jet 562 with remote anode arc current directed along the direction parallel to the long side of the magnetron 540, while the axes of the jet 562 is parallel to the long side of the magnetron 540. Plasma jet 562 crosses the magnetron discharge in front of the magnetron target bridging the distance between the shield and the remote anode 542 and ionizes the sputtering metal atoms flow and gaseous environment in front of the magnetron sputtering source 540 within the area where the plasma jet 562 crosses the magnetron discharge. The increase of ionization and activation of the metal sputtering atoms and gaseous species in front of magnetron 540 is distributed evenly both along the direction parallel to the long side of the magnetron 540 and along the direction parallel to the short side of the magnetron 540. The uniformity of the ionization ability of the plasma jet 562 along the direction parallel to the long side of the magnetron 540 is achieved by the uniform distribution of the plasma density and the electron temperature along the plasma jet 562. The uniformity of the ionization ability of plasma jet 562 along the direction parallel to the short side of the magnetron 540 is achieved by repeatedly moving the jet 562 back and forth across the magnetron discharge from one end of magnetron 540 to another by magnetically steering displacement of the cathodic arc spot 602 on cathodic arc target 566.

In a typical example, the primary arc discharge between the cathode 538 in the cathode chamber 548 and the primary anode 556 is powered by the power supply 554a. The remote anode arc discharge between cathode 538 and remote anode 542 is powered by power supply 608. Ballast resistor 610 is installed between remote anode 542 and grounded coating chamber 550, which allows control of the voltage drop between remote anode 542 and grounded chamber 550. When the micro-arcing occurs at the coating chamber 550 walls, electronic switch 612 will be closed thereby short circuiting remote anode 542 to the ground and effectively eliminating arcing, followed by re-ignition of the remote arc when the position of electronic switch 612 is open. Switch 612 may be also open during the time of igniting of the RAAD plasma. Ignition of the RAAD can be provided by applying high voltage negative potential either to magnetron 540 which starts the magnetron discharge or, alternatively, by applying high negative voltage to the substrate holder 534 establishing the glow discharge across the discharge gap between cathode chamber 548 and remote anode 542. The high voltage discharge as a means for ignition of the RAAD can be used in either DC or pulse discharge mode. The dimensions of the magnetron sputtering target of the magnetron 540 are typically 10 cm width×100 cm tall. The dimension of the cathodic arc target 566 is typically about 10 cm, nearly equal to the width of the magnetron 540 target. The width of the plasma jet 562 is about 3 cm. The magnetically steered moving velocity of the arc spot 602 over the surface of the cathode target 566 is approximately 1000 cm/s. In this case, the repetition frequency of the plasma jet steering across the magnetron discharge zone will be approximately 50 Hz. Assuming the improved ionization rate within the area of the magnetron discharge crossed by the plasma jet 56a is ~30% the average ionization rate of the magnetron discharge plasma by the plasma jet 562 will reach ~10%, which is at least an order of magnitude higher than that of the conventional magnetron sputtering flow. The improved ionization rate of the magnetron sputtering flow results in increased intensity of ion bombardment assistance during magnetron sputtering coating deposition process which yields coatings having nearly theoretical high density, low defects, high smoothness, and superior functional properties. The inline vacuum coating system utilizing a plurality of magnetron sources, each provided with a separate cathode chamber, is shown in FIG. 18B.

Figure 19A:
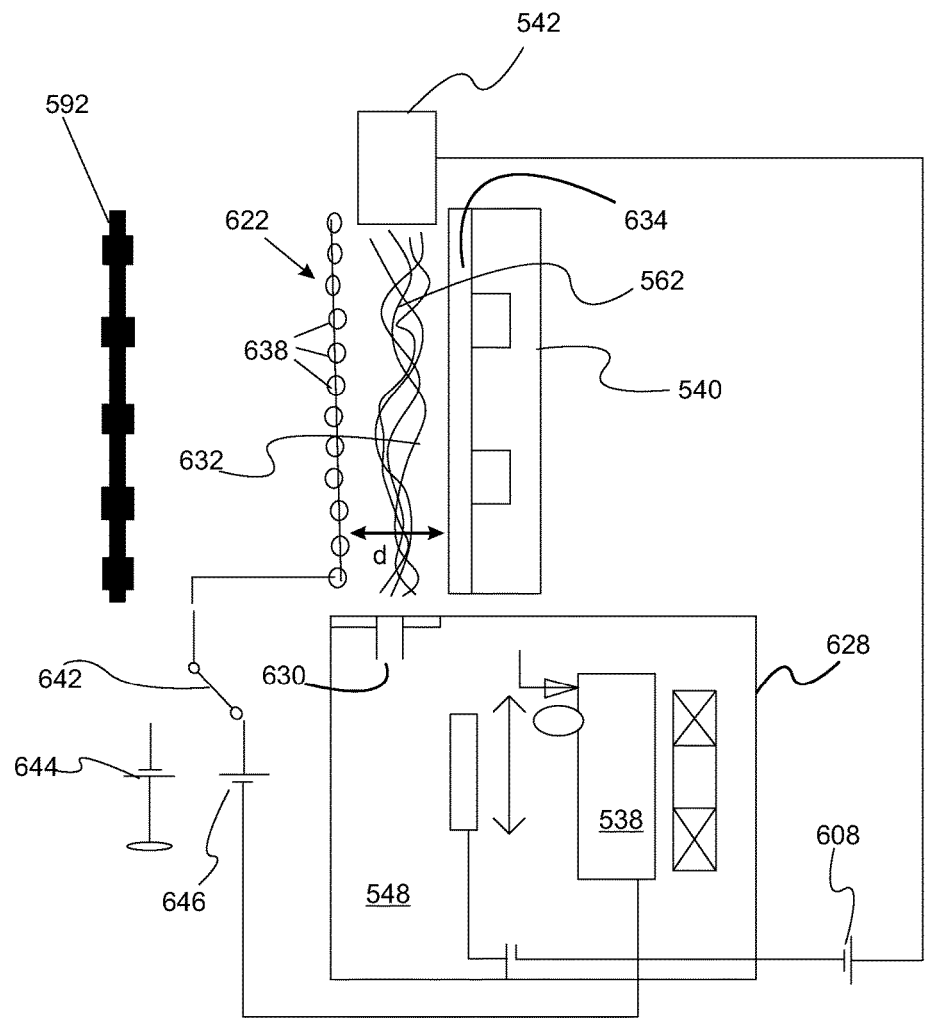
FIG. 19A provides a schematic illustration of an advanced variation of the systems of FIG. 14-18.

With reference to FIG. 19A, a further advanced variation of the systems of FIG. 14-18 is provided. Intermediate electrode-grid 622 is installed in front of the magnetron 540, which effectively limits the area of the confinement of the high density plasma jet 562 in front of the magnetron sputtering target 540. In this arrangement, cathode chamber 548 is enclosed within the enclosure 628. Although enclosure 628 can be electrically grounded, it is preferable that it is insulated from the grounded chamber providing that there is no direct electrical coupling between the primary and the remote arc discharges. Enclosure 628 has opening 630 facing the discharge gap or plasma corridor 632 between the magnetron target 634 and the electrode-grid 622. The length of opening 630 is generally equal to that of the width of the magnetron target 634 while the width of the opening 630 is less than the width d of the discharge gap 632. Electrode-grid 622 can be composed of thin wires 638 made of refractory metals chosen from the group of W, Ta, Nb, Hf, Ti, Mo, and stainless steel. The diameters of the wires are typically from 0.01 mm to 2 mm. A diameter less than 0.01 mm may result in melting of the wire in a contact with RAAD plasma. A diameter thicker than 2 mm will absorb too much coating material from the sputtering flow. Wires 638 can be arranged in a screen of different patterns or as an array of single wires parallel to each another. Grid electrode 622 must be transparent to the sputtering metal flow with transparency better than 50%. The distance between the neighboring wires 638 in a screen or grid electrode 622 is typically from 0.5 mm to 10 mm. Distances between neighboring wires in grid electrode 622 less than 0.5 mm are impractical and can affect the transparency of grid electrode 622. Distances between neighboring wires 638 in grid electrode 622 greater than 10 mm may not have enough plasma confining properties to confine plasma jet 562 within the discharge gap or the plasma corridor 632. The distance d between the magnetron target 634 and the grid electrode 622 is typically from 10 mm to 100 mm. Distances less than 10 mm are too small to confine the arc jet 562a, while distances greater than 10 cm are too large to provide a narrow corridor which can squeeze the plasma jet, effectively increasing its electron density, electron temperature, and the metal sputtering flow ionization rate.

Grid electrode 622 generally functions as an intermediate anode. However, it may also serve as a remote discharge plasma igniting electrode. In this latter case, switch 642 connects the negative pole of high voltage DC or pulse power supply 644 to grid-electrode 622. When a negative high voltage DC or pulse bias potential is applied to the grid electrode 622, it ignites the glow discharge providing the initial ionization within the remote anode arc plasma discharge gap 632 thereby initiating the RAAD plasma. After the RAAD plasma is ignited, switch 642 can connect the positive pole of the intermediate anode power supply 646 to the electrode-grid 622 transferring the electrode grid 622 in the intermediate anode mode when the electrode-grid 622 becomes an intermediate anode of the remote anode arc discharge. In this case, grid electrode 622 is connected to the positive pole of the power supply 646, while the negative pole is connected to the cathode 538. In a refinement, the electrode-grid can be connected to the negative pole of the power supply 644 during operation of the RAAD plasma, while the positive pole is connected to the cathode 538. In this case, the potential of the electrode grid 622 will be negative in relation to the cathode 538, but the potential of the electrode grid 622 cannot be lower than the cathode 538 more than two times of the voltage drop between the cathode 538 and the primary anode 556. Electrode grid 622 can be also isolated from the other components of the coating chamber setup. In such cases, the potential of the electrode-grid 622 will be set at floating potential value determined by the plasma density and electron temperature in the RAAD plasma. The plasma density within the discharge gap 632 can be increased to the extremely high level by reducing the width of the discharge gap and increasing the remote anode arc current. This allows using sputtering target 540a in the diode sputtering process without magnetic enhancement as required in the magnetron sputtering process.

The remote arc current density in jet 562 the remote arc discharge gap defined between the anode grid 622 and the magnetron 540 is ranges from 0.1 to 500 A/cm$^2$. A remote current density less than 0.1 A/cm2 is not enough to provide a desirable level of ionization of the magnetron sputtering flow. The remote arc current densities more than 500 A/cm2 requires too much power of the remote arc discharge power supply which is not practical for the applications. High current density of the remote arc discharge (i.e., jet (562) within the discharge gap defined between the anode grid 622 and magnetron 540 can be achieved by using a DC power supplies 646 and/or 608 which can provide a DC currents ranging from 10 to 2000 A to remote anode 542 and/or the grid anode 622 or, alternatively, by using a pulse power supplies which can apply a positive voltage pulses to the remote anode 542 and/or grid anode 622. The positive voltage pulses can range from 500 to 10,000 V and the associated current pulses can range from 1000 to 50,000 A.

Figure 19B:
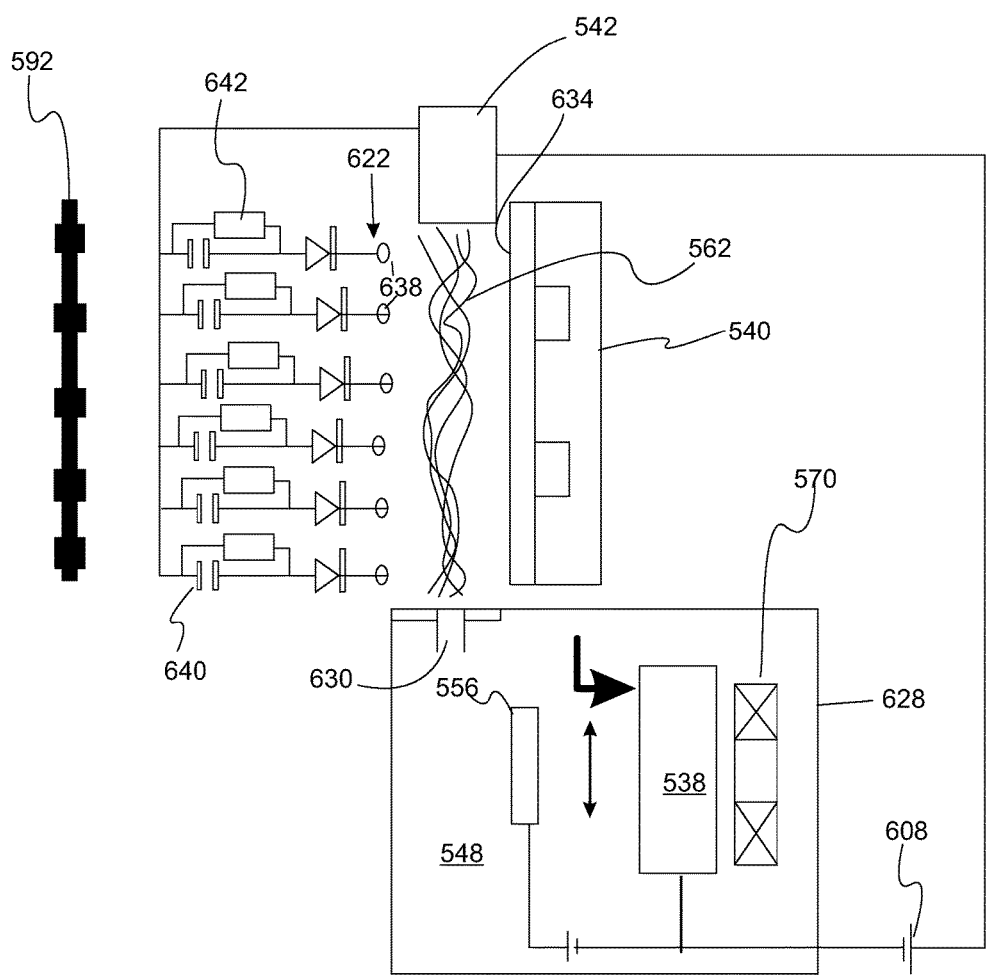
FIG. 19B provides a schematic illustration of a variation of the system of FIG. 19A.

With reference to FIG. 19B, a variation of the system of FIG. 19A is provided. Wires 638 in the grid-electrode array 622 are positioned parallel to each other and to the short side of the magnetron 540. Each wire 638 is connected to the remote anode 542 via capacitor 640 and shunt resistor 642 while the diodes secure the direction of the current toward wire element 638. During operation, before the remote discharge is ignited, capacitors 640 are charged to the maximum open circuit voltage of the remote anode arc power supply 608. This arrangement triggers the cascade ignition of the remote arc discharge by igniting the remote arc, first between the cathode 538 and first single wire 638 positioned closest to the cathode 538, followed by propagation of the remote arc discharge sequentially via all intermediate single wire electrodes 638 of the electrode grid array 622 toward remote anode 542. After the ignition phase, capacitors 640 will be discharged and the potential of each wire 638 and of the entire electrode grid array 622 will be determined by shunt resistors 642. If the remote anode arc discharge is extinguished, capacitors 640 will be charged again to the maximum open circuit voltage of the power supply 608 with the cascade ignition automatically repeated. Alternatively, the ignition is initiated by the control system. This approach can be also applied to the multi-magnetron system similar to that shown in FIGS. 16 and 18B. In this case the intermediate ignition electrodes of the cascade ignition arrangement can be positioned between within the gaps between the respective magnetron sputtering sources.

Figure 19C:
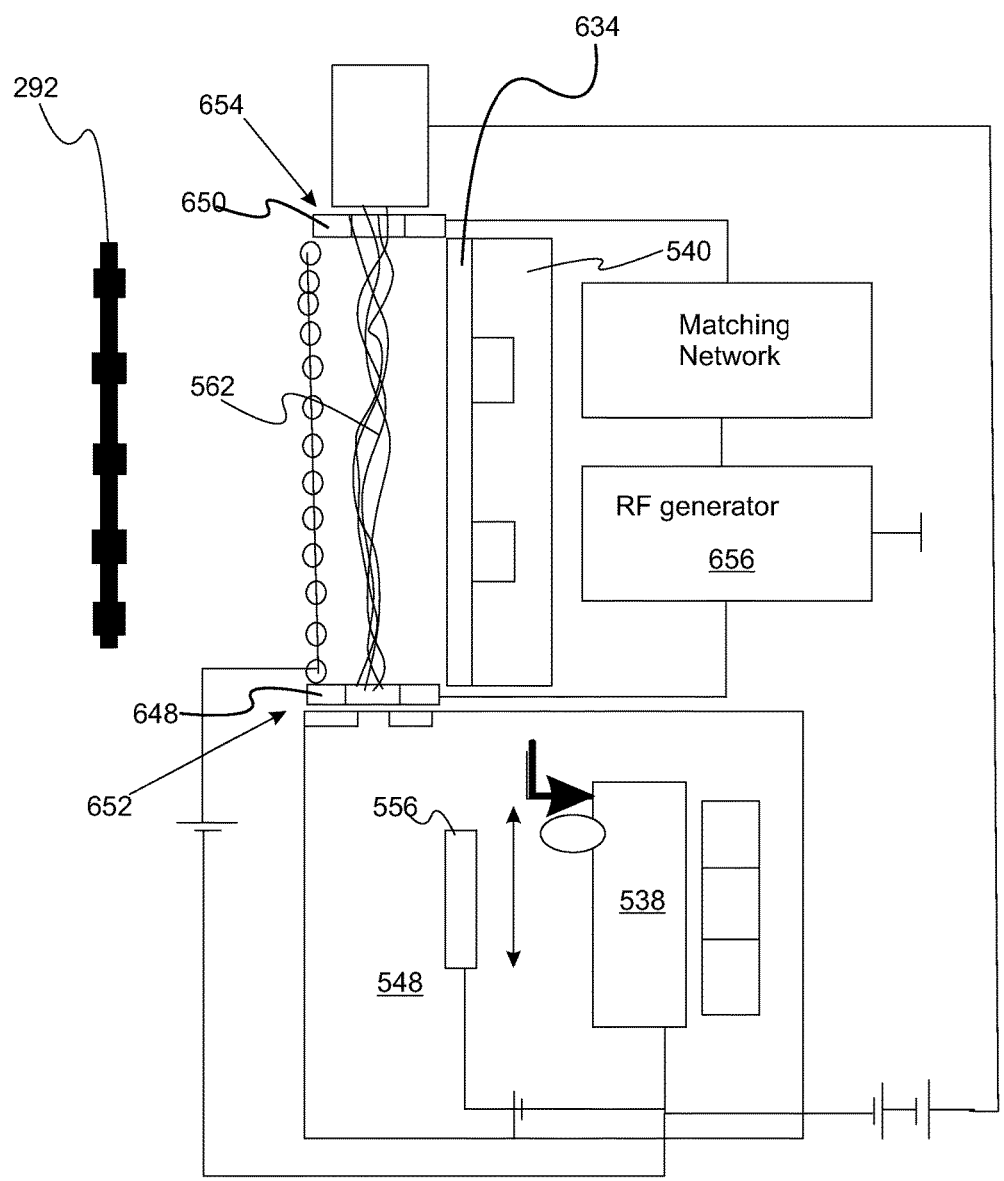
FIG. 19C provides a schematic illustration of a variation of the system of FIG. 19A.

With reference to FIG. 19C, an additional advanced of the coating system of FIG. 19A is provided. Capacitively coupled RF electrodes 648, 650 are positioned at both cathode end 652 and remote anode end 654 of the remote arc discharge column 562. The RF generator and the matching network are installed in series with RF electrodes 648 to activate the plasma jet 562 by superimposing the RF oscillations along plasma jet 562. The frequency of the oscillations can range from 10 kHz to 500 MHz. In a refinement, the frequency of the generator ranges between 500 kHz and 100 MHz. The commonly used 13.56 MHz RF generator is suitable for this purpose. When intense RF oscillations are created within the plasma jet 562 the plasma density, electron temperature and, subsequently, the ionization rate of the magnetron sputtering and gaseous plasma increase thereby resulting in an increase in the remote anode arc discharge ionization efficiency and activation capabilities. This further improves the properties and performance of the coatings and plasma treated surfaces by RAAMS discharge plasma. In another variation as illustrated in FIG. 19C, a pulsed high voltage generator or pulsed RF generator 656 is used instead of a continuous-wave RF generator thereby providing high voltage unipolar or RF pulses for ignition of RAAMS discharge as well as superimposed high voltage high current pulses during the coating deposition process. The repetition frequency of the high voltage high current or RF pulses range from 1 Hz to 100 kHz.

Figure 19D:
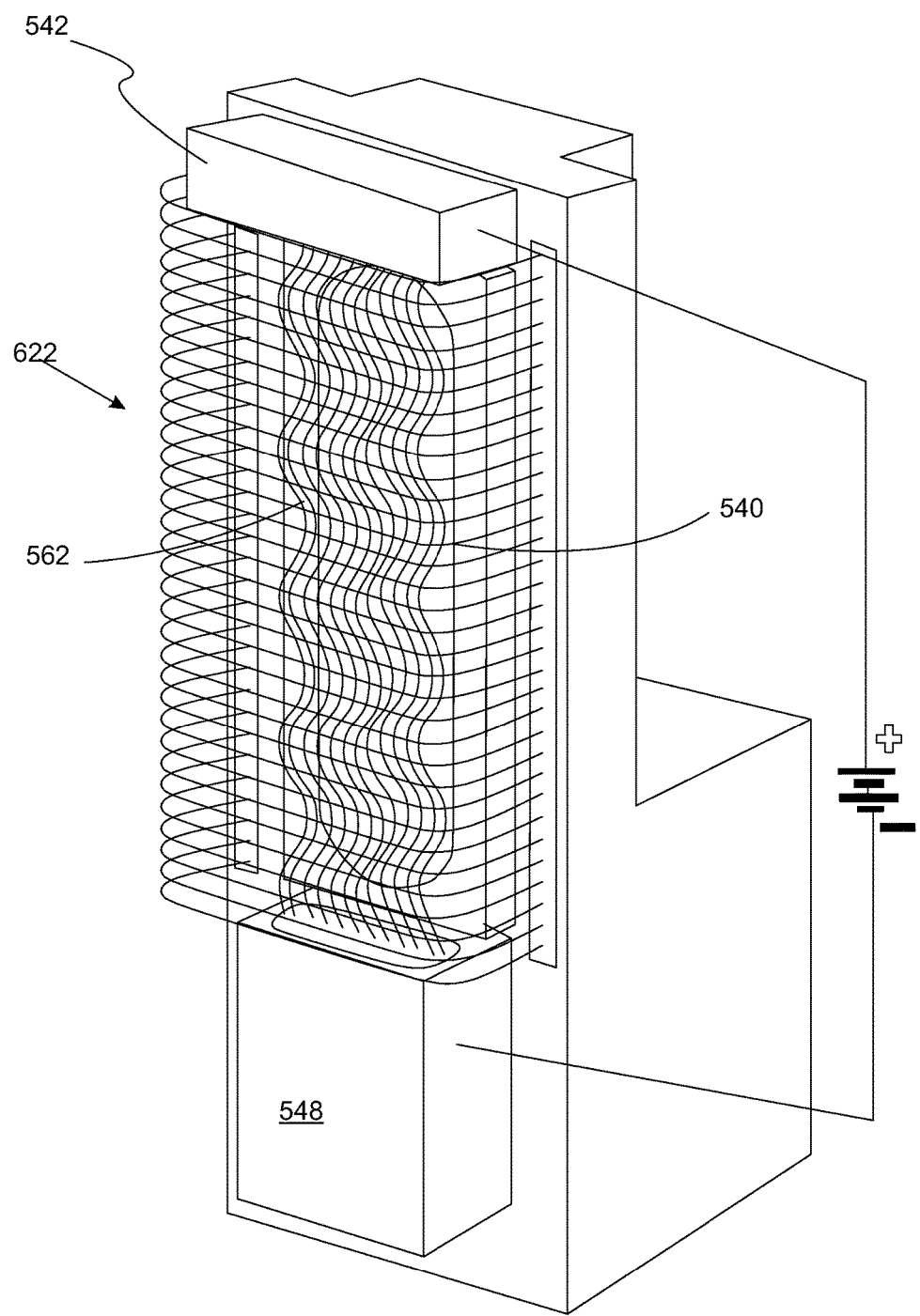
FIG. 19D provides a perspective view of the RAAMS module with an electrode grid.

FIG. 19D provides a perspective view of the RAAMS module with an electrode grid. Cathode chamber 548 with the primary cathode (not shown) and the primary anode (not shown) is positioned under the magnetron sputtering magnetrons 540. The electrode grid 622 is positioned in front of the magnetron 540. The remote arc discharge, i.e., jet 562, is ignited between the primary cathode (not shown) in a cathode chamber 548 and remote anode 542. The remote arc jet 562 enters from an opening in the cathode chamber 548 into the remote arc discharge gap created between the grid electrode 622 and the sputtering surface of magnetron 540.

Figure 19E:
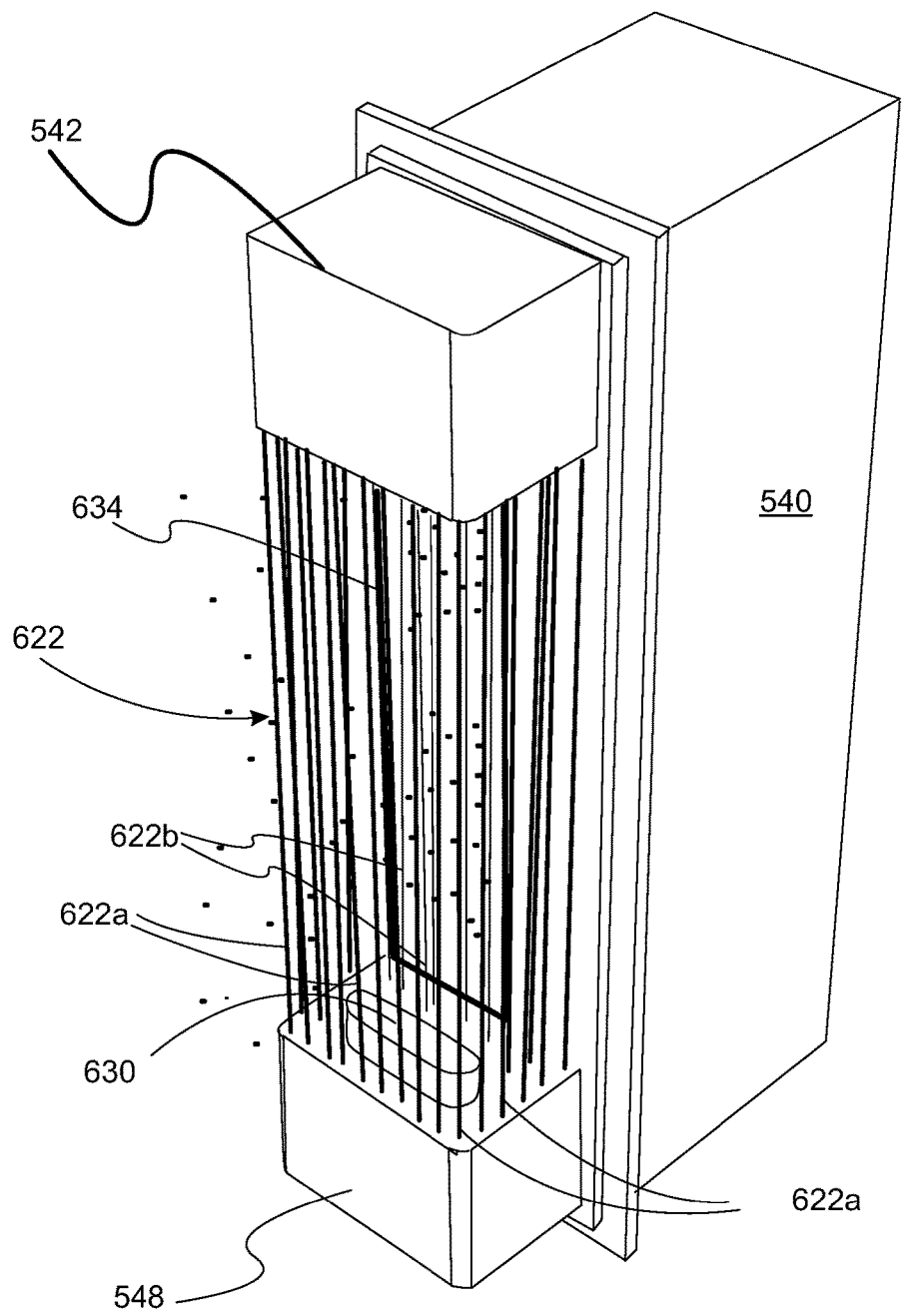
FIG. 19E provides a schematic of a system of another remote anode coating system.

With reference to FIG. 19E, a schematic of a system of another remote anode coating system is provided. Remote anode arc plasma cage 622 can be created in front of the magnetron target 634 of the magnetron vapor source 540 as shown illustratively in FIG. 19E. The remote arc discharge can be established between the primary arc cathode (not shown) in a cathode chamber 548 and the anode cage (i.e., grid 622) and/or the top remote anode 542. In this embodiment of the invention the remote anode arc plasma is streaming from the opening 630 in the cathode chamber 548 along the long side of the magnetron target 634 toward the grid anode 622 and/or the top remote anode 542. Although the cage-grid remote anode 622 can be made of wires aligned in many different patterns the embodiment of the invention shown in FIG. 19E utilizes the remote anode cage 622 composed of array of straight wires parallel to the long side of the magnetron target 634.

Figure 19F:
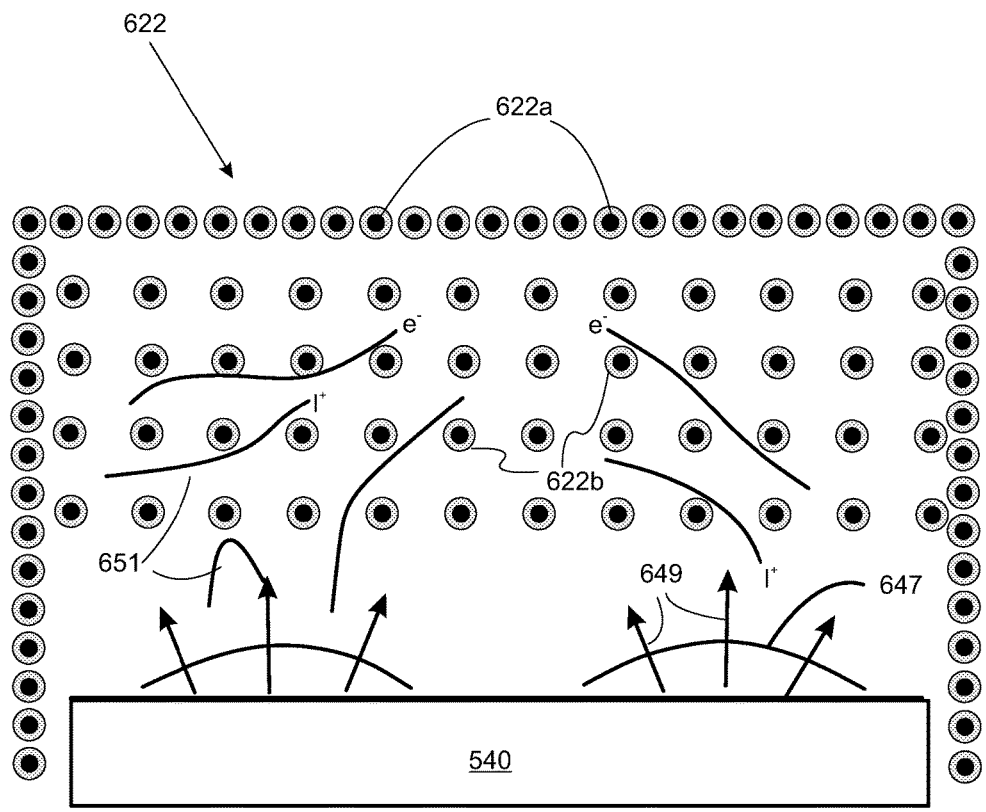
FIG. 19F is a transversal cross-section of the system shown in FIG. 19E.
Figure 20:
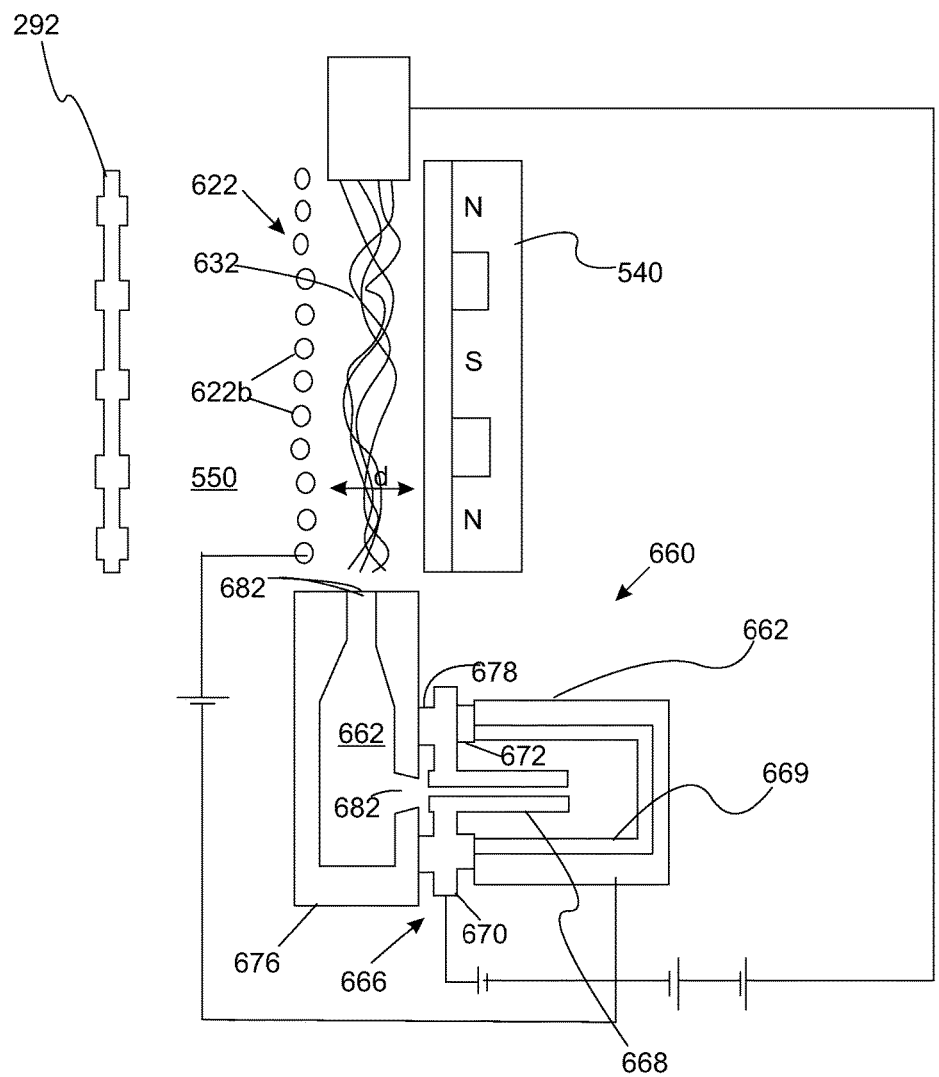
FIG. 20 provides a schematic illustration of a variation in which the electron emission cathodic arc source with a non-consumable cathode FIG. 21A provides a schematic in which a substrate holder is positioned between an anode and a magnetron sputtering source.

With reference to FIG. 19F, which is a transversal cross-section of the system shown in FIG. 19E, a schematic of a system using an array of wires is provided. This array of the parallel wires consists of the outer array of wires 622a forming an outer boundary of the remote anode grid-cage 622. The remote anode arc plasma jet is confined within the anode cage formed by this outer array of anode cage wire 622a. It can also optionally consist of the array of the inner wires 622b which are positioned within the anode grid-cage 622. When the positive DC or pulse potential is applied to the anode grid-cage in reference to the cathode in the cathode chamber 548, the anodic plasma sheath is forming around each of the wire of the array of outer wires 622a and the inner wires 622b. The ionization efficiency within the anodic plasma sheath is greater than that of the background plasma which results in the improvement of the ionization rate of the magnetron sputtering flow hence contributing to further improvement of the coating properties. The role of the inner wires 622b is also to divert the charged particles such as electrons and positive ions curling their trajectories, creating a pendulum effect, increasing the length of the trajectories of charged particles, and effectively trapping the charged particles within the anode grid-cage 622 hence increasing the ionization probabilities of the magnetron sputtering flow. This approach to plasma confinement can be also used along without a need of magnetic confinement. This allows using the sputtering target in a diode sputtering mode without magnets while the high density remote anode arc plasma is confined electrostatically within the anode grid-cage 622. The characteristic distance between the neighboring wires in the anode grid-cage 622 shown in FIG. 19E ranges from 0.5 mm to 30 mm. The thickness of each wire is typically ranges from 50 micrometers to 3000 micrometers. The remote anode arc current density streaming along the target 634 parallel to its long side from the cathode chamber opening 634 ranges from 0.1 to 500 A/cm$^2$. The remote anode arc current can be provided either by DC power supplies or pulse power supplies. The cross-section of the magnetron sputtering source 540 surrounding by the anode grid cage 622 is shown illustratively in FIG. 19F. The magnetron discharge 647 is established above the magnetron target 7a inflicting a magnetron sputtering metal atomic flow 649. The anode cage consists of the outer array 622a and the inner anodic wire array 622b. When wire is energized by applying the positive potential vs. the cathode in a cathode chamber (not shown), the anodic plasma sheath with enhanced ionization rate is established around each of the wires of the anode grid-cage 622. The trajectories of charged particles (electrons and positive ions) 651 are diverting when the particle is approaching the anodic plasma sheath surrounding the array of the wires 622a,b. In a refinement the wires of the anode grid-cage 622 is made of refractory metals such as W or Ta and their temperature is maintained in a range of 500-2500° C., which allows effectively re-evaporate the metal atoms of the magnetron sputtering flow which can stick to the surface of the wire. It is believed that high ionization rate within the anode grid-cage will make it possible to operate the sputtering vapor source in a pressure range below 0.5 mtorr and even without noble gas such as argon or krypton which thereby eliminating detrimental inclusions of the noble gas atoms in a coating lattice With reference to FIG. 20, a variation in which the electron emission cathodic arc source with a non-consumable cathode is provided. Cathode assembly 660 includes a water-cooled cathode with a cylindrical shape or rectangular cavity. Rectangular cavity 662 includes an internal evaporating and electron emission surface 664 and the primary anode 666 generally consisting of a cylindrical or a rectangular insert 668 attached to the anode plate 670. Anode insert 668 is extended within the cathode cavity 662. Anode 666 is made of refractory metals chosen from the group of W, Ta, Nb, Hf, Ti, Cr, Mo and stainless steel. Anode plate 670 is isolated from the cathode by ceramic spacers 672. Primary anode 666 is attached to the water-cooled plasma transfer vessel 676 via the spacers 678, having small cross section providing high thermal resistance between the plasma vessel 676 and the primary anode 666. The plasma vessel 676 includes opening 680 with facing the cathode 538 throughout the tubular anode insert 668 on side of the cathode 538 and the opening 682 facing the discharge gap between the electrode—grid 622 and the magnetron source 540 on the side of the coating chamber 550. The length of the opening 682 is generally equal to that of the width of the magnetron target 634 while the width of the opening 682 is less than the width d of the discharge gap 632. The spacers 678 can be made of refractory metal. In this case the plasma vessel 676 is electrically connected to the primary anode 666. Alternatively, the spacers 678 can be made of non-conductive ceramic, making the plasma vessel 676 electrically isolated from the primary anode 666. In any case the spacers 678 must have a small cross section providing a high thermal resistivity between the water-cooled plasma vessel 662 and the primary anode 668. In operation the primary anode is heated by the arc current reaching the temperature when the re-evaporation of the metal transferred from the cathode occurs effectively recycling the cathode metal evaporating from the internal cathode surface 669 in the cathodic arc discharge.

Cathode vessel 662 is typically formed from a metal with a relatively low melting temperature and high saturating vapor pressure. Examples of such metals include, but are not limited to, Cu, Al, bronze and other low temperature alloys. Alternatively, cathode vessel 662 can be made of copper, but its internal evaporating and electron emission surface 669 should be covered by a thin layer of a metal with low boiling temperature (e.g., Zn, Cd, Bi, Na, Mg, Rb). Low temperature evaporating metals are easily re-evaporated by the hot primary anode when its temperature is from 600 to 1100 deg. C. The water-cooled internal surface of the plasma vessel 676 may also function as a condensation surface effectively preventing the flux of cathode atoms to flow into the coating chamber section 550. It is should be appreciated that the variations of FIGS. 18-20 can be also used without electrode-grid 622. In this case the opening in the cathode chamber 548 facing the coating chamber 550 should be positioned close to the surface of the magnetron target 634, facing the area of the magnetron discharge where the density of the sputtering atoms is higher.

Figure 21A:
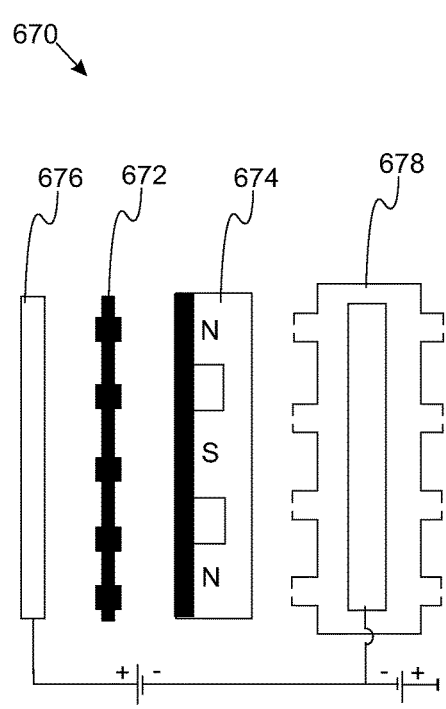
FIG. 21B provides a schematic in which a wire anode is positioned between a substrate holder and a magnetron sputtering source.
Figure 21B:
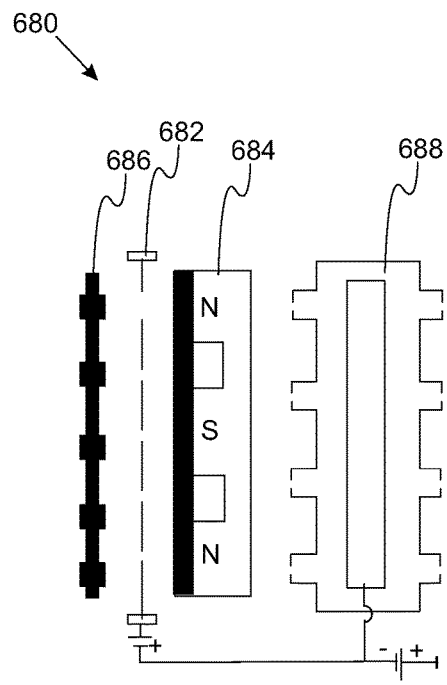

FIGS. 21A and 21B provide alternative configurations of remote plasma systems. With reference to FIG. 21A, coating system 670 includes substrate holder 672 positioned between magnetron sputtering source 674 and anode 676. Coating system 670 also includes cathode chamber 678 which is of the design set forth above. This configuration increases remote arc plasma density thereby providing a higher ion bombardment assistance rate during magnetron sputtering. With reference to FIG. 21B, coating system 680 includes anode 682 which is composed of thin wires. Anode 682 is installed between magnetron target 684 and substrate holder 686. Coating system 680 also includes cathode chamber 688 as set forth above. In this latter configuration, a denser zone of the remote arc discharge plasma is created in the gap between the magnetron target and substrates to be coated.

Figure 22A:
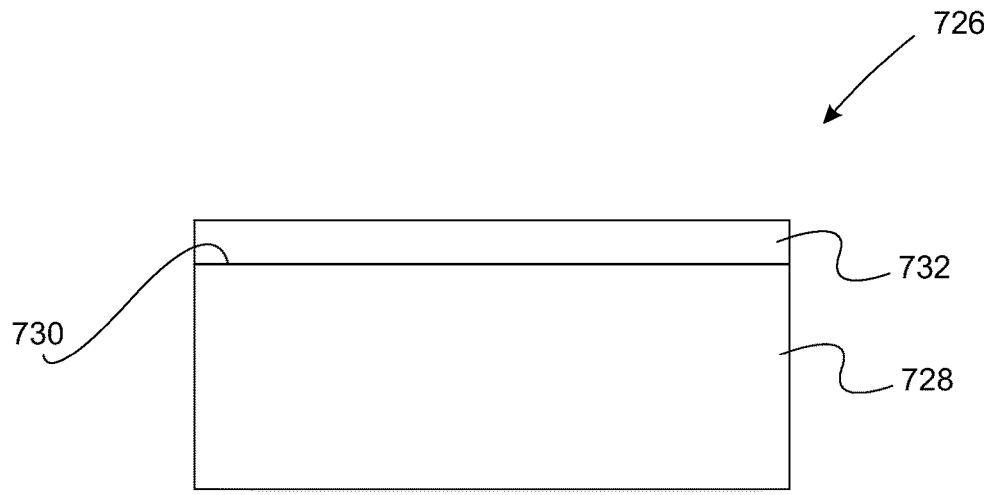
FIG. 22A is a schematic of a substrate with a coating made by a remote arc discharge plasma assisted process.
Figure 22B:
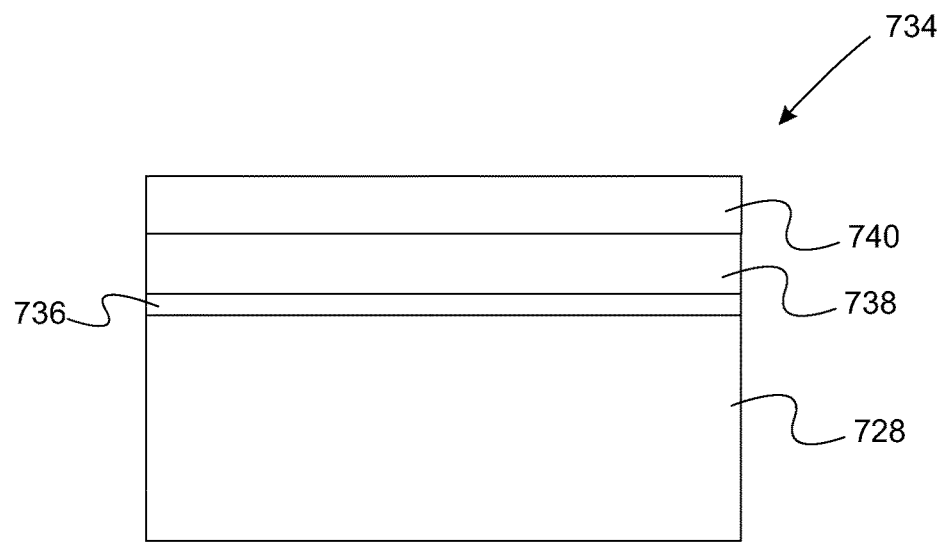
FIG. 22B is a schematic of a substrate with a multilayer coating made by a remote arc discharge plasma assisted process.

In another embodiment, a coated article formed by the methods and systems set forth above is provided. With reference to FIG. 22A, coated article 726 comprises substrate 728 having surface 730 and coating 732 disposed over surface 730. In a refinement, the coating is a protective coating. Typically, the coating has a dense microstructure and a characteristic color. In a refinement, the coating includes a refractory metal reacted with nitrogen, oxygen and/or carbon to form a refractory metal nitride, oxide, or carbide. Examples of suitable refractory metals include, but are not limited to, chromium, hafnium, tantalum, zirconium, titanium and zirconium-titanium alloy. Chromium nitride is an example of a particularly useful coating made by the methods set forth above. In a refinement, the coating has a thickness from about 1 to about 6 microns. With reference to FIG. 22B, a variation of a chromium nitride coating, which is a multilayer structure formed by the methods set forth above, is provided. Coated article 834 includes thin layer 836 of an unreacted chromium layer disposed over substrate 728 and a thick stoichiometric chromium nitride layer 838 disposed over unreacted chromium layer 736. In a further refinement, the multilayer structure further includes layer 740 of intermediate stoichiometric chromium nitride layer disposed over the stoichiometric chromium nitride layer 738. Intermediate stoichiometric chromium nitride 240 has a stoichiometry given by $CrN_{(1-x)}$ where x is a number between 0.3 and 1.0. In a refinement, the thickness of the unreacted chromium layer 736 is between 0.05 and 0.5 microns, the thickness of the thick chromium nitride layer 738 is from 1 to 3 microns, and the intermediate stoichiometric chromium nitride 740 is from 0.5 to 1 micron.

While embodiments of the invention have been illustrated and described, it is not intended that these embodiments illustrate and describe all possible forms of the invention. Rather, the words used in the specification are words of description rather than limitation, and it is understood that

What is claimed is:

1. A coating system comprising:
   a vacuum chamber; and
   a coating assembly including:
      a vapor source comprising a magnetron target, the magnetron target having a target face and a linear vapor source dimension, the vapor source configured for magnetron sputtering;
      a substrate holder to hold substrates to be coated, the substrate holder configured to move the substrates such that the substrates pass through a position in front of the vapor source, the substrate holder having a linear holder dimension;
      a remote anode having a linear remote anode dimension;
      a cathode chamber assembly including a cathode target, a primary anode and a shield, the cathode target having a linear cathode target long dimension and a linear cathode target short dimension, the shield defining at least one opening for transmitting an electron emission current of a remote arc discharge from the linear cathode target long dimension to the linear remote anode dimension that streams along the linear vapor source dimension, the remote anode being electrically coupled to the cathode target, the vapor source being positioned between the cathode chamber assembly and the remote anode, wherein the linear vapor source dimension, the linear cathode target long dimension, and the linear remote anode dimension are all parallel;
      a primary power supply connected between the cathode target and the primary anode; and
      a secondary power supply connected between the cathode target and the remote anode, wherein an arc spot is steered along the cathode target such that a confined plasma streams from the cathode target through a coating region to the remote anode when substrates are positioned in front of the vapor source during coating, the confined plasma includes a hot plasma jet connecting cathodic arc spots at the cathode target with an associated area at the remote anode while running through a corridor created between chamber walls and the substrate holder.

2. The system of claim 1 wherein the shield defines a single opening.

3. The system of claim 1 wherein the shield defines a plurality of openings.

4. The system of claim 1 wherein further comprising an additional vapor source positioned between the cathode chamber assembly and the remote anode, wherein the linear remote anode dimension and a dimension in which an arc spot is steered along the cathode target are both parallel to vapor source short dimensions of the additional vapor source.

5. The system of claim 1 wherein further comprising a second cathode chamber assembly including a second cathode target having a second linear cathode target dimension, an optional second primary anode and a second shield, the second shield defining at least one opening for transmitting a second electron emission current from the second cathode target to the remote anode that streams along the second linear cathode target dimension.

6. The system of claim 1 wherein a remote anode arc plasma is confined between the vapor source and substrate holder.

7. The system of claim 1 further comprising a grid-cage anode having an anode cage installed between the magnetron target and substrate holder, the cathode chamber assembly being positioned at a first end of the grid-cage anode, the cathode chamber assembly having a cathode chamber opening for releasing the electron emission current within the grid-cage anode.

8. The system of claim 7 wherein the remote anode is installed at a second end of the grid-cage anode.

9. The system of claim 7 wherein the remote anode is connected to a positive pole of a first remote arc power supply and the grid-cage anode is connected to a positive pole of a second remote arc power supply.

10. The system of claim 7 wherein the grid-cage anode is electrically floating or wherein a remote anode arc is confined within the anode cage.

11. The system of claim 7 wherein a distance between an outer boundary of the grid-cage anode is from 10 mm to 100 mm from the magnetron target, a density of a remote arc current within the grid-cage anode being from 0.1 to 500 A/cm$^2$.

12. The system of claim 7 wherein the grid-cage anode includes wires having a thickness from 0.05 to 3 mm and a distance between neighboring wires from 0.5 to 30 mm.

13. The system of claim 7 further comprising inner anode wires distributed within the grid-cage anode that diverts charged particles to be trapped within the anode cage.

14. The system of claim 7 further comprising RF antennas having RF antennas support positioned at both ends of the grid-cage anode, the RF antennas support inducing an RF discharge that heats electrons emitted by the cathode target.

15. The system of claim 1 wherein the cathode target of the cathode chamber assembly includes a cathode cavity covered by metal with a saturating vapor pressure, the cathode cavity being separated from a remote arc discharge area by a separator.

16. The system of claim 1 wherein the primary power supply is a DC power supply or a pulse DC power supply, a negative pole of the primary power supply being connected to the cathode target and a positive pole of the primary power supply being connected to at least one remote anode.

17. The system of claim 1 wherein the primary power supply is a DC power supply or a pulse DC power supply, a negative pole of the primary power supply being connected to the cathode target and a positive pole of the primary power supply is connected to a grid-cage anode.

18. The system of claim 1 wherein the substrate holder moves in a circular direction.

19. The system of claim 1 wherein the substrate holder moves in a linear direction past the vapor source, the remote anode, and the cathode chamber assembly.

20. The system of claim 1 wherein the linear remote anode dimension is greater than or equal to the linear cathode target long dimension which is greater than or equal to the linear vapor source dimension.

* * * * *